US009461181B2

(12) United States Patent
Hosoba et al.

(10) Patent No.: US 9,461,181 B2
(45) Date of Patent: *Oct. 4, 2016

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Miyuki Hosoba, Isehara (JP); Junichiro Sakata, Atsugi (JP); Hiroki Ohara, Sagamihara (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/805,599

(22) Filed: Jul. 22, 2015

(65) Prior Publication Data

US 2016/0020330 A1    Jan. 21, 2016

Related U.S. Application Data

(63) Continuation of application No. 14/083,485, filed on Nov. 19, 2013, now Pat. No. 9,093,262, which is a continuation of application No. 13/467,408, filed on May 9, 2012, now Pat. No. 8,592,251, which is a continuation of application No. 12/948,222, filed on Nov. 17, 2010, now Pat. No. 8,193,031.

(30) Foreign Application Priority Data

Nov. 20, 2009 (JP) ................................ 2009-264768

(51) Int. Cl.
*H01L 21/00* (2006.01)
*H01L 29/786* (2006.01)
(Continued)

(52) U.S. Cl.
CPC ..... *H01L 29/7869* (2013.01); *H01L 21/02107* (2013.01); *H01L 21/02554* (2013.01);
(Continued)

(58) Field of Classification Search
CPC .................... H01L 29/7869; H01L 21/02565; H01L 21/02631; H01L 21/02672; H01L 21/324
See application file for complete search history.

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

CN   001543276 A   11/2004
CN   001656618 A   8/2005
(Continued)

OTHER PUBLICATIONS

International Search Report (Application No. PCT/JP2010/069244) Dated Dec. 7, 2010.
(Continued)

*Primary Examiner* — Shaun Campbell
(74) *Attorney, Agent, or Firm* — Robinson Intellectual Property Law Office; Eric J. Robinson

(57) ABSTRACT

An object is to provide a semiconductor device having stable electric characteristics in which an oxide semiconductor is used. An oxide semiconductor layer is subjected to heat treatment for dehydration or dehydrogenation treatment in a nitrogen gas or an inert gas atmosphere such as a rare gas (e.g., argon or helium) or under reduced pressure and to a cooling step for treatment for supplying oxygen in an atmosphere of oxygen, an atmosphere of oxygen and nitrogen, or the air (having a dew point of preferably lower than or equal to −40° C., still preferably lower than or equal to −50° C.) atmosphere. The oxide semiconductor layer is thus highly purified, whereby an i-type oxide semiconductor layer is formed. A semiconductor device including a thin film transistor having the oxide semiconductor layer is manufactured.

20 Claims, 44 Drawing Sheets

(51) Int. Cl.
  *H01L 21/02* (2006.01)
  *H01L 27/12* (2006.01)
  *H01L 29/66* (2006.01)
  *H01L 21/324* (2006.01)

(52) U.S. Cl.
  CPC ... *H01L21/02565* (2013.01); *H01L 21/02631* (2013.01); *H01L 21/02672* (2013.01); *H01L 21/324* (2013.01); *H01L 27/1225* (2013.01); *H01L 29/66969* (2013.01)

(56) References Cited

U.S. PATENT DOCUMENTS

| | | |
|---|---|---|
| 6,294,274 B1 | 9/2001 | Kawazoe et al. |
| 6,297,122 B1 | 10/2001 | Eguchi et al. |
| 6,563,174 B2 | 5/2003 | Kawasaki et al. |
| 6,649,434 B2 | 11/2003 | Iwata et al. |
| 6,680,242 B2 | 1/2004 | Ohtsu et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,148,502 B2 | 12/2006 | Yamazaki et al. |
| 7,189,992 B2 | 3/2007 | Wager, III et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,382,421 B2 | 6/2008 | Hoffman et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,579,224 B2 | 8/2009 | Kuwabara et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 7,791,072 B2 | 9/2010 | Kumomi et al. |
| 7,791,074 B2 | 9/2010 | Iwasaki |
| 7,825,476 B2 | 11/2010 | Yang et al. |
| 7,829,444 B2 | 11/2010 | Yabuta et al. |
| 7,834,538 B2 | 11/2010 | Yamazaki et al. |
| 7,855,379 B2 | 12/2010 | Hayashi et al. |
| 7,884,360 B2 | 2/2011 | Takechi et al. |
| 7,888,207 B2 | 2/2011 | Wager, III et al. |
| 7,893,431 B2 | 2/2011 | Kim et al. |
| 7,935,582 B2 | 5/2011 | Iwasaki |
| 7,956,361 B2 | 6/2011 | Iwasaki |
| 8,088,652 B2 | 1/2012 | Hayashi et al. |
| 8,098,361 B2 | 1/2012 | Takahashi et al. |
| 8,143,678 B2 | 3/2012 | Kim et al. |
| 8,148,245 B2 | 4/2012 | Ikisawa et al. |
| 8,154,024 B2 | 4/2012 | Iwasaki |
| 8,193,031 B2 | 6/2012 | Hosoba et al. |
| 8,193,045 B2 | 6/2012 | Omura et al. |
| 8,207,014 B2 | 6/2012 | Sasaki et al. |
| 8,216,878 B2 | 7/2012 | Sasaki et al. |
| 8,258,023 B2 | 9/2012 | Lee |
| 8,304,298 B2 | 11/2012 | Ofuji et al. |
| 8,333,913 B2 | 12/2012 | Inoue et al. |
| 8,384,077 B2 | 2/2013 | Yano et al. |
| 8,389,326 B2 | 3/2013 | Sasaki et al. |
| 8,394,671 B2 | 3/2013 | Sasaki et al. |
| 8,415,198 B2 | 4/2013 | Itagaki et al. |
| 8,420,442 B2 | 4/2013 | Takechi et al. |
| 8,421,070 B2 | 4/2013 | Kim et al. |
| 8,436,349 B2 | 5/2013 | Sano et al. |
| 8,445,336 B2 | 5/2013 | Yang et al. |
| 8,461,583 B2 | 6/2013 | Yano et al. |
| 8,502,217 B2 | 8/2013 | Sato et al. |
| 8,513,054 B2 | 8/2013 | Sasaki et al. |
| 8,592,251 B2 | 11/2013 | Hosoba et al. |
| 8,623,698 B2 | 1/2014 | Sasaki et al. |
| 8,642,402 B2 | 2/2014 | Yano et al. |
| 8,668,849 B2 | 3/2014 | Inoue et al. |
| 8,697,488 B2 | 4/2014 | Sasaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0085075 A1 | 4/2007 | Yamazaki et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |

(56) References Cited

U.S. PATENT DOCUMENTS

| | | |
|---|---|---|
| 2009/0001881 A1 | 1/2009 | Nakayama |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0153762 A1 | 6/2009 | Kuwabara et al. |
| 2009/0194769 A1 | 8/2009 | Hiramatsu et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2009/0325341 A1 | 12/2009 | Itagaki et al. |
| 2010/0012932 A1 | 1/2010 | Shieh et al. |
| 2010/0025678 A1 | 2/2010 | Yamazaki et al. |
| 2010/0032665 A1 | 2/2010 | Yamazaki et al. |
| 2010/0044701 A1 | 2/2010 | Sano et al. |
| 2010/0051937 A1 | 3/2010 | Kaji et al. |
| 2010/0051938 A1 | 3/2010 | Hayashi et al. |
| 2010/0051949 A1 | 3/2010 | Yamazaki et al. |
| 2010/0065844 A1 | 3/2010 | Tokunaga |
| 2010/0078633 A1 | 4/2010 | Watanabe |
| 2010/0084648 A1 | 4/2010 | Watanabe |
| 2010/0085081 A1 | 4/2010 | Ofuji et al. |
| 2010/0090215 A1* | 4/2010 | Lee .................. H01L 29/7869 257/43 |
| 2010/0092800 A1 | 4/2010 | Itagaki et al. |
| 2010/0109002 A1 | 5/2010 | Itagaki et al. |
| 2010/0117073 A1 | 5/2010 | Yamazaki et al. |
| 2010/0148169 A1 | 6/2010 | Kim et al. |
| 2010/0155717 A1 | 6/2010 | Yano et al. |
| 2010/0171117 A1 | 7/2010 | Kuwabara et al. |
| 2010/0175755 A1 | 7/2010 | Singh et al. |
| 2010/0203673 A1 | 8/2010 | Hayashi et al. |
| 2010/0213459 A1 | 8/2010 | Shimada et al. |
| 2010/0252832 A1 | 10/2010 | Asano et al. |
| 2010/0267198 A1 | 10/2010 | Yabuta et al. |
| 2011/0003418 A1 | 1/2011 | Sakata et al. |
| 2011/0003427 A1 | 1/2011 | Sasaki et al. |
| 2011/0003428 A1 | 1/2011 | Sasaki et al. |
| 2011/0003429 A1 | 1/2011 | Oikawa et al. |
| 2011/0003430 A1 | 1/2011 | Yamazaki et al. |
| 2011/0006302 A1 | 1/2011 | Yamazaki et al. |
| 2011/0037061 A1 | 2/2011 | Yamazaki et al. |
| 2011/0053322 A1 | 3/2011 | Sasaki et al. |
| 2011/0097844 A1 | 4/2011 | Takechi et al. |
| 2011/0101342 A1 | 5/2011 | Kim et al. |
| 2012/0126226 A1 | 5/2012 | Kuwabara et al. |
| 2012/0132911 A1 | 5/2012 | Shimada et al. |
| 2012/0319103 A1 | 12/2012 | Lee |
| 2013/0140175 A1 | 6/2013 | Yano et al. |
| 2013/0146452 A1 | 6/2013 | Yano et al. |
| 2013/0157411 A1 | 6/2013 | Sasaki et al. |
| 2013/0237012 A1 | 9/2013 | Takechi et al. |
| 2013/0313548 A1 | 11/2013 | Yano et al. |
| 2014/0011327 A1 | 1/2014 | Sasaki et al. |
| 2014/0113406 A1 | 4/2014 | Sasaki et al. |
| 2014/0217402 A1 | 8/2014 | Sasaki et al. |
| 2015/0031169 A1 | 1/2015 | Sasaki et al. |

FOREIGN PATENT DOCUMENTS

| | | | |
|---|---|---|---|
| EP | 1737044 A | 12/2006 | |
| EP | 2006903 A | 12/2008 | |
| EP | 2184783 A | 5/2010 | |
| EP | 2226847 A | 9/2010 | |
| EP | 2339639 A | 6/2011 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 06-069919 B | 9/1994 | |
| JP | 08-264794 A | 10/1996 | |
| JP | 08-330647 A | 12/1996 | |
| JP | 11-505377 | 5/1999 | |
| JP | 2000-044236 A | 2/2000 | |
| JP | 2000-150900 A | 5/2000 | |
| JP | 2000-173945 A | 6/2000 | |
| JP | 2000-357586 A | 12/2000 | |
| JP | 2002-076356 A | 3/2002 | |
| JP | 2002-093822 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2006-165527 A | 6/2006 | |
| JP | 2006-165528 A | 6/2006 | |
| JP | 2006-165529 A | 6/2006 | |
| JP | 2006-165531 A | 6/2006 | |
| JP | 2006-229212 A | 8/2006 | |
| JP | 2007-041260 A | 2/2007 | |
| JP | 2007-073559 A | 3/2007 | |
| JP | 2007-096055 A | 4/2007 | |
| JP | 2007-103918 A | 4/2007 | |
| JP | 2007-115808 A | 5/2007 | |
| JP | 2007-123861 A | 5/2007 | |
| JP | 2007-150158 A | 6/2007 | |
| JP | 2007-311404 A | 11/2007 | |
| JP | 2008-042088 A | 2/2008 | |
| JP | 2008-053356 A | 3/2008 | |
| JP | 2008-060419 A | 3/2008 | |
| JP | 2008-199005 A | 8/2008 | |
| JP | 2008-235871 A | 10/2008 | |
| JP | 2008-243928 A | 10/2008 | |
| JP | 2008-281988 A | 11/2008 | |
| JP | 2008-311342 A | 12/2008 | |
| JP | 2009-004733 A | 1/2009 | |
| JP | 2009-010362 A | 1/2009 | |
| JP | 2009-031750 A | 2/2009 | |
| JP | 2009-099847 A | 5/2009 | |
| JP | 2009-099944 A | 5/2009 | |
| JP | 2009-128761 A | 6/2009 | |
| JP | 2009-141002 A | 6/2009 | |
| JP | 2010-135774 A | 6/2010 | |
| JP | 2010-525602 | 7/2010 | |
| KR | 2009-0057257 A | 6/2009 | |
| TW | 200845397 | 11/2008 | |
| TW | 200936792 | 9/2009 | |
| TW | 200937638 | 9/2009 | |
| WO | WO-2004/038757 | 5/2004 | |
| WO | WO-2004/114391 | 12/2004 | |
| WO | WO-2007/029844 | 3/2007 | |
| WO | WO-2007/120010 | 10/2007 | |
| WO | WO-2008/023553 | 2/2008 | |
| WO | WO-2008/096768 | 8/2008 | |
| WO | WO-2008/105250 | 9/2008 | |
| WO | WO-2008/105347 | 9/2008 | |
| WO | WO-2008/114588 | 9/2008 | |
| WO | WO-2008/117810 | 10/2008 | |
| WO | WO-2008/126879 | 10/2008 | |
| WO | WO-2008/133456 | 11/2008 | |
| WO | WO-2008/143304 | 11/2008 | |
| WO | WO-2008/149873 | 12/2008 | |
| WO | WO-2009/034953 | 3/2009 | |
| WO | WO-2009/041544 | 4/2009 | |
| WO | WO-2009/041713 | 4/2009 | |
| WO | WO-2009/072532 | 6/2009 | |
| WO | WO-2009/075281 | 6/2009 | |
| WO | WO-2009/081885 | 7/2009 | |
| WO | WO-2009/084537 | 7/2009 | |

OTHER PUBLICATIONS

Written Opinion (Application No. PCT/JP2010/069244) Dated Dec. 7, 2010.

(56) References Cited

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O Tfts" , SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp", Journla of Sol-Gel Science and Technology, 2003, vol. 26, pp. 181-184.
Osada.T et al., "15.2; Development of Driver-Integrated Panel using Amorphous In—Ga—Zn—Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTS", IDW '09 : Proceedings of the 16th International Display Workshops 2009, pp. 689-692.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT",

(56) References Cited

OTHER PUBLICATIONS

SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures of 1000° C.", Journal of Solid State Chemsitry, 1985, vol. 60, pp. 382-384.
Kitzerow.H et al., "Observation of Blue Phases in Chiral Networks", Liquid Crystals, 1993, vo. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 16522-1-165202-22.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Park.J et al., "High-performance amorphous gallium indium zinc oxide thin-film transistors through N2O plasma passivation", Appl. Phys. Lett. (Applied Physics Letters) , Aug. 7, 2008, vol. 93, pp. 053505-1-053505-3.
Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.
Chinese Office Action (Application No. 201080052375.2) Dated Jul. 3, 2014.
Taiwanese Office Action (Application No. 101126953) Dated Nov. 10, 2014.
Taiwanese Office Action (Application No. 99139774) Dated Nov. 11, 2014.
Chinese Office Action (Application No. 201080052375.2) Dated Mar. 12, 2015.
Shin.J et al., "Effect of Oxygen on the Optical and the Electrical Properties of Amorphous InGaZnO Thin Films Prepared by RF Magnetron Sputtering", J. Korean Phys. Soc.(Journal of the Korean Physical Society), Oct. 1, 2008, vol. 53, No. 4, pp. 2019-2023.

* cited by examiner

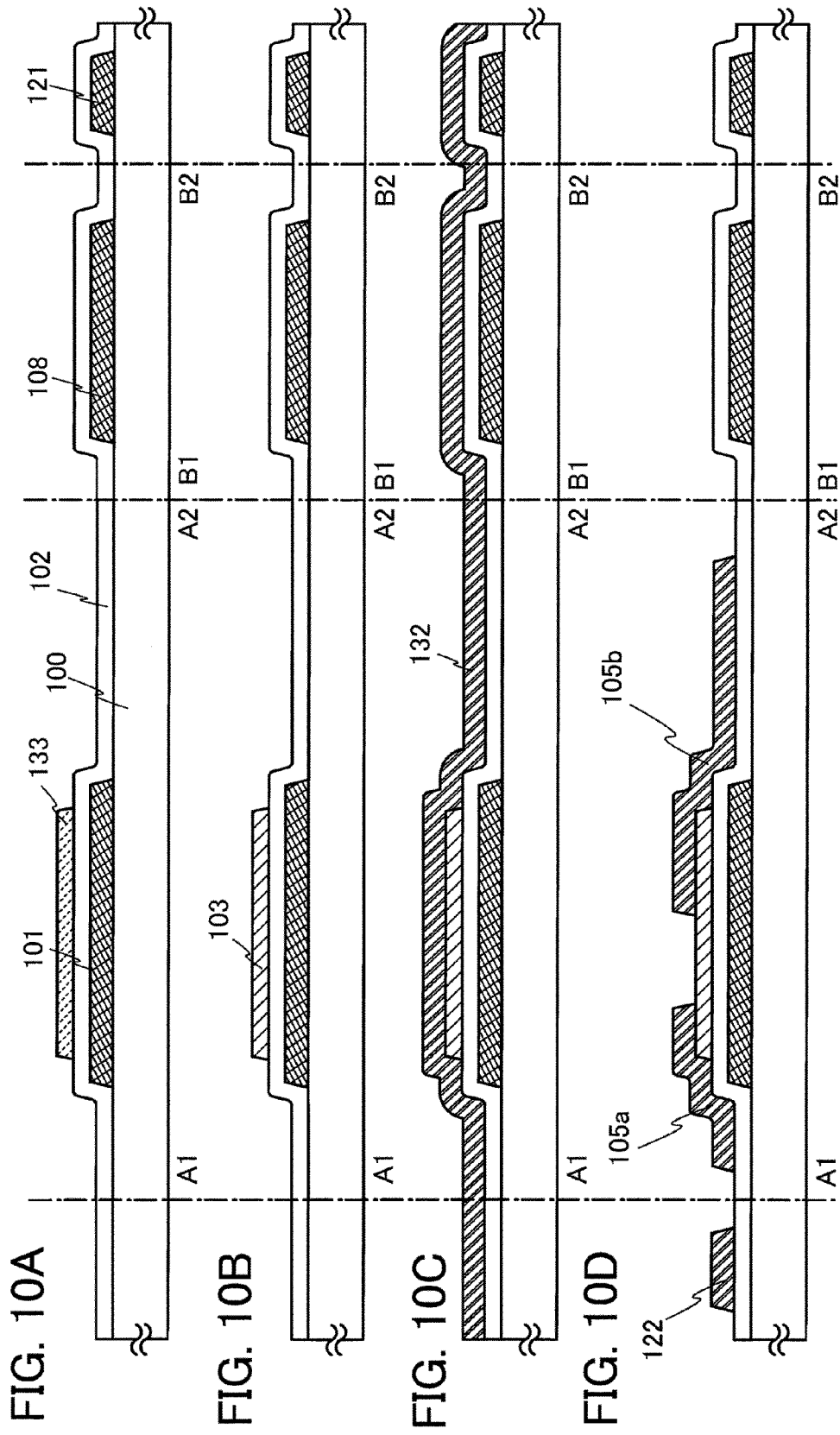

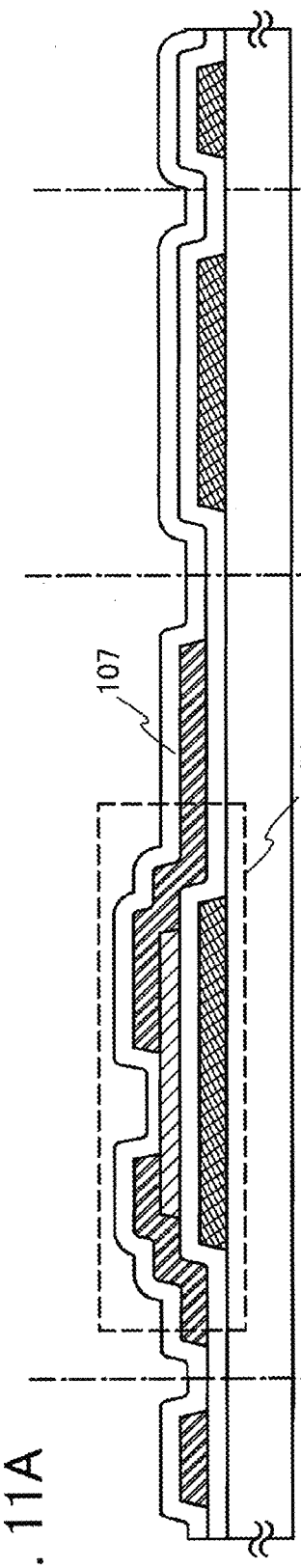
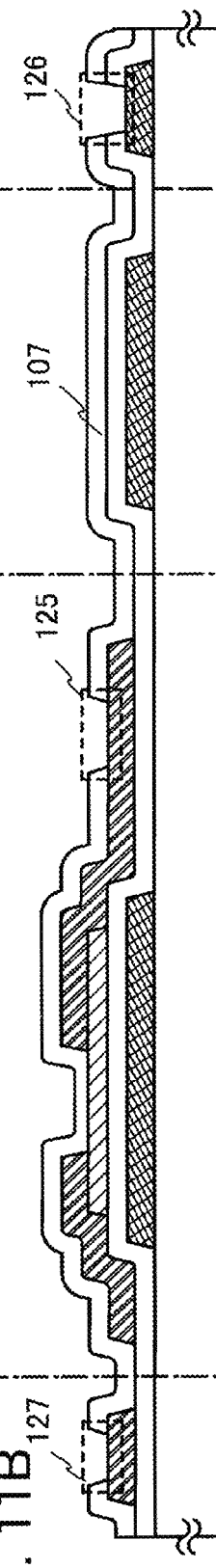
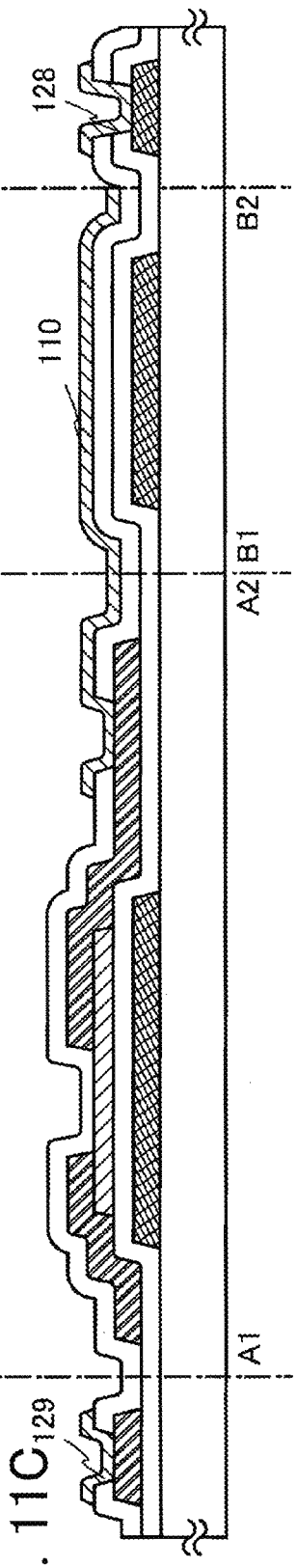
FIG. 11A
FIG. 11B
FIG. 11C

FIG. 13A1
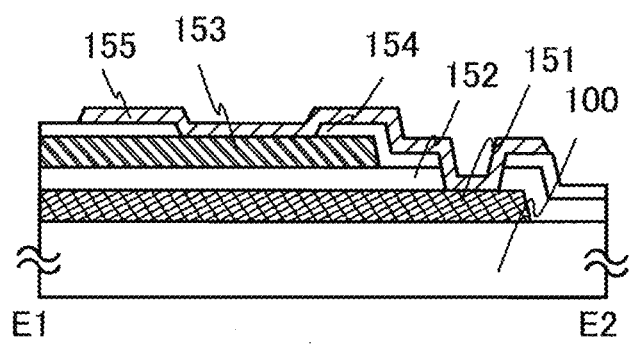
FIG. 13A2
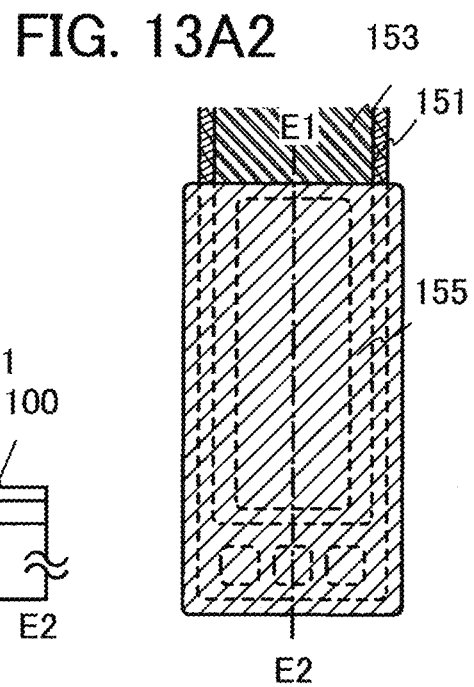
FIG. 13B1
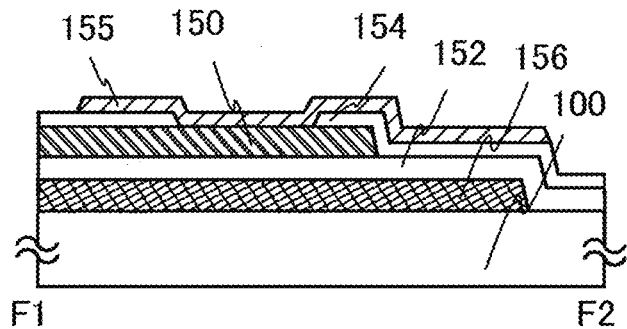
FIG. 13B2
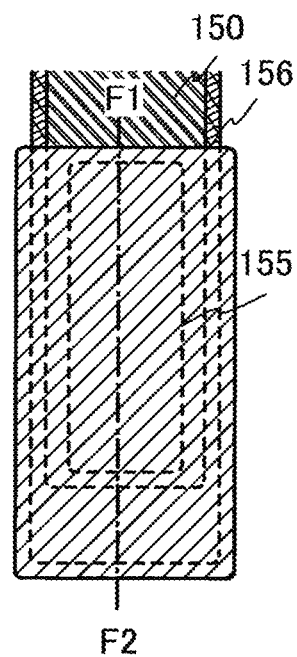

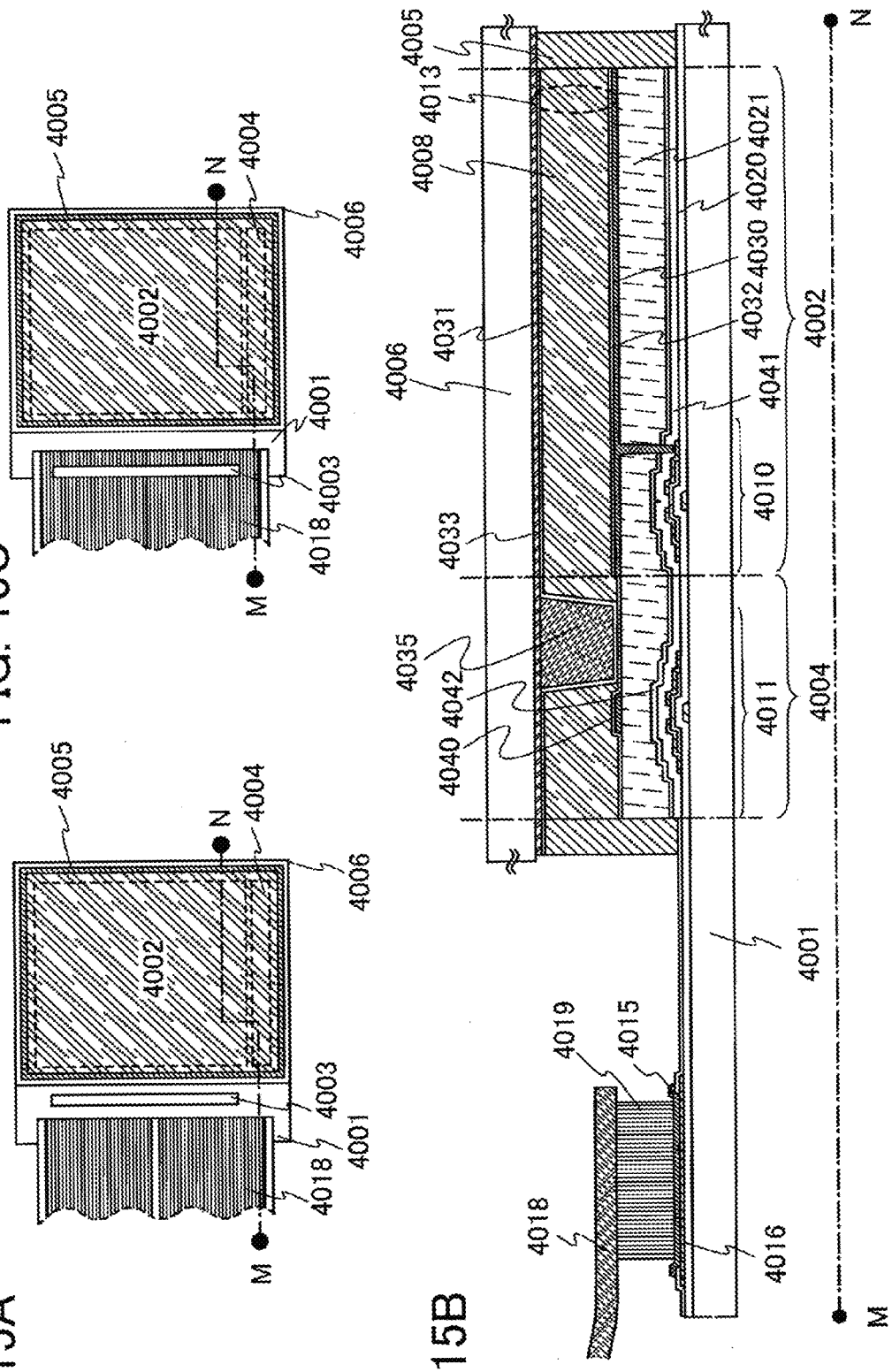

FIG. 21A
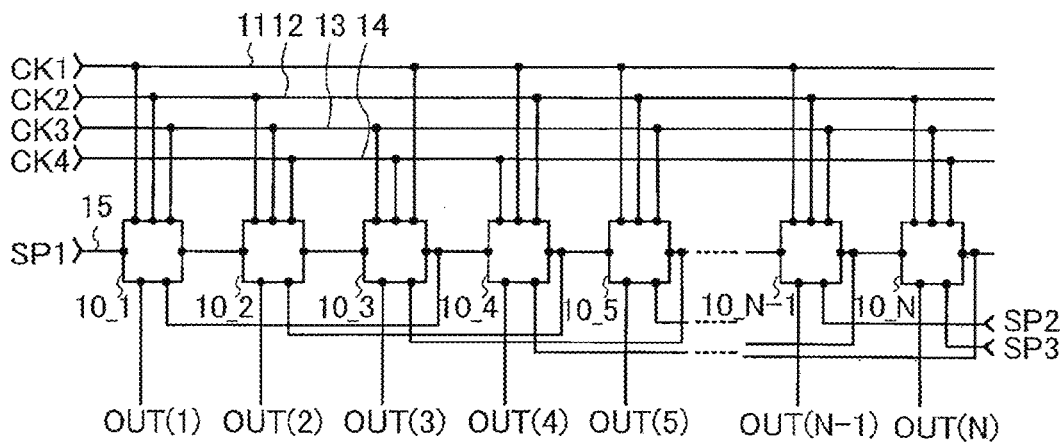
FIG. 21B
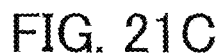
FIG. 21C
FIG. 21D
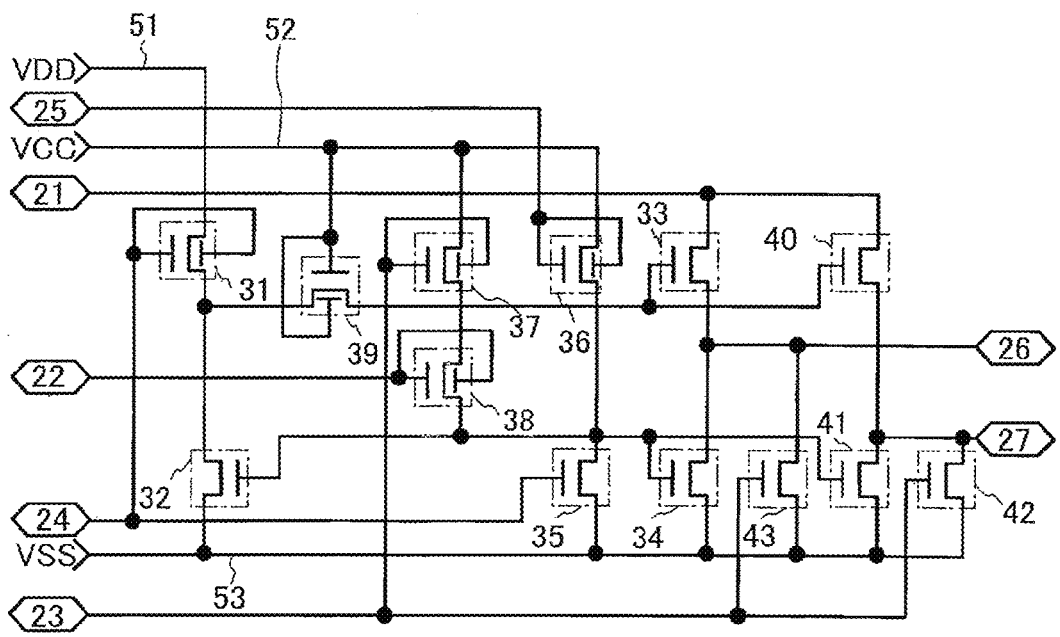

US 9,461,181 B2

METHOD FOR MANUFACTURING SEMICONDUCTOR DEVICE

TECHNICAL FIELD

The present invention relates to a semiconductor device including an oxide semiconductor and a method for manufacturing the semiconductor device.

In this specification, a semiconductor device generally means a device which can function by utilizing semiconductor characteristics, and an electro-optic device, a semiconductor circuit, and electronic equipment are all semiconductor devices.

BACKGROUND ART

A technique for forming a thin film transistor (TFT) by using a thin semiconductor film formed over a substrate having an insulating surface has attracted attention. A thin film transistor is used for a display device typified by a liquid crystal television. A silicon-based semiconductor material is known as a material for a thin semiconductor film applicable to a thin film transistor. As another material, an oxide semiconductor has attracted attention.

As a material of the oxide semiconductor, zinc oxide or a material including zinc oxide as its component is known. Further, a thin film transistor formed using an amorphous oxide (oxide semiconductor) having an electron carrier concentration of less than $10^{18}/cm^3$ is disclosed (see Patent Documents 1 to 3).

REFERENCE

Patent Documents

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

However, a difference from the stoichiometric composition in an oxide semiconductor arises in a thin film formation process. For example, electrical conductivity of the oxide semiconductor changes due to the excess or deficiency of oxygen. Further, hydrogen or moisture that enters the thin oxide semiconductor film during the formation of the thin film forms an O—H (oxygen-hydrogen) bond and serves as an electron donor, which is a factor of changing electrical conductivity. Furthermore, since the O—H bond is a polar molecule, it serves as a factor of varying characteristics of an active device such as a thin film transistor manufactured using an oxide semiconductor.

In view of such problems, it is an object of an embodiment of the present invention to provide a semiconductor device having stable electric characteristics in which an oxide semiconductor is used.

In order to suppress variation in electric characteristics of a thin film transistor including an oxide semiconductor layer, impurities such as hydrogen, moisture, hydroxyl, or hydride (also referred to as a hydrogen compound) which cause the variation are intentionally removed from an oxide semiconductor layer. In addition, oxygen which is a major component of an oxide semiconductor and is reduced in the step of removing impurities is supplied. The oxide semiconductor layer is thus highly purified, whereby the oxide semiconductor layer which is electrically i-type (intrinsic) is obtained.

Therefore, it is preferable that hydrogen in the oxide semiconductor be as less as possible. The concentration of hydrogen contained in the oxide semiconductor is preferably set to $1 \times 10^{16}/cm^3$ or less, so that hydrogen contained in the oxide semiconductor is removed as close to zero as possible.

Further, the number of carriers in the high-purity oxide semiconductor is very small (close to zero), and the carrier concentration is less than $1 \times 10^{14}/cm^3$, preferably less than $1 \times 10^{12}/cm^3$, still preferably $1 \times 10^{11}/cm^3$ or less. Since the number of carriers in the oxide semiconductor is so small that an off-state current can be reduced in the thin film transistor. The smaller the amount of off-state current is, the better. Off-state current (also referred to as a leakage current) is a current that flows between a source and a drain of a thin film transistor in the case where a given gate voltage between −1 V to −10 V is applied. A current value per 1 μm in a channel width (w) of a thin film transistor including an oxide semiconductor, which is disclosed in this specification, is 100 aA/μm or less, preferably 10 aA/μm or less, still preferably 1 aA/μm or less. Further, the thin film transistor has no pn junction and is not deteriorated by hot carriers; thus, the electric characteristics of the thin film transistor are not affected by the pn junction and the deterioration.

The above concentration range of hydrogen can be obtained by secondary ion mass spectrometry (SIMS) or on the basis of data of SIMS. In addition, the carrier concentration can be measured by Hall effect measurement. As an example of equipment used for Hall effect measurement, the specific resistance/hole measuring system ResiTest 8310 (manufactured by TOYO Corporation) can be given. With the specific resistance/Hall measuring system ResiTest 8310, the direction and strength of a magnetic field are changed in a certain cycle and in synchronization therewith, only a Hall electromotive voltage caused in a sample is detected, so that AC (alternate current) Hall measurement can be performed. Even in the case of a material with low mobility and high resistivity, a Hall electromotive voltage can be detected.

Besides impurities such as moisture existing in the oxide semiconductor film, impurities such as moisture existing in the gate insulating layer and those at interfaces between the oxide semiconductor film and upper and lower films provided in contact therewith are reduced.

In order to reduce impurities such as hydrogen, moisture, hydroxyl, or hydride, after the formation of the oxide semiconductor film, heat treatment (heat treatment for dehydration or dehydrogenation) is performed at 200° C. to 700° C., preferably at 350° C. to 700° C., still preferably at 450° C. to 700° C. in a nitrogen atmosphere or an inert gas atmosphere such as a rare gas (e.g., argon or helium) or under reduced pressure, in a state where the oxide semiconductor film is exposed. Thus, moisture contained in the oxide semiconductor film is reduced. Next, slow cooling is performed in an atmosphere of oxygen, an atmosphere of oxygen and nitrogen, or the air (ultra-dry air) (having a dew point of preferably lower than or equal to −40° C., still preferably lower than or equal to −50° C.) atmosphere.

As dehydration or dehydrogenation treatment, heat treatment is performed in a nitrogen atmosphere or an inert gas atmosphere, or under reduced pressure, whereby moisture contained in an oxide semiconductor film is reduced. Then, as treatment for supplying oxygen, cooling is performed on the oxide semiconductor film in an atmosphere of oxygen, an atmosphere of oxygen and nitrogen, or the air (ultra-dry air) (having a dew point of preferably lower than or equal to −40° C., still preferably lower than or equal to −50° C.) atmosphere. With the use of the thus obtained oxide semiconductor film, electric characteristics of a thin film transistor are improved. Further, a thin film transistor with high performance, which can be mass-produced, can be achieved.

A temperature ramp was applied to a plurality of samples in a nitrogen atmosphere. Such a plurality of samples were measured with a thermal desorption spectroscopy (TDS) apparatus. Measurement results are shown in FIG. 4, FIG. 5, FIG. 6, and FIG. 7.

The thermal desorption spectroscopy apparatus is used for detecting and identifying, by a quadrupole mass analyzer, a gas component desorbed and generated from the samples when the sample is heated and the temperature thereof is increased in high vacuum; thus, a gas and a molecule desorbed from surfaces and insides of the samples can be observed. With the use of a thermal desorption spectroscopy apparatus manufactured by ESCO Ltd. (product name: EMD-WA1000S), measurement was performed under the following conditions: the rising temperature was at approximately 10° C./min; the pressure was $1 \times 10^{-8}$ (Pa) at the beginning of the measurement; and the pressure was at a degree of vacuum of approximately $1 \times 10^{-7}$ (Pa) during the measurement.

FIG. 37 is a graph showing TDS results of comparison between a sample (comparative sample) which includes only a glass substrate and a sample (Sample 1) where an In—Ga—Zn—O-based film with a thickness of 50 nm is formed over a glass substrate by a sputtering method. FIG. 37 shows results obtained by measuring $H_2O$. Desorption of impurities such as moisture ($H_2O$) from the In—Ga—Zn—O-based film can be confirmed from a peak in the vicinity of 300° C.

The comparison was performed on the following samples: a sample (Sample 1) where an In—Ga—Zn—O-based film with a thickness of 50 nm is formed over a glass substrate by a sputtering method; a sample (Sample 2) where the structure of Sample 1 is subjected to heat treatment at 350° C. for one hour in a nitrogen atmosphere; a sample (Sample 3) where the structure of Sample 1 is subjected to heat treatment at 375° C. for one hour in a nitrogen atmosphere; a sample (Sample 4) where the structure of Sample 1 is subjected to heat treatment at 400° C. for one hour in a nitrogen atmosphere; a sample (Sample 5) where the structure of Sample 1 is subjected to heat treatment at 425° C. for one hour in a nitrogen atmosphere; and a sample (Sample 6) where the structure of Sample 1 is subjected to heat treatment for one hour at 450° C. in a nitrogen atmosphere.

FIG. 4 shows TDS results on $H_2O$. FIG. 5 shows TDS results on OH. FIG. 6 shows TDS results on H. FIG. 7 shows TDS results on O. Note that under the above conditions of heat treatment, the oxygen concentration in a nitrogen atmosphere is 20 ppm or lower.

From the results shown in FIG. 4, FIG. 5, and FIG. 6, it is found that the higher the heat temperature in a nitrogen atmosphere is, the smaller the amount of impurities such as moisture ($H_2O$), OH, and H desorbed from the In—Ga—Zn—O-based film becomes.

Further, as illustrated in FIG. 7, a peak of oxygen is also lowered by heat treatment in a nitrogen atmosphere.

The above results indicate that, by performance of the heat treatment of the In—Ga—Zn—O-based film, moisture is mainly discharged. In other words, heat treatment causes desorption of moisture ($H_2O$) mainly from the In—Ga—Zn—O-based film. The TDS measurement values of H shown in FIG. 5, OH shown in FIG. 6, and O shown in FIG. 7 are affected by materials obtained by decomposition of water molecules.

Sample 7, which was obtained by heat treatment which was performed in a nitrogen atmosphere and cooling which was performed in an oxygen atmosphere, was subjected to TDS measurements. An In—Ga—Zn—O-based film was formed to a thickness of 50 nm over a glass substrate using an In—Ga—Zn—O-based oxide semiconductor film formation target (In:Ga:Zn=1:1:1 [atomic ratio]) in an atmosphere of argon and oxygen (argon:oxygen=30 sccm:15 sccm) under the following conditions: the distance between the substrate and the target was 60 mm, the pressure was 0.4 Pa, and the RF power supply was 0.5 kW. The temperature of the thus obtained film was raised in a nitrogen atmosphere for one and a half hours, and the film was heated at 450° C. for one hour. After that, the film was cooled in an oxygen atmosphere for about five hours. Thus, Sample 7 was formed. On the other hand, a film was formed in a manner similar to the film, heated in a nitrogen atmosphere, and then cooled still in the nitrogen atmosphere not in an oxygen atmosphere. Thus, Sample 8 was formed.

FIG. 44A shows TDS results on oxygen (O) of Sample 7, and FIG. 44B shows a TDS result on oxygen (O) of Sample 8. The peak of oxygen of Sample 7 in FIG. 44A, which is cooled in an oxygen atmosphere, is higher than that of oxygen of Sample 8 in FIG. 44B, which is not cooled in an oxygen atmosphere. From these results, it can be confirmed that oxygen is supplied to the film of Sample 7.

FIGS. 44A and 44B show that, oxygen can be supplied to an oxide semiconductor layer by cooling the oxide semiconductor layer in an atmosphere of oxygen, an atmosphere of oxygen and nitrogen, or the air (having a dew point of preferably lower than or equal to −40° C., still preferably lower than or equal to −50° C.) atmosphere, and thus, oxygen deficiency due to discharge of oxygen can be filled. Therefore, a high-purity oxide semiconductor layer which is electrically i-type (intrinsic) can be obtained.

In this specification, heat treatment in a nitrogen atmosphere or an inert gas atmosphere such as a rare gas (e.g., argon or helium) or under reduced pressure is referred to as heat treatment for dehydration or dehydrogenation. In this specification, for convenience, dehydration or dehydrogenation refers not only to desorption of $H_2$ but also to desorption of H, OH, or the like.

Heat treatment for dehydration or dehydrogenation is performed on an oxide semiconductor layer, and thus, an oxide semiconductor layer is changed to an oxygen-deficient type, whereby an n-type ($n^-$-type, $n^+$-type, or the like) oxide semiconductor layer is obtained. The obtained oxide semiconductor layer is then cooled in an atmosphere of oxygen, an atmosphere of oxygen and nitrogen, or the air (having a dew point of preferably lower than or equal to −40° C., still preferably lower than or equal to −50° C.) atmosphere, whereby oxygen is supplied to the oxide semiconductor layer. Thus, the oxide semiconductor layer is highly purified, whereby an i-type oxide semiconductor layer is obtained. With the use of the thus obtained i-type oxide semiconductor layer, a semiconductor device including a highly reliable thin film transistor having excellent electric characteristics can be manufactured and provided.

According to an embodiment of a structure of the invention disclosed in this specification, a gate electrode layer and a gate insulating layer covering the gate electrode layer are formed; the gate electrode layer and the gate insulating layer are introduced into a treatment chamber kept under reduced pressure; an oxide semiconductor layer is formed over the gate insulating layer with the use of a metal oxide target attached to the treatment chamber by introduction of a sputtering gas, from which hydrogen and moisture are removed, concurrently with removal of residual moisture from the treatment chamber; dehydration or dehydrogenation is performed on the oxide semiconductor layer by heat treatment in a nitrogen atmosphere or a rare gas atmosphere, then, oxygen is supplied to the oxide semiconductor layer by cooling treatment in an oxygen atmosphere; a source electrode layer and a drain electrode layer are formed over the oxide semiconductor layer which has been subjected to dehydration or dehydrogenation and to which oxygen has been supplied; and an insulating layer is formed over the gate insulating layer, the oxide semiconductor layer, the source electrode layer, and the drain electrode layer by a sputtering method.

According to an embodiment of a structure of the invention disclosed in this specification, a gate electrode layer and a gate insulating layer covering the gate electrode layer are formed over; the gate electrode layer and the gate insulating layer are introduced into a treatment chamber kept under reduced pressure; an oxide semiconductor layer is formed over the gate insulating layer with the use of a metal oxide target attached to the treatment chamber by introduction of a sputtering gas, from which hydrogen and moisture are removed, concurrently with removal of residual moisture from the treatment chamber; dehydration or dehydrogenation is performed on the oxide semiconductor layer by heat treatment in a nitrogen atmosphere or a rare gas atmosphere, then, oxygen is supplied to the oxide semiconductor layer by cooling treatment in an atmosphere of oxygen and nitrogen or air atmosphere having a dew point of lower than or equal to −40° C.; a source electrode layer and a drain electrode layer are formed over the oxide semiconductor layer which has been subjected to dehydration or dehydrogenation and to which oxygen has been supplied; and an insulating layer is formed over the gate insulating layer, the oxide semiconductor layer, the source electrode layer, and the drain electrode layer by a sputtering method.

In the method for manufacturing a semiconductor device, the oxide semiconductor layer or the insulating layer is preferably formed in a deposition chamber (treatment chamber) the impurity concentration of which is reduced by evacuation with a sorption vacuum pump such as a cryopump. As the sorption vacuum pump, a cryopump, an ion pump, or a titanium sublimation pump is preferably used, for example. The sorption vacuum pump functions so as to reduce the amount of hydrogen, water, hydroxyl, or hydride contained in the oxide semiconductor layer or the insulating layer.

As a sputtering gas used for formation of the oxide semiconductor layer or the insulating layer, a high-purity gas is preferably used, in which impurities such as hydrogen, water, hydroxyl, or hydride are reduced to such a degree that the impurity concentration level is represented by the unit "ppm" or "ppb".

In the method for manufacturing a semiconductor device, a target containing zinc oxide as its main component can be used as the target for forming the oxide semiconductor film. Alternatively, metal oxide containing indium, gallium, and zinc can be used as the target.

A feature of the present invention is to subject an oxide semiconductor layer to heat treatment for dehydration or dehydrogenation treatment in a nitrogen atmosphere or an inert gas atmosphere such as a rare gas (e.g., argon or helium) or under reduced pressure and to a cooling step for treatment for supplying oxygen in an atmosphere of oxygen, an atmosphere of oxygen and nitrogen, or the air (having a dew point of preferably lower than or equal to −40° C., still preferably lower than or equal to −50° C.) atmosphere.

The temperature states of an oxide semiconductor layer (and a substrate) in the dehydration or dehydrogenation treatment and the treatment for supplying oxygen are a rising state, a constant state, and a dropping state. The gas (atmosphere) may be switched from nitrogen or an inert gas such as a rare gas (e.g., argon or helium) to oxygen, both oxygen and nitrogen, or the air (having a dew point of preferably lower than or equal to −40° C., still preferably lower than or equal to −50° C.) at any of the following timings: at the time when the temperature of the oxide semiconductor layer is in a constant state, at the time when the temperature drop of the oxide semiconductor layer is started, and at the time when the temperature of the oxide semiconductor layer is in a dropping state.

With the structures, at least one of the problems can be solved.

As the oxide semiconductor film used in this specification, a four-component metal oxide such as an In—Sn—Ga—Zn—O film, a three-component metal oxide such as an In—Ga—Zn—O film, an In—Sn—Zn—O film, an In—Al—Zn—O film, a Sn—Ga—Zn—O film, an Al—Ga—Zn—O film, and a Sn—Al—Zn—O film, or a two-component metal oxide such as an In—Zn—O film, a Sn—Zn—O film, an Al—Zn—O film, a Zn—Mg—O film, a Sn—Mg—O film, an In—Mg—O film, an In—O film, a Sn—O film, and a Zn—O film can be used. The oxide semiconductor film may contain $SiO_2$.

As the oxide semiconductor film, a thin film represented by $InMO_3 (ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor film whose composition formula is represented as $InMO_3 (ZnO)_m$ (m>0) where at least Ga is included as M is referred to as the In—Ga—Zn—O oxide semiconductor described above, and a thin film thereof is also referred to as an In—Ga—Zn—O film.

Since a thin film transistor is easily broken due to static electricity or the like, a protective circuit for protecting the driver circuit is preferably provided over the same substrate for a gate line or a source line. The protective circuit is preferably formed with a non-linear element including an oxide semiconductor.

A gate insulating layer and an oxide semiconductor film may be successively processed (also called successive treatment, an in situ process, successive film formation) without exposure to the air. Successive treatment without exposure to the air enables an interface between the gate insulating layer and the oxide semiconductor film to be formed without being contaminated by atmospheric components or impurities floating in the air, such as water or hydrocarbon. Thus, variation in characteristics of thin film transistors can be reduced.

Note that the term "successive treatment" in this specification means that during the process from a first treatment step performed by a PCVD method or a sputtering method to a second treatment step performed by a PCVD method or a sputtering method, an atmosphere in which a substrate to be processed is disposed is not contaminated by a contaminant atmosphere such as the air, and is constantly controlled to be vacuum, an inert gas atmosphere (a nitrogen atmosphere or a rare gas atmosphere), an oxygen gas, a gas including oxygen and nitrogen (e.g., $N_2O$ gas) or ultra-dry air (having a dew point of preferably lower than or equal to −40° C., still preferably lower than or equal to −50° C.). By the successive treatment, a film can be formed while preventing moisture or the like from being attached again to the substrate to be processed which is cleaned.

Performing the process from the first treatment step to the second treatment step in the same chamber is within the scope of the successive treatment in this specification.

In addition, the following is also within the scope of the successive processing in this specification: in the case of performing the process from the first treatment step to the second treatment step in different chambers, the substrate is transferred after the first treatment step to another chamber without being exposed to the air including impurities such as hydrogen, moisture, hydroxyl, or hydride and subjected to the second treatment.

Note that the case where there is a substrate transfer step, an alignment step, a slow cooling step, a step of heating or cooling a substrate to adjust the temperature of the substrate to suitable temperature for the second treatment step, or the like between the first treatment step and the second treatment step is also in the scope of the successive treatment in this specification.

However, the following case is not within the scope of the successive treatment in this specification: there is a step in which liquid is used, such as a cleaning step, a wet etching step, or a resist formation step between the first treatment step and the second treatment step.

A thin film transistor having stable electric characteristics can be provided. Further, a semiconductor device which includes thin film transistors having excellent electric characteristics and high reliability can be provided.

BRIEF DESCRIPTION OF DRAWINGS

FIGS. 10A to 10D are cross-sectional views illustrating a manufacturing process of an embodiment of the present invention.

FIGS. 11A to 11C are cross-sectional views illustrating a manufacturing process of an embodiment of the present invention.

FIGS. 13A1, 13A2, 13B1, and 13B2 illustrate semiconductor devices of an embodiment of the present invention.

FIGS. 15A to 15C illustrate semiconductor devices.

FIGS. 21A to 21D are circuit diagrams illustrating a structure of a shift register.

BEST MODE FOR CARRYING OUT THE INVENTION

Hereinafter, embodiments of the present invention will be described in detail with reference drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.
(Embodiment 1)

A semiconductor device and a method for manufacturing the semiconductor device will be described with reference to FIGS. 1A to 1D and FIGS. 2A and 2B.

Figure 2A:
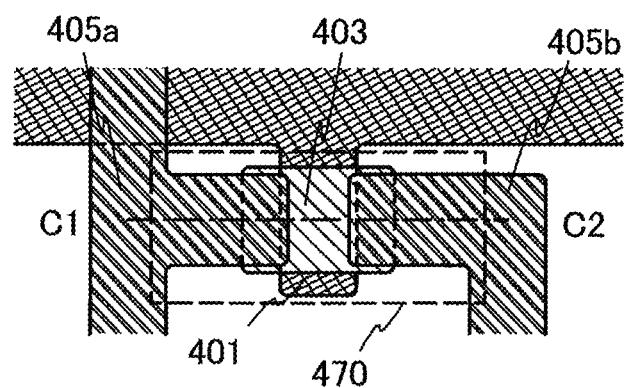
FIGS. 2A and 2B illustrate a semiconductor device of an embodiment of the present invention.
Figure 2B:
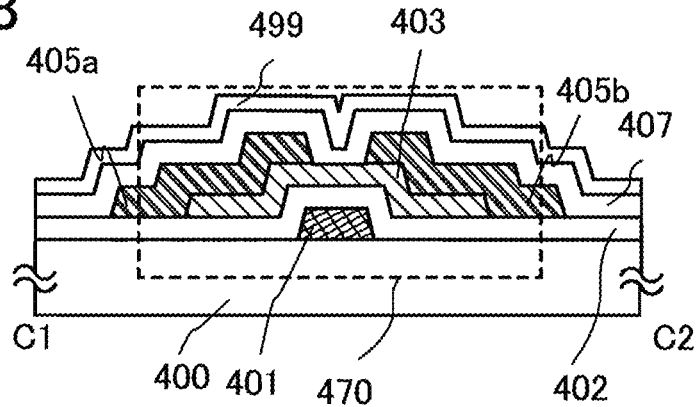

FIG. 2A is a plan view of a thin film transistor 470 included in a semiconductor device, and FIG. 2B is a cross-sectional view taken along line C1-C2 of FIG. 2A. The thin film transistor 470 is an inverted staggered thin film transistor and includes, over a substrate 400 which is a substrate having an insulating surface, a gate electrode layer 401, a gate insulating layer 402, an oxide semiconductor layer 403, a source electrode layer 405a, and a drain electrode layer 405b. The thin film transistor 470 is covered with an insulating layer 407 which is in contact with the oxide semiconductor layer 403. A protective insulating layer 499 is stacked over the insulating layer 407.

In order to suppress variation in electric characteristics of the thin film transistor 470, impurities such as hydrogen, moisture, hydroxyl, or hydride (also referred to as a hydrogen compound) which cause the variation are intentionally removed from an oxide semiconductor layer. In addition, oxygen which is a major component of an oxide semiconductor and is reduced in the step of removing impurities is supplied. Thus, a highly purified oxide semiconductor layer which is electrically i-type (intrinsic) is obtained. In this manner, the oxide semiconductor layer 403 is formed.

Therefore, it is preferable that hydrogen in the oxide semiconductor layer 403 be as less as possible. The concentration of hydrogen contained in the oxide semiconductor layer 403 is preferably set to $1 \times 10^{16}/cm^3$ or less, so that hydrogen contained in the oxide semiconductor layer 403 is removed as close to zero as possible.

Further, the number of carriers in the high-purity oxide semiconductor layer 403 is very small (close to zero), and the carrier concentration is less than $1 \times 10^{14}/cm^3$, preferably less than $1 \times 10^{12}/cm^3$, still preferably $1 \times 10^{11}/cm^3$ or less. Since the number of carriers in the oxide semiconductor layer 403 is so small that an off-state current can be reduced in the thin film transistor 470. The smaller the amount of off-state current is, the better. A current value per 1 μm in a channel width (w) of the thin film transistor 470 is 100 aA/μm or less, preferably 10 aA/μm or less, still preferably 1 aA/μm or less. Further, the thin film transistor 470 has no pn junction and is not deteriorated by hot carriers; thus, the electric characteristics of the thin film transistor 470 are not affected by the pn junction and the deterioration.

In order to reduce impurities such as hydrogen, moisture, hydroxyl, or hydride, after the formation of the oxide semiconductor layer, heat treatment (heat treatment for dehydration or dehydrogenation) is performed at 200° C. to 700° C., preferably at 350° C. to 700° C., still preferably at 450° C. to 700° C. in a nitrogen atmosphere or an inert gas atmosphere such as a rare gas (e.g., argon or helium) or under reduced pressure, in a state where the oxide semiconductor layer is exposed. Thus, moisture contained in the oxide semiconductor layer is reduced. Next, cooling is performed in an atmosphere of oxygen, an atmosphere of oxygen and nitrogen, or the air (ultra-dry air) (having a dew point of preferably lower than or equal to −40° C., still preferably lower than or equal to −50° C.) atmosphere.

As dehydration or dehydrogenation treatment, moisture contained in a film is reduced by heat treatment in a nitrogen atmosphere or an inert gas atmosphere, or under reduced pressure. Then, as treatment for supplying oxygen, cooling is performed in an atmosphere of oxygen, an atmosphere of oxygen and nitrogen, or the air (ultra-dry air) (having a dew point of preferably lower than or equal to −40° C., still preferably lower than or equal to −50° C.) atmosphere. With the use of the thus obtained oxide semiconductor layer 403, electric characteristics of the thin film transistor 470 are improved. Further, a thin film transistor with high performance, which can be mass-produced, can be achieved.

Further, impurities such as moisture which exist not only in the oxide semiconductor layer 403 but also in the gate insulating layer 402 and the interfaces between the oxide semiconductor layer 403 and the upper and lower films provided in contact therewith, which are specifically the interface between the oxide semiconductor layer 403 and the gate insulating layer 402 and the interface between the oxide semiconductor layer 403 and the insulating layer 407, are reduced.

Therefore, in order that hydrogen, hydroxyl, and moisture may be contained as little as possible, it is preferable that impurities such as hydrogen or moisture be desorbed and evacuated in forming the gate insulating layer 402 and the insulating layer 407. Further, in order for impurities such as hydrogen or moisture which are adsorbed to the substrate 400 to be desorbed and evacuated, preheating is preferably performed before the formation of the gate insulating layer 402, the oxide semiconductor layer 403, and the insulating layer 407.

The oxide semiconductor layer 403 including a channel formation region may be formed using an oxide material having semiconductor characteristics. As the oxide semiconductor layer, any of the following oxide semiconductor films can be used: a four-component metal oxide such as an In—Sn—Ga—Zn—O film; a three-component metal oxide such as an In—Ga—Zn—O film, an In—Sn—Zn—O film, an In—Al—Zn—O film, a Sn—Ga—Zn—O film, an Al—Ga—Zn—O film, and a Sn—Al—Zn—O film; a two-component metal oxide such as an In—Zn—O film, a Sn—Zn—O film, an Al—Zn—O film, a Zn—Mg—O film, a Sn—Mg—O film, or an In—Mg—O film; an In—O film; a Sn—O film; a Zn—O film; or the like can be used. The oxide semiconductor film may contain $SiO_2$.

As the oxide semiconductor layer, a thin film expressed by $InMO_3(ZnO)_m$ (m>0) can be used. Here, M represents one or more metal elements selected from Ga, Al, Mn, or Co. For example, M can be Ga, Ga and Al, Ga and Mn, Ga and Co, or the like.

An oxide semiconductor film whose composition formula is expressed by $InMO_3(ZnO)_m$ (m>0) where at least Ga is included as M is referred to as the In—Ga—Zn—O oxide semiconductor described above, and a thin film thereof is also referred to as an In—Ga—Zn—O film.

Figure 40:
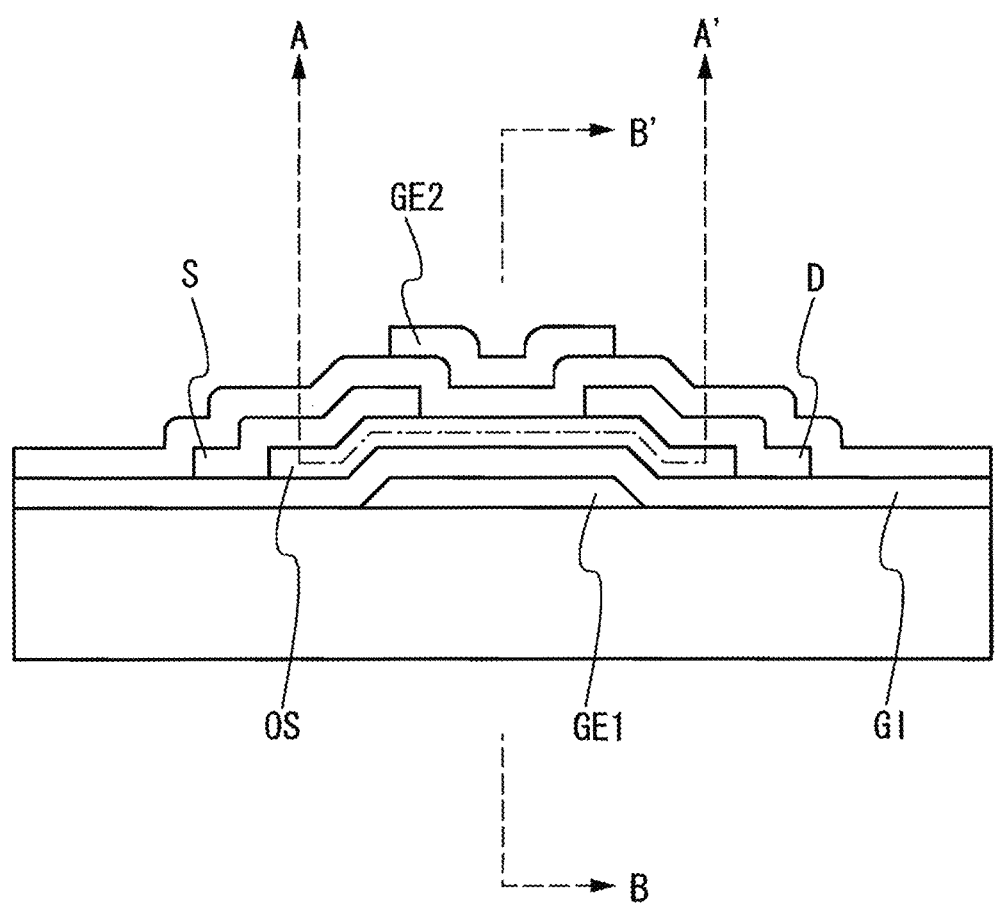
FIG. 40 is a longitudinal sectional view of an inverted staggered thin film transistor in which an oxide semiconductor is used.

FIG. 40 is a longitudinal sectional view of a dual-gate thin film transistor including a back gate electrode and using an oxide semiconductor. An oxide semiconductor (OS) layer is provided over a gate electrode (GE1) with a gate insulating film (GI) therebetween and a source electrode (S) and a drain electrode (D) are provided thereover. An insulating layer is provided to cover the source electrode (S) and the drain electrode (D). A back gate electrode (GE2) is provided in a region over the insulating layer overlapping with the gate electrode (GE1).

Figure 41:
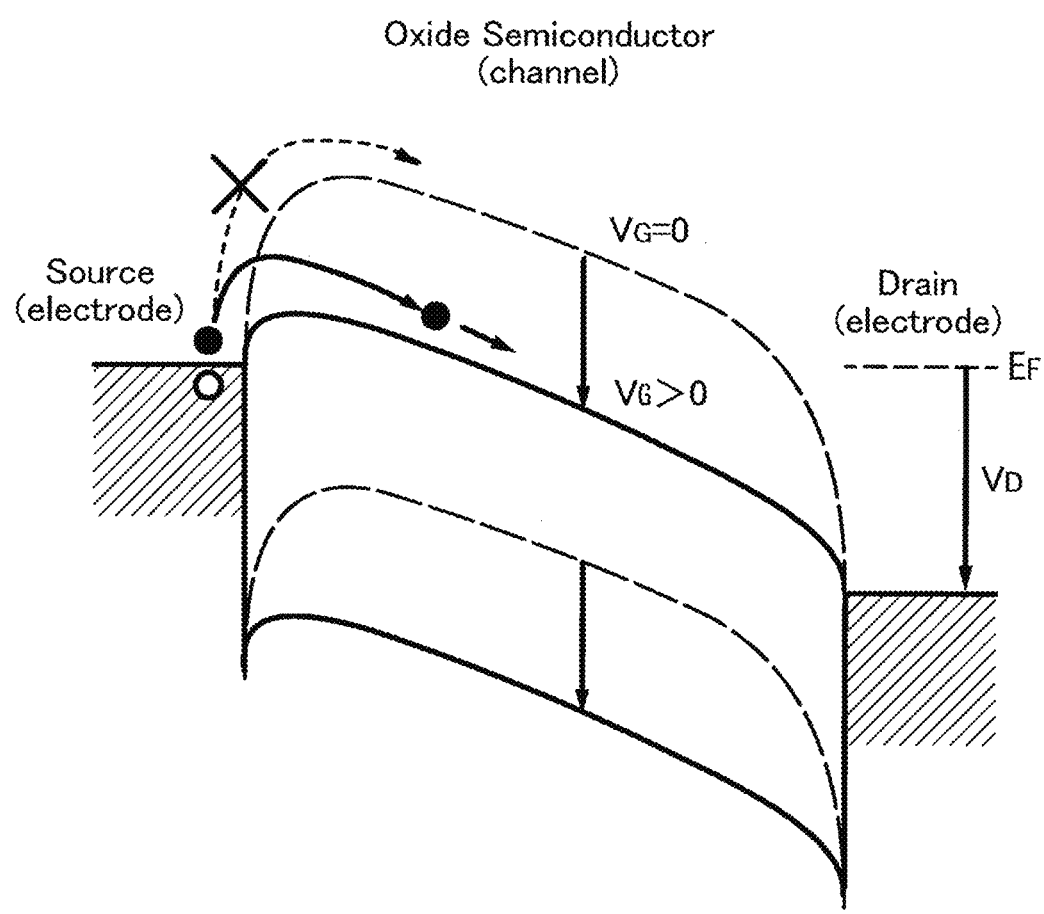
FIG. 41 illustrates energy band diagrams (schematic diagrams) along an A-A' section illustrated in FIG. 40.

FIG. 41 shows energy band diagrams (schematic diagrams) along an A-A' section illustrated in FIG. 40. In FIG. 41, a black dot (•) indicates an electron, and white dot indicates a hole. FIG. 41 illustrates the case where a positive voltage ($V_D$>0) is applied to the drain electrode and no voltage is applied to the gate electrode ($V_G$=0) (shown by dashed lines) and the case where a positive voltage ($V_D$>0) is applied to the drain electrode and a positive voltage ($V_G$>0) is applied to the gate electrode (shown by solid lines). When no voltage is applied to the gate electrode, carriers (electrons) are not injected from the electrode to the oxide semiconductor side due to the high potential barrier, resulting in an off state in which no current flows. In contrast, when a positive voltage is applied to the gate, the potential barrier is lowered, resulting in an on state where current flows.

Figure 42A:
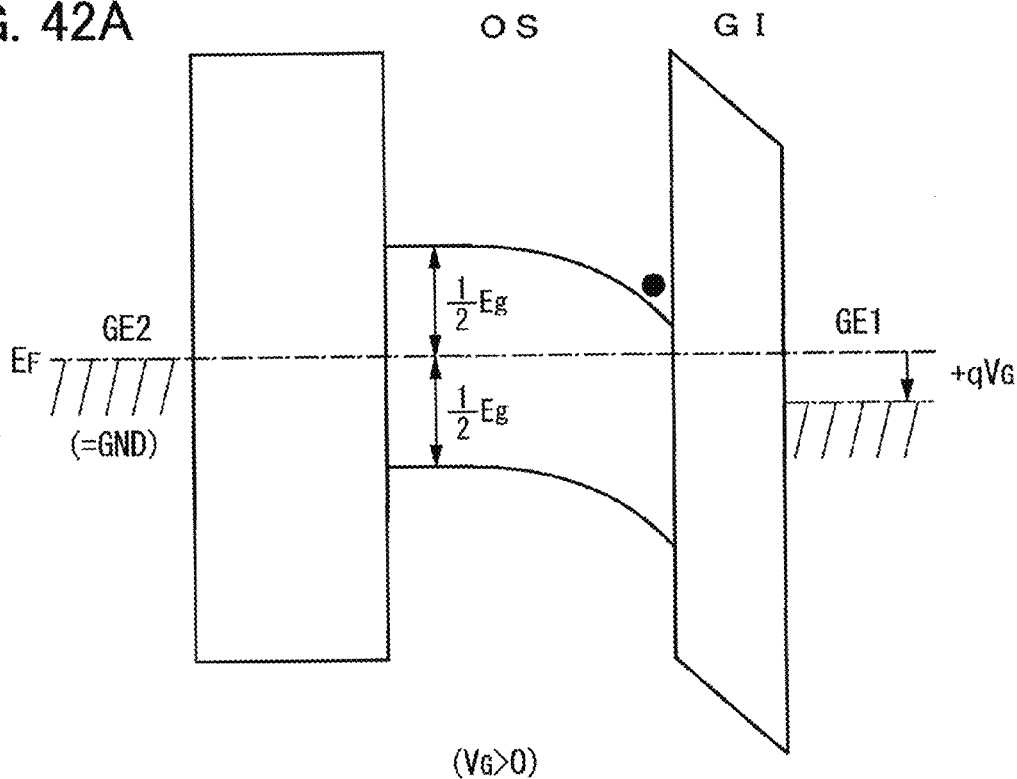
FIG. 42A illustrates a state in which a positive potential ($+V_G$) is applied to a gate (GE1)
Figure 42B:
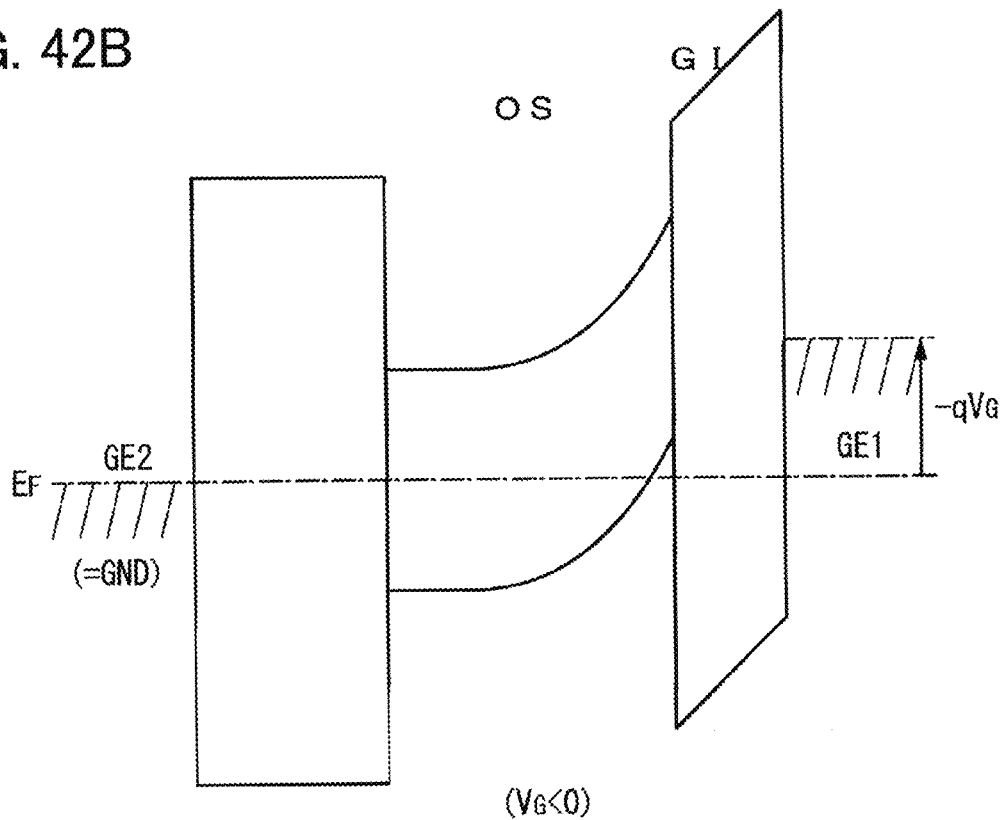
FIG. 42B illustrates a state in which a negative potential ($-V_G$) is applied to the gate (GE1).

FIGS. 42A and 42B are energy band diagrams (schematic diagrams) along an B-B' section illustrated in FIG. 40. FIG. 42A shows a state where positive potential (+$V_G$) is applied to the gate electrode (GE1), that is, a state where the thin film transistor is in an on state where carriers (electrons) flow between the source electrode and the drain electrode. FIG. 42B shows a state where negative potential (−$V_G$) is applied to the gate electrode (GE1), that is, a case where the thin film transistor is in an off state (a state where minority carriers do not flow).

Figure 43:
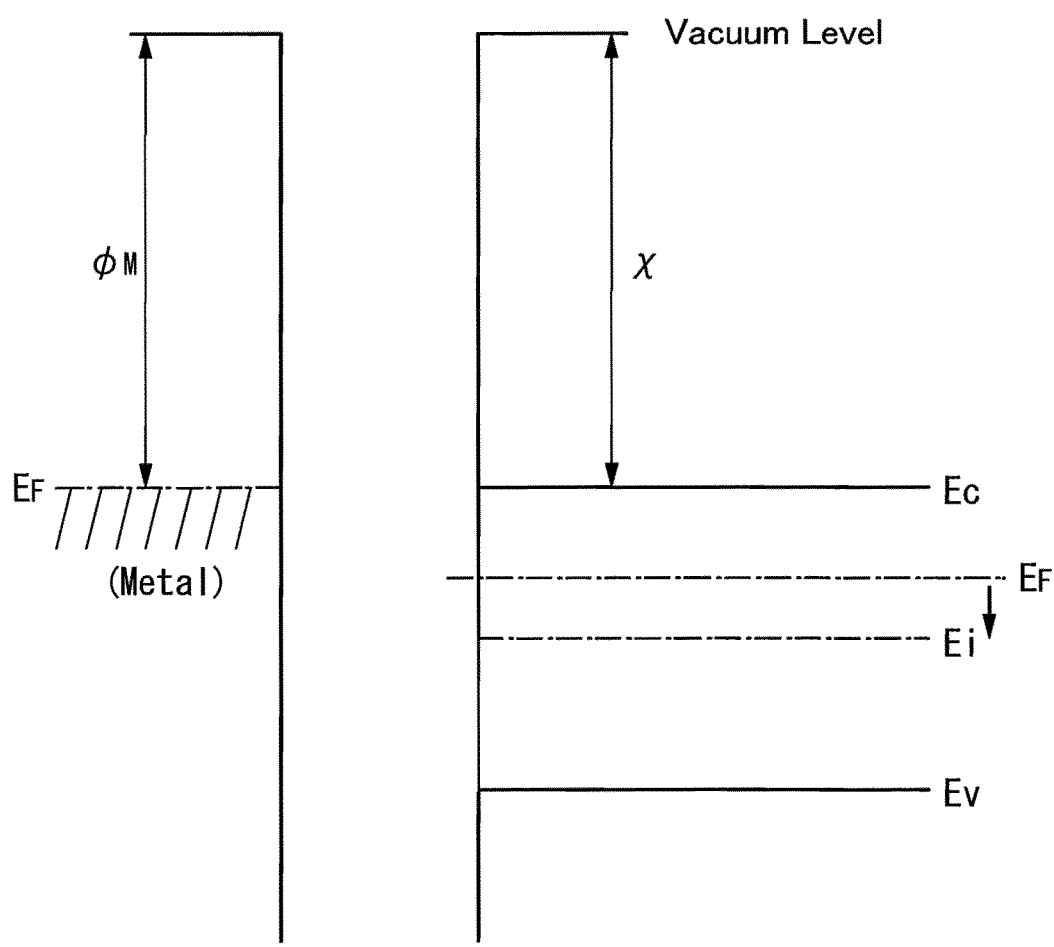
FIG. 43 is an energy band diagram illustrating the relationship between the vacuum level and the work function of a metal ($\phi M$) and between the vacuum level and the electron affinity ($\chi$) of an oxide semiconductor.
Figure 44A:
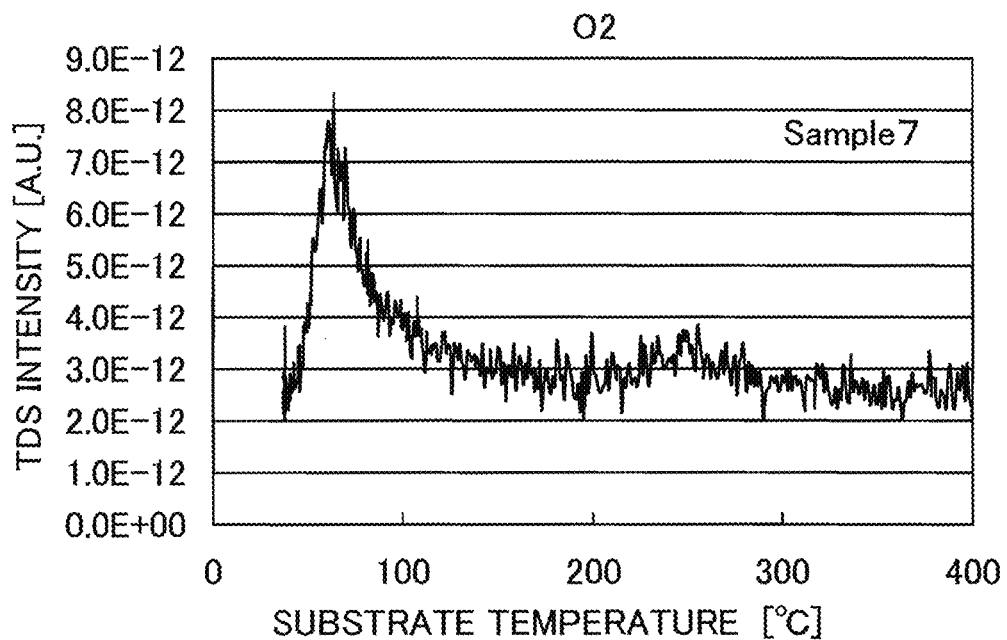
FIGS. 44A and 44B are graphs illustrating TDS measurement results.
Figure 44B:
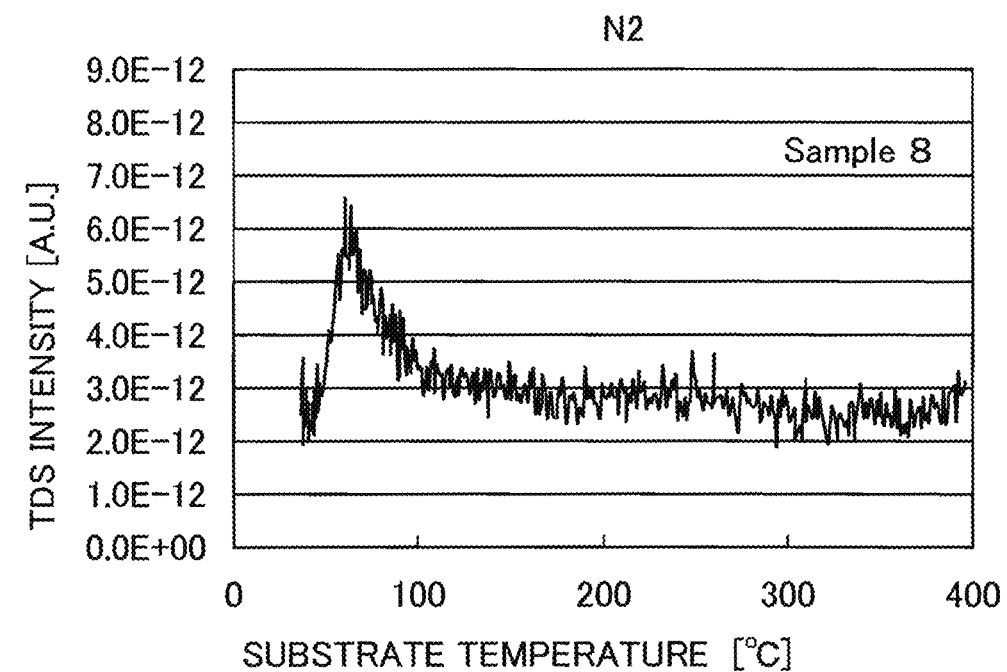

FIG. 43 shows a relation between the vacuum level and the work function of a metal ($\phi_M$) and a relation between the vacuum level and the electron affinity ($\chi$) of the oxide semiconductor.

At normal temperature, electrons in the metal degenerate and the Fermi level is located in the conduction band. A conventional oxide semiconductor is of n-type, and the Fermi level ($E_F$) is away from the intrinsic Fermi level ($E_i$) in the middle of the band gap and is located closer to the conduction band. Note that it is known that part of hydrogen is a donor in an oxide semiconductor and is one factor causing an oxide semiconductor to be an n-type semiconductor.

In contrast, the oxide semiconductor according to the present invention is an intrinsic (i-type) or substantially intrinsic oxide semiconductor film obtained by removal of hydrogen, which is an n-type impurity, from the oxide semiconductor and the increase in purity so that an impurity other than the main components of the oxide semiconductor is not included as much as possible. In other words, the oxide semiconductor according to the present invention is a highly purified intrinsic (i-type) oxide semiconductor film or an oxide semiconductor film which is close to a highly purified intrinsic oxide semiconductor film obtained not by addition of an impurity but by removal of an impurity such as hydrogen, water, hydroxyl, or hydride as much as possible. In this manner, the Fermi level ($E_F$) can be at the same level as the intrinsic Fermi level (Ei).

It is said that the electron affinity ($\chi$) of an oxide semiconductor is 4.3 eV in the case where the band gap ($E_g$) thereof is 3.15 eV. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

In this case, as shown in FIG. 42A, an electron moves along the lowest part of the oxide semiconductor, which is energetically stable, at an interface between the gate insulating film and the high-purity oxide semiconductor.

In FIG. 42B, when negative potential is applied to the gate electrode (GE1), the number of holes that are minority carriers is substantially zero; thus, the current value becomes a value as close to zero as possible.

For example, even when the thin film transistor has a channel width W of 1×10$^4$ μm and a channel length of 3 μm, an off-state current of 10$^{-13}$ A or lower and a subthreshold value (S value) of 0.1 V/dec. (the thickness of the gate insulating film: 100 nm) can be obtained.

As described above, the oxide semiconductor is highly purified so that impurities other than a main component of the oxide semiconductor are contained as little as possible, whereby favorable operation of the thin film transistor can be obtained.

Although description is given using a single-gate thin film transistor as the thin film transistor 470, a multi-gate thin film transistor including a plurality of channel formation regions may be formed as needed.

In this embodiment, a semiconductor film comprising In—Ga—Zn—O is used as the oxide semiconductor layer 403.

FIGS. 1A to 1D are cross-sectional views illustrating a manufacturing process of the thin film transistor 470 illustrated in FIGS. 2A and 2B.

Figure 1A:
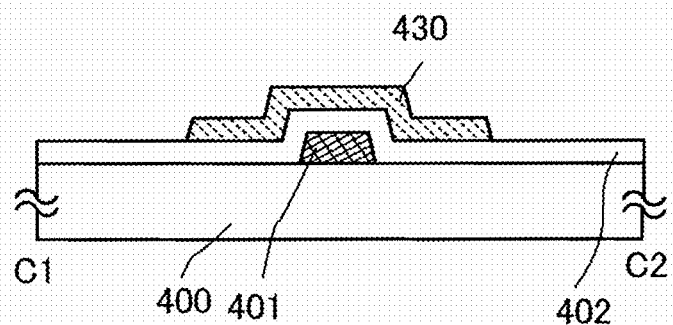
FIGS. 1A to 1D are cross-sectional views illustrating a manufacturing process of an embodiment of the present invention.
Figure 1B:
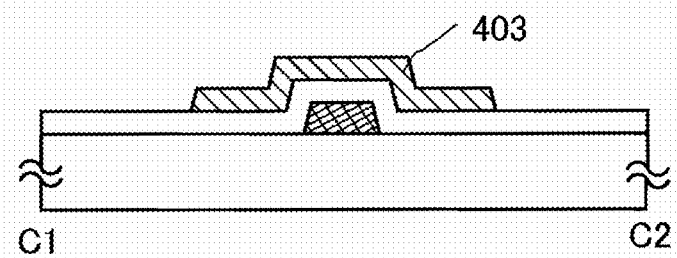
Figure 1C:
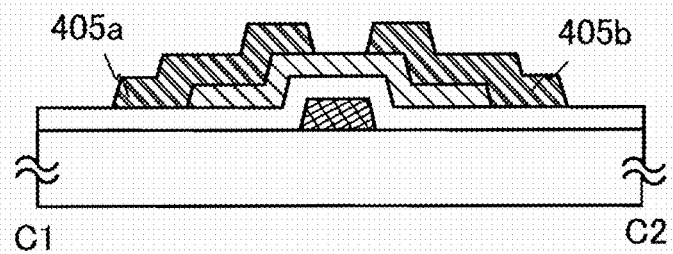
Figure 1D:
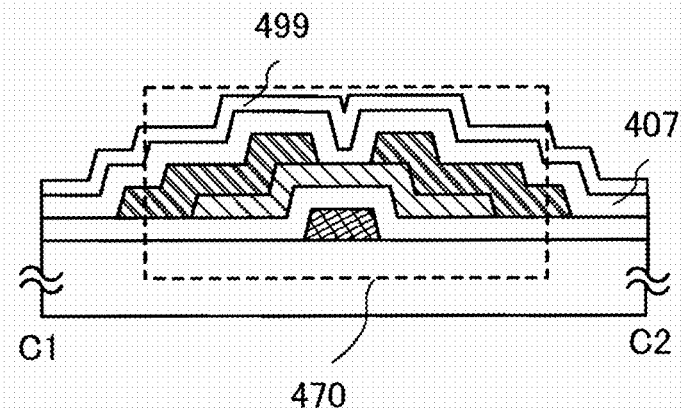

In FIG. 1A, the gate electrode layer 401 is provided over the substrate 400 which is a substrate having an insulating surface. The edge portion of the gate electrode layer formed preferably has a tapered shape because coverage with a gate insulating layer stacked thereover can be improved. Note that a resist mask may be formed by an inkjet method. Formation of the resist mask by an inkjet method needs no photomask; thus, manufacturing cost can be reduced.

Although there is no particular limitation on a substrate which can be used as the substrate 400 having an insulating surface, it is necessary that the substrate have at least enough heat resistance to withstand heat treatment to be performed later. For example, a glass substrate formed using barium borosilicate glass, aluminoborosilicate glass, or the like can be used.

In the case where a glass substrate is used and the temperature at which the heat treatment is to be performed later is high, a glass substrate whose strain point is greater than or equal to 730° C. is preferably used. As a glass substrate, a glass material such as aluminosilicate glass, aluminoborosilicate glass, or barium borosilicate glass is used, for example. Note that by containing a larger amount of barium oxide (BaO) than boron oxide, a more practical heat-resistant glass substrate is obtained. Therefore, a glass substrate containing BaO and $B_2O_3$ so that the amount of BaO is larger than that of $B_2O_3$ is preferably used.

Note that as the above glass substrate, a substrate formed using an insulator such as a ceramic substrate, a quartz substrate, or a sapphire substrate may be used. Alternatively, crystallized glass or the like may be used. Still alternatively, a plastic substrate or the like can be used as appropriate.

An insulating film serving as a base film may be provided between the substrate 400 and the gate electrode layer 401. The base film has a function of preventing diffusion of an impurity element from the substrate 400, and can be formed with a single-layer structure or a layered structure using one or more of a silicon nitride film, a silicon oxide film, a silicon nitride oxide film, and a silicon oxynitride film.

The gate electrode layer 401 can be formed in a single layer or a stacked layer using a metal material such as molybdenum, titanium, chromium, tantalum, tungsten, aluminum, copper, neodymium, or scandium, or an alloy material which includes any of these materials as a main component.

For example, as a two-layer structure of the gate electrode layer 401, the following structures are preferable: a two-layer structure of an aluminum layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stacked structure of a tungsten layer or a tungsten nitride layer, a layer of an alloy of aluminum and silicon or an alloy of aluminum and titanium, and a titanium nitride layer or a titanium layer is preferable. Note that a gate electrode layer can be formed using a conductive film having a light-transmitting property. As an example of a conductive film having a light-transmitting property, a transparent conductive oxide or the like can be given.

Next, the gate insulating layer 402 is formed over the gate electrode layer 401.

The gate insulating layer 402 can be formed with a single-layer structure or a layered structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. Note that it is preferable that a large amount of hydrogen be not contained in the gate insulating layer 402. In the case where a silicon oxide film is formed by a sputtering method, a silicon target or a quartz target is used as a target, and an oxygen gas or a mixed gas of oxygen and argon is used as a sputtering gas.

The gate insulating layer 402 may have a structure where a silicon nitride layer and a silicon oxide layer are stacked from the gate electrode layer 401 side. For example, a silicon nitride layer ($SiN_y$ (y>0)) with a thickness of 50 nm to 200 nm inclusive is formed by a sputtering method as a first gate insulating layer and a silicon oxide layer ($SiO_x$ (x>0)) with a thickness of 5 nm to 300 nm inclusive is stacked as a second gate insulating layer over the first gate insulating layer; thus, the gate insulating layer with a thickness of 100 nm is formed. The thickness of the gate insulating layer 402 may be set as appropriate depending on characteristics needed for a thin film transistor, and may be approximately 350 nm to 400 nm.

Further, in order that hydrogen, hydroxyl, and moisture might be contained in the gate insulating layer 402 and an oxide semiconductor film as little as possible, it is preferable that the substrate 400 over which the gate electrode layer 401 is formed or the substrate 400 over which layers up to the gate insulating layer 402 are formed be preheated in a preheating chamber of a sputtering apparatus as pretreatment for film formation so that impurities such as hydrogen and moisture adsorbed to the substrate 400 are desorbed and evacuated. Note that as an evacuation unit, a cryopump is preferably provided in the preheating chamber. Note also that this preheating treatment can be omitted in some cases. Further, this preheating may be similarly performed on the substrate 400 over which layers up to the source electrode layer 405a and the drain electrode layer 405b have been formed, before the formation of the insulating layer 407.

Then, an oxide semiconductor film is formed to a thickness of 2 nm to 200 nm inclusive over the gate insulating layer 402.

Note that before the oxide semiconductor film is formed by a sputtering method, dust on a surface of the gate insulating layer 402 is preferably removed by reverse sputtering in which an argon gas is introduced and plasma is generated. The reverse sputtering refers to a method in which, without application of a voltage to a target side, an RF power source is used for application of a voltage to a substrate side in an argon atmosphere so that plasma is generated in the vicinity of the substrate to modify a surface. Note that instead of an argon atmosphere, a nitrogen atmosphere, a helium atmosphere, an oxygen atmosphere, or the like may be used.

The oxide semiconductor film is formed by a sputtering method. As the oxide semiconductor film, any of the following oxide semiconductor films can be used: a four-component metal oxide such as an In—Sn—Ga—Zn—O film; a three-component metal oxide such as an In—Ga—Zn—O film, an In—Sn—Zn—O film, an In—Al—Zn—O film, a Sn—Ga—Zn—O film, an Al—Ga—Zn—O film, and a Sn—Al—Zn—O film; a two-component metal oxide such as an In—Zn—O film, a Sn—Zn—O film, an Al—Zn—O film, a Zn—Mg—O film, a Sn—Mg—O film, or an In—Mg—O film; an In—O film; a Sn—O film; a Zn—O film; or the like. In this embodiment, the oxide semiconductor film is formed by a sputtering method with the use of an In—Ga—Zn—O-based oxide semiconductor film formation target. The oxide semiconductor film can be formed by a sputtering method in a rare gas (typically, argon) atmosphere, an oxygen atmosphere, or an atmosphere of a rare gas (typically, argon) and oxygen. In the case of using a sputtering method, a target including $SiO_2$ at 2 wt % to 10 wt % inclusive may be used for film formation.

As a sputtering gas used for formation of the oxide semiconductor film, a high-purity gas is preferably used, in which impurities such as hydrogen, water, hydroxyl, or hydride are reduced to such a degree that the impurity concentration level is represented by the unit "ppm" or "ppb".

As a target for forming the oxide semiconductor film by a sputtering method, a target of metal oxide which contains zinc oxide as its main component can be used. As another example of the metal oxide target, an oxide semiconductor film formation target containing In, Ga, and Zn (with a composition ratio of $In_2O_3$:$Ga_2O_3$:ZnO=1:1:1 [molar ratio], In:Ga:Zn=1:1:0.5 [atomic ratio]) can be used. As the oxide semiconductor film formation target containing In, Ga, and Zn, a target with a composition ratio of In:Ga:Zn=1:1:1 [atomic ratio] or In:Ga:Zn=1:1:2 [atomic ratio] can be used. The fill rate of the oxide semiconductor film formation target is 90% to 100% inclusive, preferably, 95% to 99.9% inclusive. By using an oxide semiconductor film formation target with high filling rate, the formed oxide semiconductor film becomes a dense film.

The substrate is held in a treatment chamber kept in reduced pressure, and the substrate temperature is set to 100° C. to 600° C. inclusive, preferably 200° C. to 400° C. inclusive. Film formation is performed while the substrate is heated, whereby the concentration of impurities contained in the oxide semiconductor film formed can be reduced. In addition, damage by sputtering can be reduced. While moisture remaining in the treatment chamber is removed, a sputtering gas from which hydrogen and moisture are removed is introduced to form the oxide semiconductor film over the substrate 400 using metal oxide as a target. In order to remove remaining moisture in the treatment chamber, a sorption vacuum pump is preferably used. For example, a cryopump, an ion pump, or a titanium sublimation pump is preferably used. The evacuation unit can be a turbo pump provided with a cold trap. From a deposition chamber in which evacuation is performed with the use of cryopump, for example, hydrogen atoms, compounds including hydrogen atoms such as water ($H_2O$) (still preferably, compounds including carbon atoms as well), or the like are evacuated; therefore, the concentration of impurities contained in the oxide semiconductor film which is formed in the deposition chamber can be reduced.

In the case where the oxide semiconductor film is formed, an evacuation unit such as a cryopump is preferably used in order to prevent incorporation of remaining moisture as an impurity in treatment chambers (needless to say, including the treatment chamber for forming the oxide semiconductor film) in steps before and after formation of films in contact with the oxide semiconductor film and steps before and after formation of the oxide semiconductor film.

As an example of the film formation condition, the distance between the substrate and the target is 100 mm, the pressure is 0.6 Pa, the direct-current (DC) power source is 0.5 kW, and the atmosphere is an oxygen (the proportion of the oxygen flow rate is 100%) atmosphere. It is preferable that a pulsed direct-current (DC) power source be used because powder substances (also referred to as particles or dust) can be reduced and the film thickness can be uniform. The thickness of the oxide semiconductor film is preferably 5 nm to 30 nm inclusive. Since appropriate thickness depends on an oxide semiconductor material used, the thickness can be determined as appropriate depending on the material.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a film formation method using a sputtering method, a reactive sputtering method in which a target substance and a sputtering gas component are chemically reacted with each other during film formation to form a thin compound film thereof, or a bias sputtering method in which a voltage is also applied to a substrate during film formation can be used.

The oxide semiconductor film is then processed into an island-shaped oxide semiconductor layer 430 by a photolithography step (see FIG. 1A). A resist mask for forming the island-shaped oxide semiconductor layer 430 may be formed using an inkjet method. Formation of the resist mask by an inkjet method needs no photomask; thus, manufacturing cost can be reduced.

Note that the etching of the oxide semiconductor film may be dry etching, without limitation to wet etching.

The etching conditions (such as an etchant, etching time, and temperature) are appropriately adjusted depending on the material so that the material can be etched into a desired shape.

In the case of forming a contact hole in the gate insulating layer 402, the step may be performed in forming the oxide semiconductor layer 430.

In order to reduce impurities such as hydrogen, moisture, hydroxyl, or hydride, heat treatment (heat treatment for dehydration or dehydrogenation, which is also referred to as first heat treatment) is performed on the oxide semiconductor layer 430 at 200° C. to 700° C. (or the strain point of the substrate), preferably at 350° C. to 700° C., still preferably 450° C. to 700° C. in a nitrogen atmosphere or an inert gas atmosphere such as a rare gas (e.g., argon or helium) or under reduced pressure. Thus, moisture contained in the oxide semiconductor layer is reduced.

Next, the oxide semiconductor layer is cooled in an atmosphere of oxygen, an atmosphere of oxygen and nitrogen, or the air (having a dew point of preferably lower than or equal to −40° C., still preferably lower than or equal to −50° C.) atmosphere. In such a manner, a highly purified i-type (intrinsic) oxide semiconductor layer is obtained. Thus, a highly purified oxide semiconductor film which is electrically i-type (intrinsic) is obtained. In this manner, the oxide semiconductor layer 403 is formed (see FIG. 1B).

Adsorption energy of oxygen to a surface of oxide semiconductor (IGZO) was calculated by the first-principles calculation. Note that CASTEP, software of first-principles calculation produced by Accelrys Software Inc., was used for the first-principles calculation. The adsorption energy ($E_{ad}$) is determined by subtracting internal energy of IGZO to which $O_2$ is adsorbed from the sum of internal energy of $O_2$ and internal energy of IGZO ($E(O_2)+E(IGZO)$), i.e., the adsorption energy ($E_{ad}$) is defined as $E_{ad}=(E(O_2)+E(IGZO))-E(IGZO$ to which $O_2$ is adsorbed). The result of the calculation reveals that the adsorption of oxygen is an exothermal reaction and the exothermic energy is 1.46 eV.

When a hydrogen molecule exists, an oxidation reaction between the hydrogen molecule and an oxygen molecule, i.e., an oxidation reaction expressed as "$2H_2+O_2 \rightarrow 2H_2O$" might occur due to heat treatment for dehydration or dehydrogenation. If the energy obtained by the adsorption of oxygen is used for the oxidation reaction and the oxidation reaction thus occurs, there is a concern that $H_2$ cannot leave IGZO and might remain in IGZO. Therefore, sufficient dehydration or dehydrogenation treatment cannot be performed on IGZO.

Therefore, in order to prevent the reaction which produces water, it is preferable that a highly purified oxide semiconductor layer which is electrically i-type be formed through the following procedure: dehydration or dehydrogenation treatment is performed on an oxide semiconductor layer by heat treatment in a nitrogen atmosphere or an inert gas atmosphere such as a rare gas (e.g., argon or helium) or under reduced pressure, and then, cooling is performed in an atmosphere of oxygen or the air (having a dew point of preferably lower than or equal to −40° C., still preferably lower than or equal to −50° C.) atmosphere to supply oxygen which is a main component of an oxide semiconductor.

In this embodiment, the substrate is introduced into an electric furnace which is a kind of heat treatment apparatuses, heat treatment is performed on the oxide semiconductor layer at 450° C. in a nitrogen atmosphere for one hour, and cooling is performed in an oxygen atmosphere.

A feature of the present invention is to subject an oxide semiconductor layer to heat treatment for dehydration or dehydrogenation treatment in a nitrogen atmosphere or an inert gas atmosphere such as a rare gas (e.g., argon or helium) or under reduced pressure and to a cooling step for treatment for supplying oxygen in an atmosphere of oxygen, an atmosphere of oxygen and nitrogen, or the air (having a dew point of preferably lower than or equal to −40° C., still preferably lower than or equal to −50° C.) atmosphere.

The temperature states of an oxide semiconductor layer (and a substrate) in the dehydration or dehydrogenation treatment and the treatment for supplying oxygen are a rising state, a constant state, and a dropping state. The gas (atmosphere) may be switched from nitrogen or an inert gas such as a rare gas (e.g., argon or helium) to oxygen, both oxygen and nitrogen, or the air (having a dew point of preferably lower than or equal to −40° C., still preferably lower than or equal to −50° C.) at any of the following timings: at the time when the temperature of the oxide semiconductor layer is in a constant state, at the time when the temperature drop of the oxide semiconductor layer is started, and at the time when the temperature of the oxide semiconductor layer is in a dropping state.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, the heat treatment for dehydration or dehydrogenation can employ GRTA, in which the substrate is moved into an inert gas heated to a high temperature of 650° C. to 700° C., and heated for several minutes there, and then the substrate is moved out of the inert gas heated to a high temperature. With GRTA, high-temperature heat treatment for a short period of time can be achieved.

Note that it is preferable that in the heat treatment for dehydration or dehydrogenation treatment, impurities such as hydrogen, moisture, hydroxyl, or hydride be not contained in nitrogen or an inert gas such as helium, neon, or argon. It is preferable that the purity of nitrogen or the rare gas such as helium, neon, or argon which is introduced into a heat treatment apparatus be 6N (99.9999%) or higher, preferably 7N (99.99999%) or higher (that is, the impurity concentration is 1 ppm or lower, preferably 0.1 ppm or lower).

Here, a heating method using an electric furnace 601 is described with reference to FIG. 3 as one mode of heating treatment of the oxide semiconductor layer 430.

Figure 3:
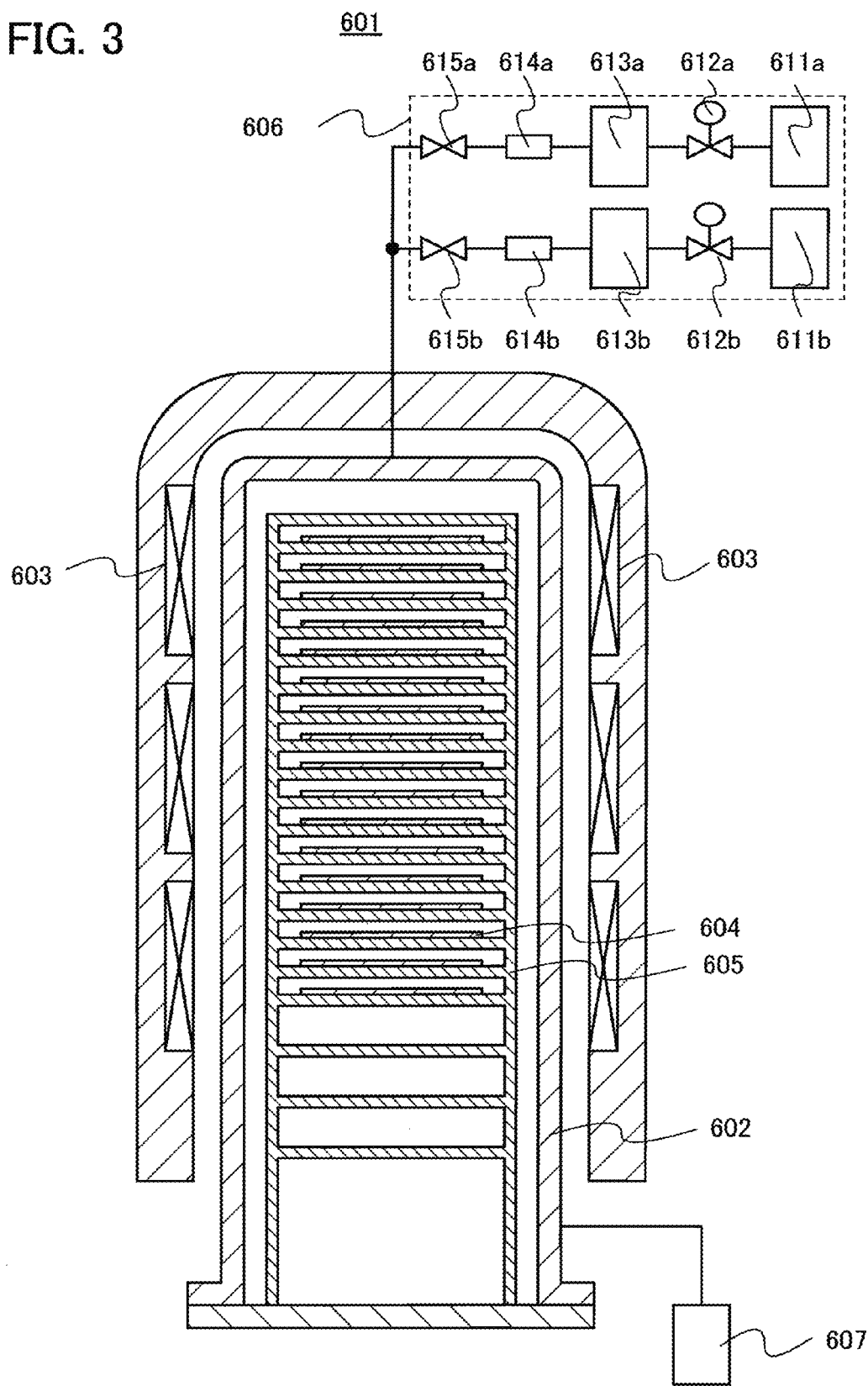
FIG. 3 is a cross-sectional view of an electric furnace used in an embodiment of the present invention.
Figure 4:
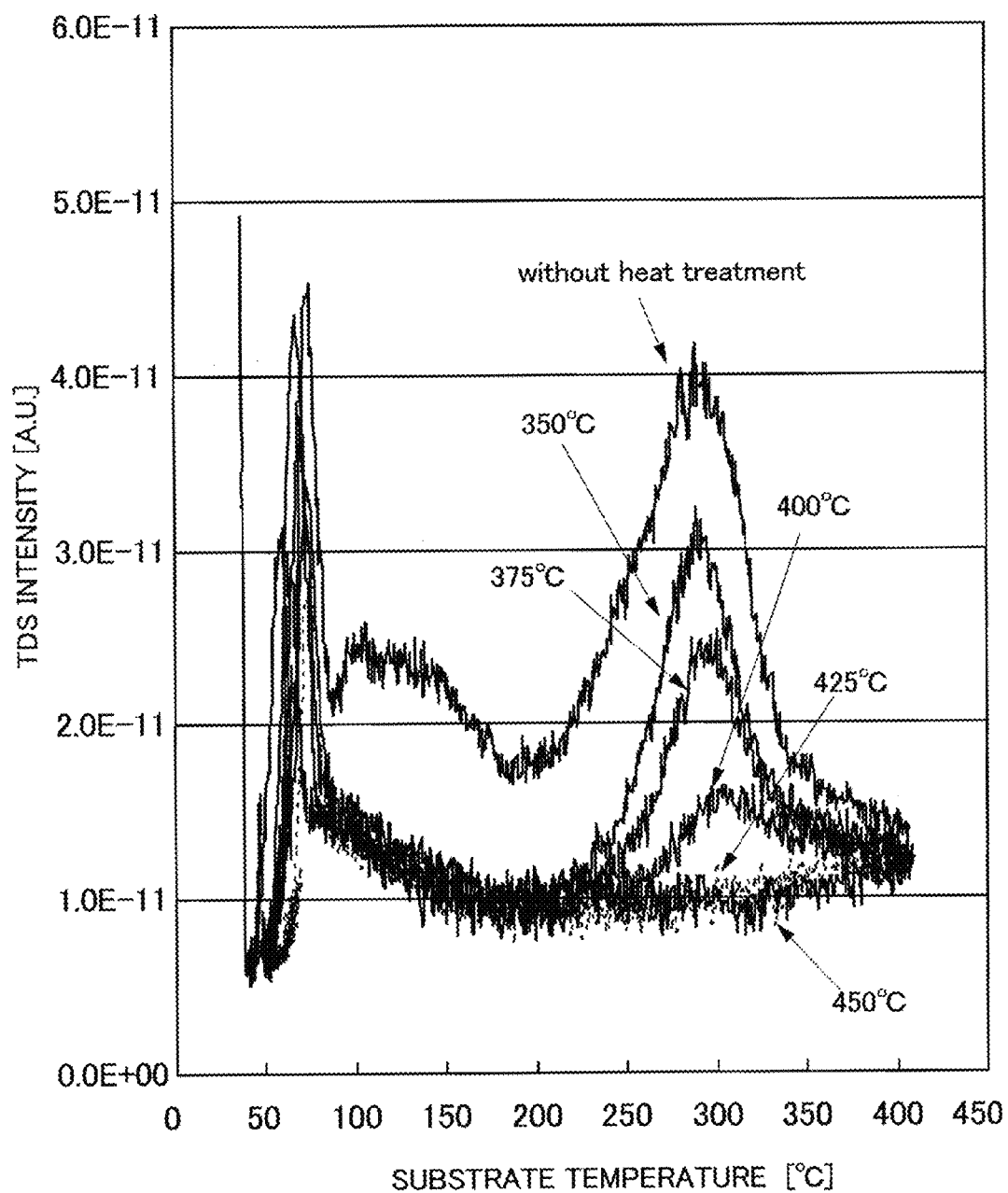
FIG. 4 is a graph illustrating TDS measurement results.
Figure 5:
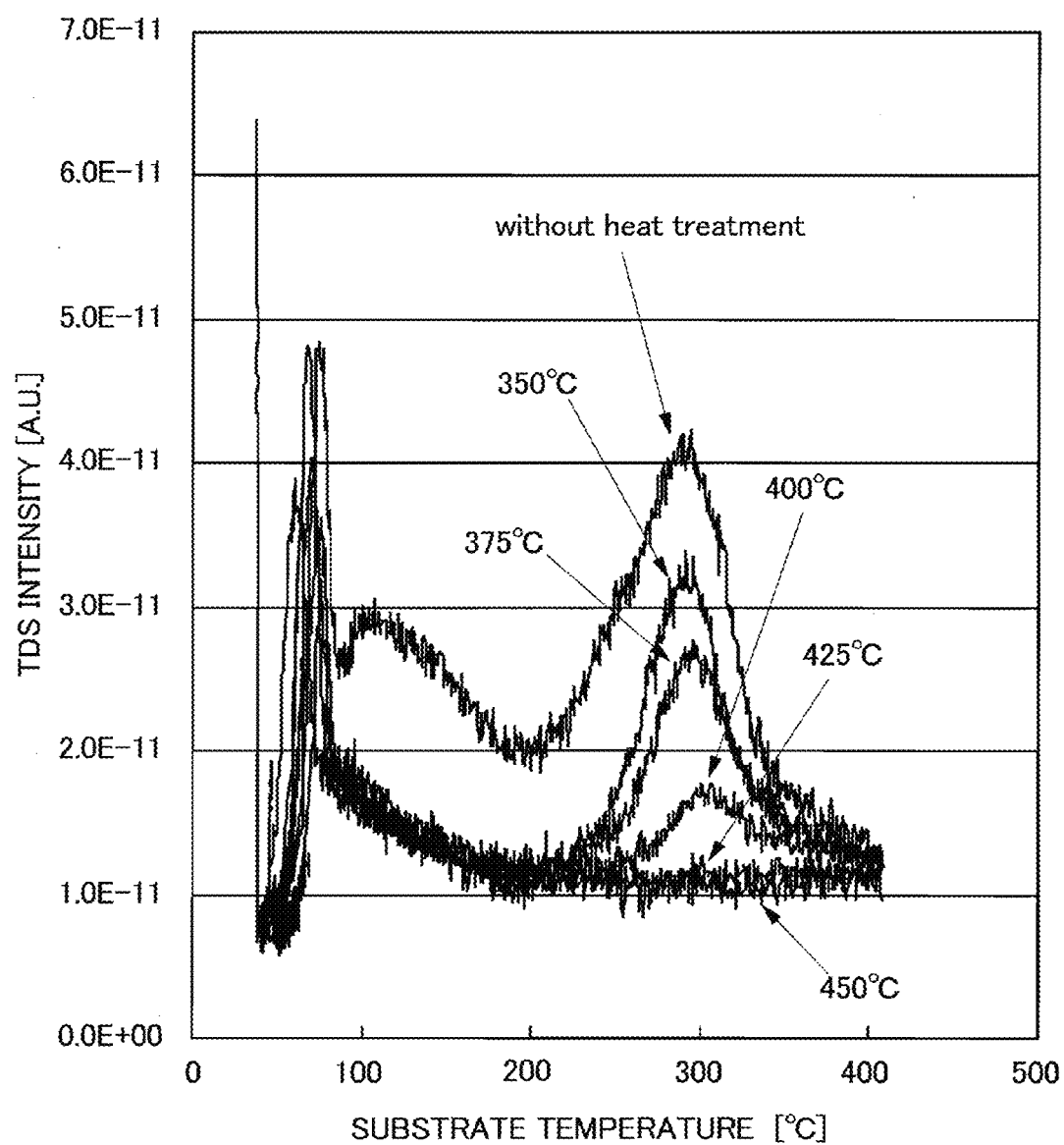
FIG. 5 is a graph illustrating TDS measurement results.
Figure 6:
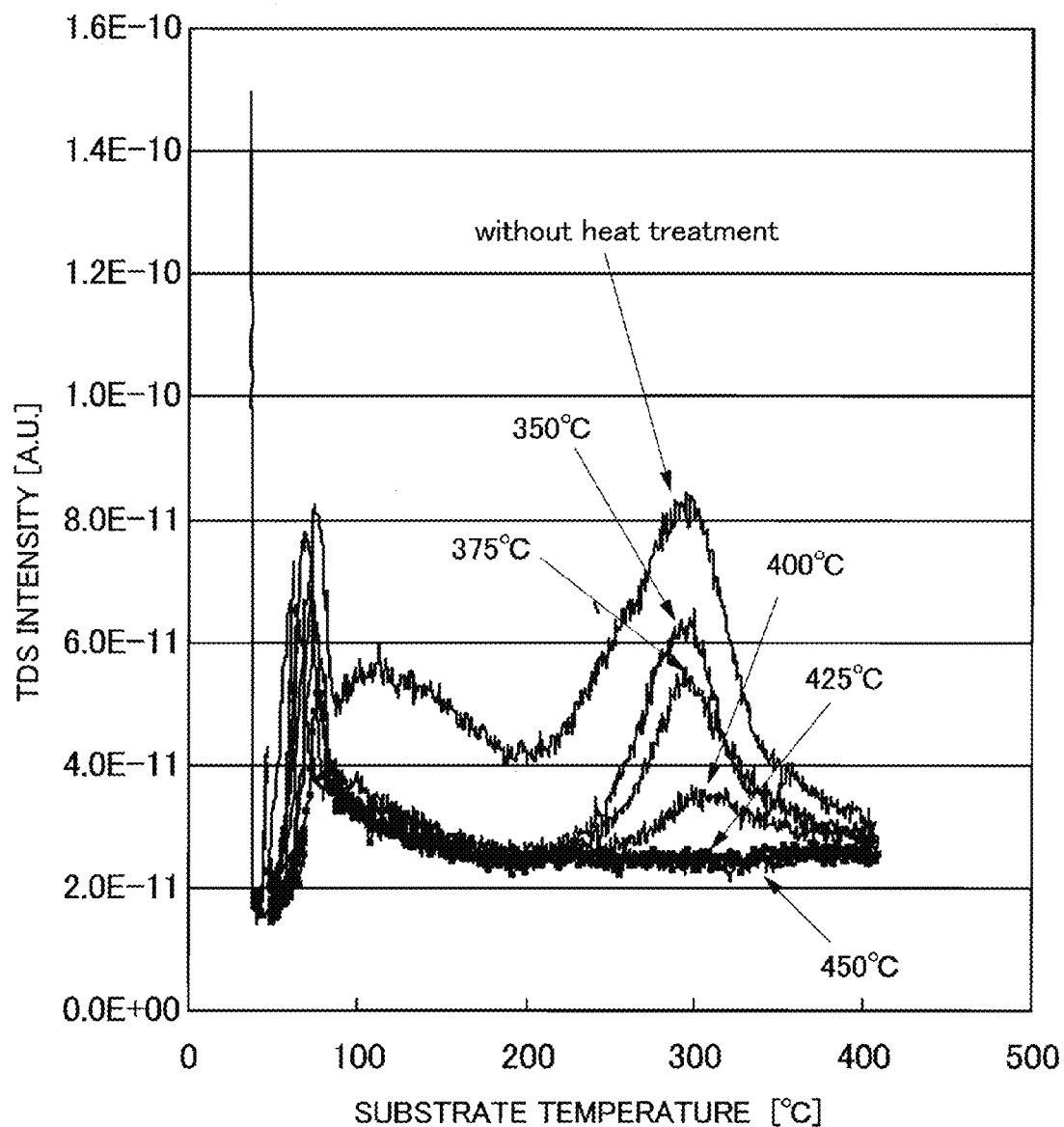
FIG. 6 is a graph illustrating TDS measurement results.
Figure 7:
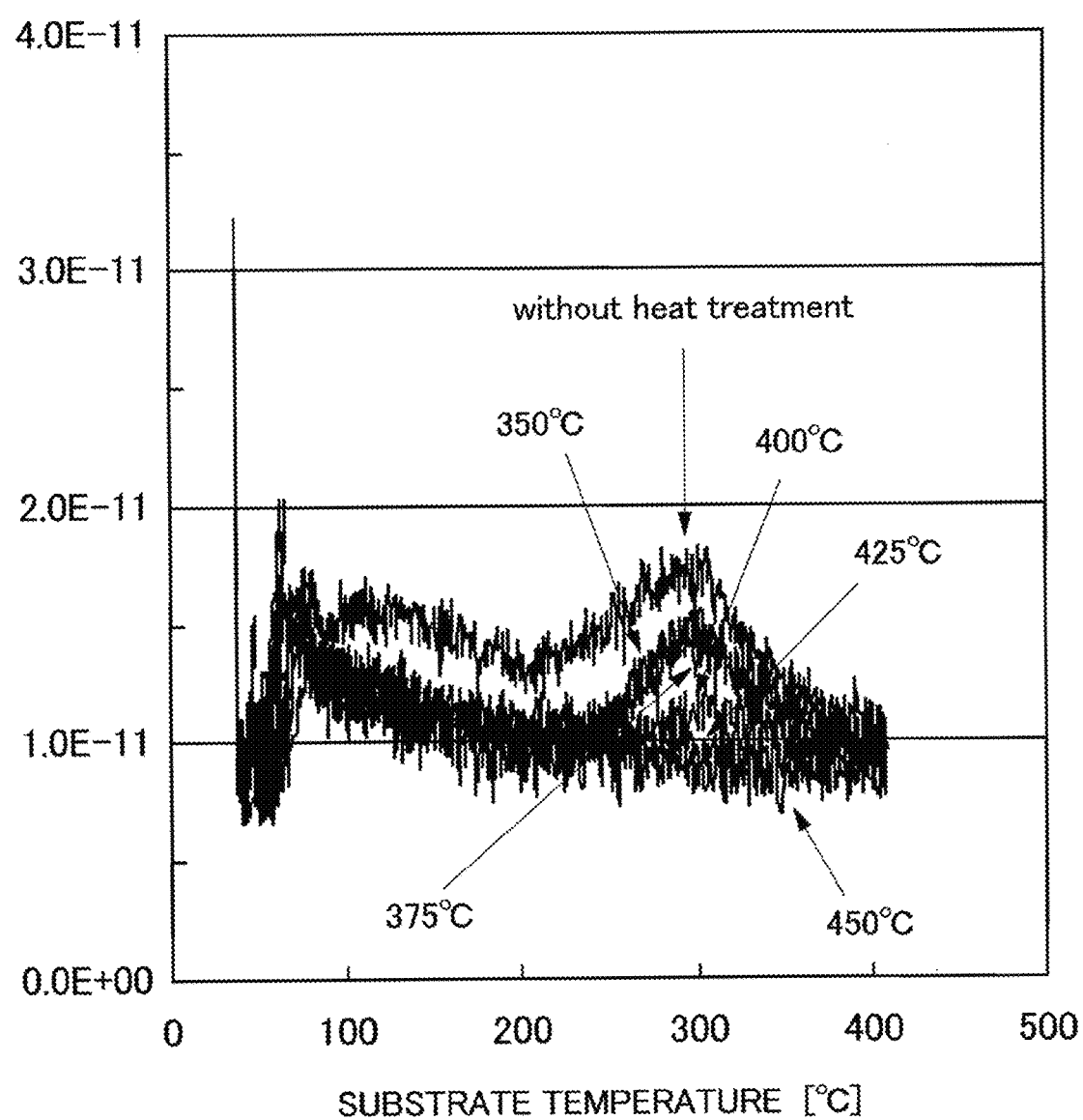
FIG. 7 is a graph illustrating TDS measurement results.

FIG. 3 is a schematic view of an electric furnace 601. Heaters 603 are provided outside a chamber 602 and heat the chamber 602. Inside the chamber 602, a susceptor 605 in which a substrate 604 is set is provided. The substrate 604 is transferred to/from the chamber 602. In addition, the chamber 602 is provided with a gas supply unit 606 and an evacuation unit 607. With the gas supply unit 606, a gas is introduced into the chamber 602. The evacuation unit 607 evacuates the inside of the chamber 602 or reduces the pressure in the chamber 602. Note that the temperature rising characteristics of the electric furnace 601 is preferably set to from 0.1° C./min to 20° C./min. The temperature decreasing characteristics of the electric furnace 601 is preferably set to from 0.1° C./min to 15° C./min.

The gas supply unit 606 includes a gas supply source 611a, a gas supply source 611b, a pressure adjusting valve 612a, a pressure adjusting valve 612b, a refining apparatus 613a, a refining apparatus 613b, a mass flow controller 614a, a mass flow controller 614b, a stop valve 615a, and a stop valve 615b. In this embodiment, it is preferable that the refining apparatus 613a and the refining apparatus 613b be provided between the gas supply sources 611a and 611b and the chamber 602. With the refining apparatus 613a and the refining apparatus 613b, impurities such as hydrogen, moisture, hydroxyl, or hydride in a gas which is introduced into the chamber 602 from the gas supply source 611a and the gas supply source 611b can be removed by the refining apparatus 613a and the refining apparatus 613b, so that entry of impurities such as hydrogen, moisture, hydroxyl, or hydride into the chamber 602 can be suppressed.

In this embodiment, nitrogen or a rare gas is introduced into the chamber 602 from the gas supply source 611a and the gas supply source 611b, so that the inside of the chamber is set to nitrogen or rare gas atmosphere. In the chamber 602 heated to a temperature of 200° C. to 700° C. (or the strain point of the substrate 604), preferably 350° C. to 700° C., still preferably 450° C. to 700° C., the oxide semiconductor layer 430 formed over the substrate 604 is heated, whereby the oxide semiconductor layer 430 can be dehydrated or dehydrogenated.

Alternatively, the chamber 602 in which the pressure is reduced by the evacuation unit is heated at 200° C. to 700° C. (or the strain point of the substrate 604), preferably at 350° C. to 700° C., still preferably at 450° C. to 700° C. In such a chamber 602, the oxide semiconductor layer 430 formed over the substrate 604 is heated, whereby the oxide semiconductor layer 430 can be subjected to dehydration or dehydrogenation.

Next, introduction of nitrogen or a rare gas from the gas supply source 611a into the chamber 602 is stopped, and the heaters are turned off. Then, oxygen or both oxygen and nitrogen is/are introduced from the gas supply source 611b into the chamber 602 and the chamber 602 of the heating apparatus is slowly cooled. That is, the inside of the chamber 602 is set to an oxygen atmosphere and the substrate 604 is slowly cooled. Here, it is preferable that the oxygen introduced from the gas supply source 611b into the chamber 602 do not contain impurities such as water and hydrogen. In addition, it is preferable that the purity of the oxygen introduced from the gas supply source 611b into the chamber 602 be 6N (99.9999%) or lower, preferably 7N (99.99999%) (that is, an impurity concentration in the oxygen is 1 ppm, preferably 0.1 ppm) or lower.

Although cooling may be performed on the oxide semiconductor layer in the air atmosphere instead of an atmosphere of oxygen or an atmosphere of oxygen and nitrogen, it is preferable that impurities such as water and hydrogen be not contained in the air introduced into the chamber 602, and ultra-dry air having a dew point of preferably lower than or equal to −40° C., still preferably lower than or equal to −50° C., is used.

The oxide semiconductor layer is heated to be subjected to dehydration or dehydrogenation, and the heated oxide semiconductor layer is cooled in an atmosphere of oxygen, an atmosphere of oxygen and nitrogen, or the air (having a dew point of preferably lower than or equal to −40° C., still preferably lower than or equal to −50° C.) atmosphere. Thus, a highly purified oxide semiconductor film which is electrically i-type (intrinsic) is obtained. In this manner, the oxide semiconductor layer 403 can be formed.

Note that the timing of turning off the heaters for heating the chamber 602 may be the same as the timing of switching between nitrogen or a rare gas and oxygen, both oxygen and nitrogen, or the air atmosphere. The timing of switching between nitrogen or a rare gas and oxygen, both oxygen and nitrogen, or the air atmosphere may be either earlier or later than the timing of turning off the heaters as long as the switching is performed after the dehydration or dehydrogenation treatment.

As a result, reliability of the thin film transistor completed later can be improved.

Note that in the case of performing heat treatment under reduced pressure, oxygen, both oxygen and nitrogen, or the air atmosphere (ultra-dry air) may be introduced into the chamber 602 after the heat treatment, pressure may be returned to atmospheric pressure, and then cooling may be performed.

In addition, when oxygen is introduced from the gas supply source 611b into the chamber 602, one of or both nitrogen and a rare gas such as helium, neon, or argon may be introduced into the chamber 602.

If the heating apparatus has a multi-chamber structure, the heat treatment and the cooling treatment can be performed in different chambers. Typically, the oxide semiconductor layer over the substrate is heated in a first chamber, which is filled with nitrogen or a rare gas and heated at 200° C. to 700° C. (or the strain point of the substrate 604), preferably 350° C. to 700° C., still preferably 450° C. to 700° C. Next, through a transfer chamber into which nitrogen or a rare gas is introduced, the substrate which has been subjected to the heat treatment is moved into a second chamber which is filled with oxygen, both oxygen and nitrogen, or the air atmosphere (ultra-dry air), and cooling treatment is performed. Through the steps, throughput can be increased.

Further, treatment for supplying oxygen and heat treatment for dehydration or dehydrogenation treatment of the oxide semiconductor layer may be performed on the oxide semiconductor film which has not been processed into an island-shaped oxide semiconductor layer. In that case, after the heat treatment for dehydration or dehydrogenation treatment and the treatment for supplying oxygen, the substrate is taken out from the treatment apparatus and a photolithography step is performed.

The heat treatment having an effect of dehydration or dehydrogenation on the oxide semiconductor layer may be performed at any of the following timings: after the oxide semiconductor layer is formed; and after a source electrode and a drain electrode are stackedover the oxide semiconductor layer.

Further, in the case of forming a contact hole in the gate insulating layer 402, the step may be performed either before or after the dehydration or dehydrogenation treatment is performed on the oxide semiconductor layer 430.

Next, a conductive film to be a source electrode layer and a drain electrode layer (including a wiring formed in the same layer as the source electrode layer and the drain electrode layer) is formed over the gate insulating layer 402 and the oxide semiconductor layer 403. The conductive film may be formed by a sputtering method or a vacuum evaporation method. As a material for the conductive film to be the source electrode layer and the drain electrode layer (including the wiring formed in the same layer as the source electrode layer and the drain electrode layer), an element selected from Al, Cr, Cu, Ta, Ti, Mo, or W, an alloy containing any of these elements as a component, an alloy film containing any of these elements in combination, or the like can be given. Further, a layer of refractory metal such as Cr, Ta, Ti, Mo, or W may be stacked on one of or both sides of a metal layer such as Al or Cu. Furthermore, an Al material to which an element for preventing generation of hillocks or whisker in an Al film, such as Si, Ti, Ta, W, Mo, Cr, Nd, Sc, or Y is added may be used, leading to improvement in heat resistance.

The conductive film may have a single-layer structure or a layered structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in the order presented, and the like can be given.

Alternatively, the conductive film to be the source electrode layer and the drain electrode layer (including the wiring formed in the same layer as the source electrode layer and the drain electrode layer) may be formed using a conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or any of the metal oxide materials containing silicon or silicon oxide can be used.

In the case where heat treatment is performed after the formation of the conductive film, it is preferable that the conductive film have heat resistance high enough to withstand the heat treatment.

A resist mask is formed over the conductive film by a photolithography step. Etching is selectively performed, so that the source electrode layer 405a and the drain electrode layer 405b are formed. Then, the resist mask is removed (see FIG. 1C).

Ultraviolet, a KrF laser beam, or an ArF laser beam is used for light exposure for forming the resist mask in the photolithography step. A channel length L of the thin film transistor to be formed later depends on a width of a distance between a bottom portion of the source electrode layer and a bottom portion of the drain electrode layer which are adjacent to each other over the oxide semiconductor layer 403. Note that when light exposure is performed in the case where the channel length L is shorter than 25 nm, extreme ultraviolet with extremely short wavelengths of several nanometers to several tens of nanometers is used for light exposure for forming the resist mask in the photolithography step. Light exposure with extreme ultraviolet leads to a high resolution and a large depth of field. Accordingly, the channel length L of the thin film transistor to be formed later can be set to 10 nm to 1000 nm inclusive. Thus, the operation speed of a circuit can be increased, and further, an off-state current is significantly small, so that low power consumption can be achieved.

Note that each material and etching conditions are adjusted as appropriate so that the oxide semiconductor layer 403 is not removed when the conductive film is etched.

In this embodiment, the Ti film is used as the conductive film; the In—Ga—Zn—O-based oxide semiconductor is used as the oxide semiconductor layer 403; and an ammonia peroxide mixture (hydrogen peroxide water at 31 wt %: ammonia water at 28 wt %: water=5:2:2) is used as an etchant.

Note that in the photolithography step, in some cases, part of the oxide semiconductor layer 403 is etched, whereby an oxide semiconductor layer having a groove (a depression portion) may be formed. Further, a resist mask used for forming the source electrode layer 405a and the drain electrode layer 405b may be formed by an inkjet method. Formation of the resist mask by an inkjet method needs no photomask; thus, manufacturing cost can be reduced.

Further, an oxide conductive layer may be formed between the oxide semiconductor layer, and the source electrode layer and the drain electrode layer. The oxide conductive layer and the metal layer for forming the source electrode layer and the drain electrode layer can be formed successively. The oxide conductive layer can function as a source region and a drain region.

When the oxide conductive layer is provided as the source region and the drain region between the oxide semiconductor layer and the source and drain electrode layers, the source region and the drain region can have lower resistance and the transistor can operate at high speed.

In order to reduce the number of photomasks used in a photolithography step and reduce the number of photolithography steps, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

With plasma treatment with a gas such as $N_2O$, $N_2$, or Ar, water adsorbed to a surface of an exposed portion of the oxide semiconductor layer may be removed. Plasma treatment may be performed using a mixture gas of oxygen and argon as well.

Next, the insulating layer 407 serving as a protective insulating film is formed in contact with part of the oxide semiconductor layer 403.

The insulating layer 407 can be formed to a thickness of at least 1 nm using a method by which impurities such as water or hydrogen does not enter the insulating layer 407, such as a sputtering method as appropriate. When hydrogen is contained in the insulating layer 407, entry of the hydrogen to the oxide semiconductor layer or extraction of oxygen in the oxide semiconductor layer by the hydrogen is caused, thereby making the resistance of the backchannel of the oxide semiconductor layer low (to have an n-type conductivity), so that a parasitic channel might be formed. Therefore, it is important that a film formation method in which hydrogen be not used is employed in order to form the insulating layer 407 containing as little hydrogen as possible.

In this embodiment, a 200-nm-thick silicon oxide film is formed as the insulating layer 407 by a sputtering method. The substrate temperature in the film formation may be higher than or equal to a room temperature and lower than or equal to 300° C. and in this embodiment, is 100° C. The formation of a silicon oxide film by a sputtering method can be performed in a rare gas (typically, argon) atmosphere, an oxygen atmosphere, or an atmosphere of a rare gas (typically, argon) and oxygen. As a target, a silicon oxide target or a silicon target may be used. For example, with the use of a silicon target, silicon oxide can be formed by a sputtering method in an atmosphere of oxygen and nitrogen. As the insulating layer 407, an inorganic insulating film which does not contain impurities such as moisture, a hydrogen ion, and OH$^-$ is used. Typically, a silicon oxide film, a silicon oxynitride film, an aluminum oxide film, an aluminum oxynitride film, or the like is used.

In that case, the insulating layer 407 is preferably formed removing moisture remaining in the treatment chamber. This is for preventing hydrogen, hydroxyl, or moisture from being contained in the oxide semiconductor layer 403 and the insulating layer 407.

In order to remove remaining moisture in the treatment chamber, a sorption vacuum pump is preferably used. For example, a cryopump, an ion pump, or a titanium sublimation pump is preferably used. The evacuation unit can be a turbo pump provided with a cold trap. From a deposition chamber in which evacuation is performed with the use of the cryopump, hydrogen atoms, compounds containing hydrogen atoms, such as water ($H_2O$), or the like are evacuated; therefore, the concentration of impurities contained in the insulating layer 407 which is formed in the deposition chamber can be reduced.

As a sputtering gas used for formation of the insulating layer 407, a high-purity gas is preferably used, in which impurities such as hydrogen, water, hydroxyl, or hydride are reduced to such a degree that the impurity concentration level is represented by the unit "ppm" or "ppb".

Next, heat treatment (second heat treatment) may be performed in an inert gas atmosphere or an oxygen gas atmosphere (preferably at 200° C. to 400° C. inclusive, for example 250° C. to 350° C. inclusive). For example, the heat treatment is performed at 250° C. in a nitrogen atmosphere for one hour. The heat treatment performs heating while part (a channel formation region) of the oxide semiconductor layer is in contact with the insulating layer 407.

Through the aforementioned process, is formed the thin film transistor 470 including the oxide semiconductor layer 403, which has been subjected to heat treatment performed as dehydration or dehydrogenation treatment in a nitrogen atmosphere or an inert gas atmosphere, or under reduced pressure to reduce impurities such as hydrogen, moisture, hydroxyl, or hydride in a film and then subjected to cooling performed as treatment for supplying oxygen in an atmosphere of oxygen, an atmosphere of oxygen and nitrogen, or the air (having a dew point of preferably lower than or equal to −40° C., still preferably lower than or equal to −50° C.) atmosphere.

When a silicon oxide layer having a lot of defects is used as the insulating layer, with the heat treatment which is performed after the formation of the silicon oxide layer, impurities such as hydrogen, moisture, hydroxyl, or hydride contained in the oxide semiconductor layer can be diffused to the insulating layer so that impurities in the oxide semiconductor layer can be further reduced.

A protective insulating layer may be formed over the insulating layer 407. For example, a silicon nitride film is formed by an RF sputtering method. Since an RF sputtering method allows high productivity, it is preferably used as a film formation method of the protective insulating layer. As the protective insulating layer, an inorganic insulating film which does not contain impurities such as moisture, a hydrogen ion, and OH$^-$ and blocks the entry of these impurities from the outside is used; a silicon nitride film, an aluminum nitride film, a silicon nitride oxide film, an aluminum nitride oxide film, or the like is used. In this embodiment, the protective insulating layer 499 is formed using a silicon nitride film as the protective insulating layer (see FIG. 1D).

In this embodiment, as the protective insulating layer 499, a silicon nitride film is formed by heating the substrate 400 over which layers up to the insulating layer 407 are formed, to a temperature of 100° C. to 400° C., introducing a sputtering gas containing high-purity nitrogen from which hydrogen and moisture are removed, and using a target of silicon semiconductor. In this case, the protective insulating layer 499 is preferably formed removing moisture remaining in a treatment chamber, similarly to the insulating layer 407.

After the formation of the protective insulating layer, heat treatment may be further performed at 100° C. to 200° C. inclusive for one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature. Further, this heat treatment may be performed before the formation of the insulating layer under reduced pressure. Under the reduced pressure, the heat treatment time can be shortened.

Heat treatment for dehydration or dehydrogenation is performed on an oxide semiconductor layer, and thus, an oxide semiconductor layer is changed to an oxygen-deficient type, whereby an n-type (n⁻-type, n⁺¹-type, or the like) oxide semiconductor layer is obtained. The obtained oxide semiconductor layer is then cooled in an atmosphere of oxygen, an atmosphere of oxygen and nitrogen, or the air (having a dew point of preferably lower than or equal to −40° C., still preferably lower than or equal to −50° C.) atmosphere, whereby oxygen is supplied to the oxide semiconductor layer. Thus, the oxide semiconductor layer is highly purified, whereby an i-type oxide semiconductor layer is obtained. With the use of the thus obtained i-type oxide semiconductor layer, a semiconductor device including a highly reliable thin film transistor having excellent electric characteristics can be manufactured and provided.

(Embodiment 2)

A semiconductor device and a method for manufacturing the semiconductor device will be described with reference to FIGS. 8A to 8D and FIGS. 9A and 9B. The same portion as or a portion having a function similar to that described in Embodiment 1 can be formed in a manner similar to that described in Embodiment 1, and also the steps similar to those of Embodiment 1 can be performed in a manner similar to those described in Embodiment 1; therefore, repetitive description is omitted.

Figure 9A:
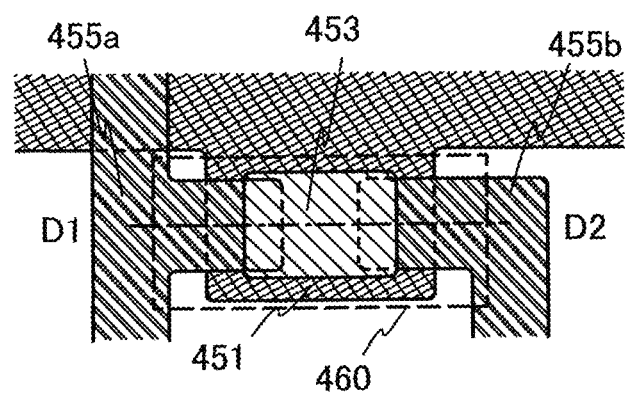
FIGS. 9A and 9B illustrate a semiconductor device of an embodiment of the present invention.
Figure 9B:
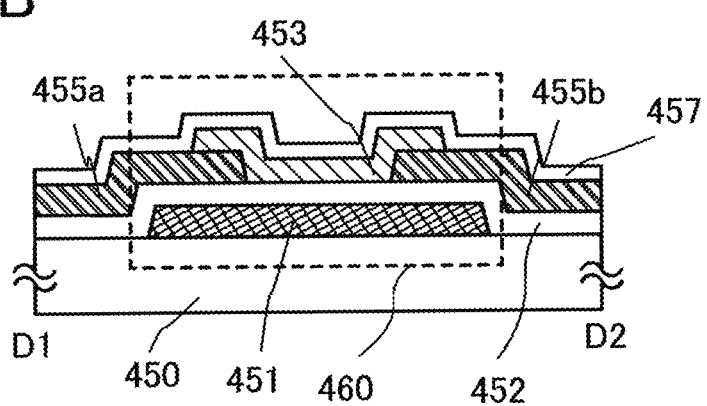
Figure 12:
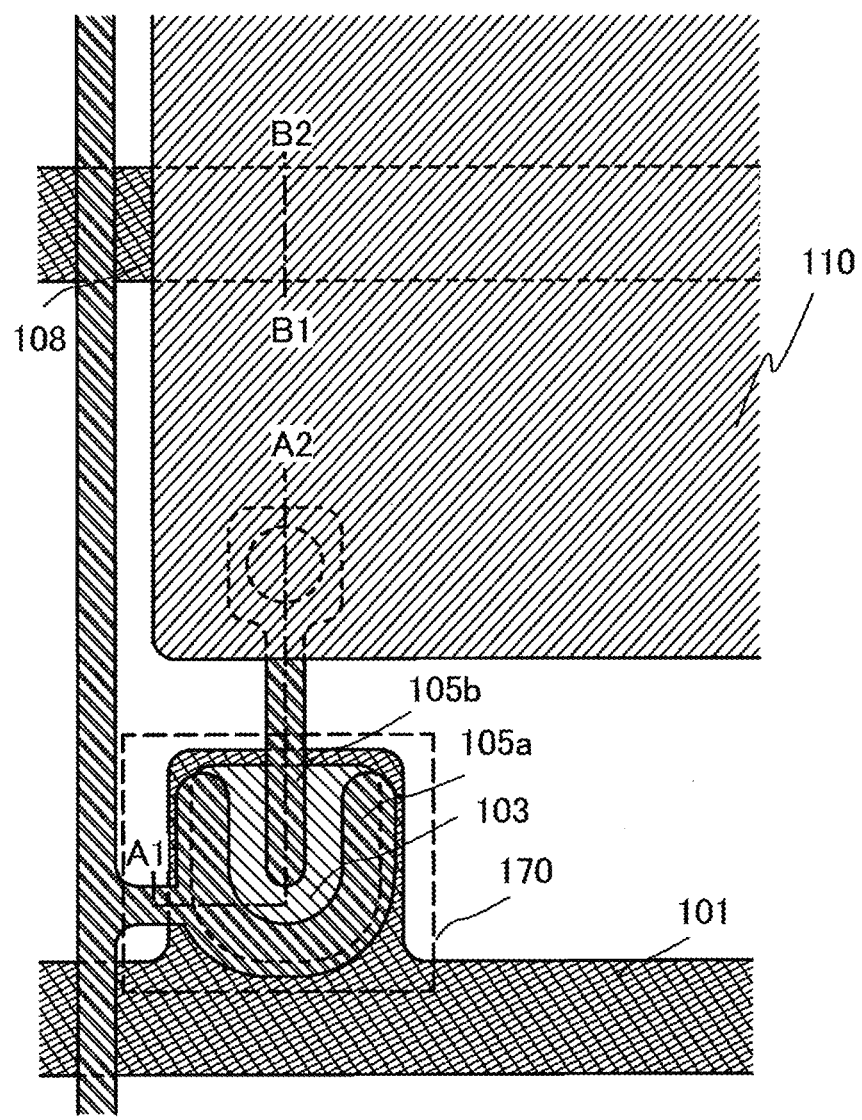
FIG. 12 illustrates a semiconductor device of an embodiment of the present invention.

FIG. 9A is a plan view of a thin film transistor 460 included in a semiconductor device, and FIG. 9B is a cross-sectional view along line D1-D2 of FIG. 9A. The thin film transistor 460 is a bottom-gate thin film transistor and includes, over a substrate 450 which is a substrate having an insulating surface, a gate electrode layer 451, a gate insulating layer 452, source or drain electrode layers 455a and 455b, and an oxide semiconductor layer 453. The thin film transistor 460 is covered with an insulating layer 457 which is in contact with the oxide semiconductor layer 453. An In—Ga—Zn—O-based film is used for the oxide semiconductor layer 453.

In the thin film transistor 460, the gate insulating layer 452 exists throughout the region including the thin film transistor 460, and the gate electrode layer 451 is provided between the gate insulating layer 452 and the substrate 450 which is a substrate having an insulating surface. Over the gate insulating layer 452, the source or drain electrode layers 455a and 455b are provided. Further, over the gate insulating layer 452 and the source or drain electrode layers 455a and 455b, the oxide semiconductor layer 453 is provided. In this embodiment, the source or drain electrode layers 455a and 455b extend beyond the periphery of the oxide semiconductor layer 453.

In order to suppress variation in electric characteristics of the thin film transistor 460, impurities such as hydrogen, moisture, hydroxyl, or hydride (also referred to as a hydrogen compound) which cause the variation are intentionally removed from an oxide semiconductor layer. In addition, oxygen which is a major component of an oxide semiconductor and is reduced in the step of removing impurities is supplied. Thus, a highly purified oxide semiconductor layer which is electrically i-type (intrinsic) is obtained. In this manner, the oxide semiconductor layer 453 is formed.

Therefore, it is preferable that hydrogen in the oxide semiconductor layer 453 be as less as possible. The concentration of hydrogen contained in the oxide semiconductor layer 453 is preferably set to $1\times10^{16}/cm^3$ or less, so that hydrogen contained in the oxide semiconductor layer 453 is removed as close to zero as possible.

Further, the number of carriers in the high-purity oxide semiconductor layer 453 is very small (close to zero), and the carrier concentration is less than $1\times10^{14}/cm^3$, preferably less than $1\times10^{12}/cm^3$, still preferably $1\times10^{11}/cm^3$ or less. Since the number of carriers in the oxide semiconductor layer 453 is so small that an off-state current can be reduced in the thin film transistor 460. The smaller the amount of off-state current is, the better. A current value per 1 μm in a channel width (w) of the thin film transistor 460 is 100 aA/μm or less, preferably 10 aA/μm or less, still preferably 1 aA/μm or less. Further, the thin film transistor 460 has no pn junction and is not deteriorated by hot carriers; thus, the electric characteristics of the thin film transistor 460 are not affected by the pn junction and the deterioration.

In order to reduce impurities such as hydrogen, moisture, hydroxyl, or hydride, after the formation of the oxide semiconductor layer, heat treatment (heat treatment for dehydration or dehydrogenation) is performed at 200° C. to 700° C., preferably at 350° C. to 700° C., still preferably at 450° C. to 700° C. in a nitrogen atmosphere or an inert gas atmosphere such as a rare gas (e.g., argon or helium) or under reduced pressure, in a state where the oxide semiconductor layer is exposed. Thus, moisture contained in the oxide semiconductor layer is reduced. Next, cooling is performed in an atmosphere of oxygen, an atmosphere of oxygen and nitrogen, or the air (ultra-dry air) (having a dew point of preferably lower than or equal to −40° C., still preferably lower than or equal to −50° C.) atmosphere.

As dehydration or dehydrogenation treatment, moisture contained in a film is reduced by heat treatment in a nitrogen atmosphere or an inert gas atmosphere, or under reduced pressure. Then, as treatment for supplying oxygen, cooling is performed in an atmosphere of oxygen, an atmosphere of oxygen and nitrogen, or the air (ultra-dry air) (having a dew point of preferably lower than or equal to −40° C., still preferably lower than or equal to −50° C.) atmosphere. With the use of the thus obtained oxide semiconductor layer 453, electric characteristics of the thin film transistor 460 are improved. Further, a thin film transistor with high performance, which can be mass-produced, can be achieved.

Further, impurities such as moisture which exist not only in the oxide semiconductor layer 453 but also in the gate insulating layer 452 and the interfaces between the oxide semiconductor layer 453 and the upper and lower films provided in contact therewith, which are specifically the interface between the oxide semiconductor layer 453 and the gate insulating layer 452 and the interface between the oxide semiconductor layer 453 and the insulating layer 457, are reduced.

FIGS. 8A to 8D are cross-sectional views illustrating a manufacturing process of the thin film transistor 460 illustrated in FIGS. 9A and 9B.

The gate electrode layer 451 is provided over the substrate 450 which is a substrate having an insulating surface. An insulating film serving as a base film may be provided between the substrate 450 and the gate electrode layer 451. The gate electrode layer 451 can be formed using a material similar to that of the gate electrode layer 401 described in Embodiment 1.

The gate insulating layer 452 is formed over the gate electrode layer 451. The gate insulating layer 452 can be formed in a manner similar to that of the gate insulating layer 402 described in Embodiment 1.

Figure 8A:
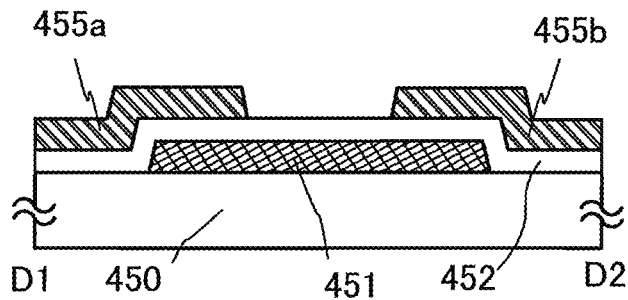
FIGS. 8A to 8D are cross-sectional views illustrating a manufacturing process of an embodiment of the present invention.
Figure 8B:
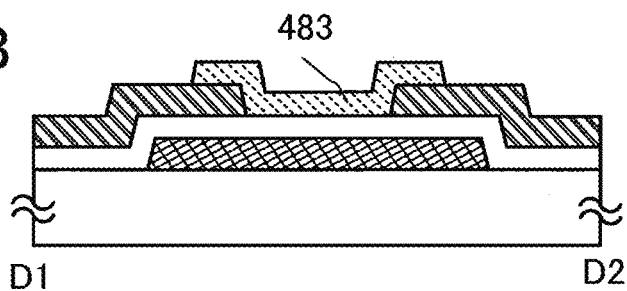
Figure 8C:
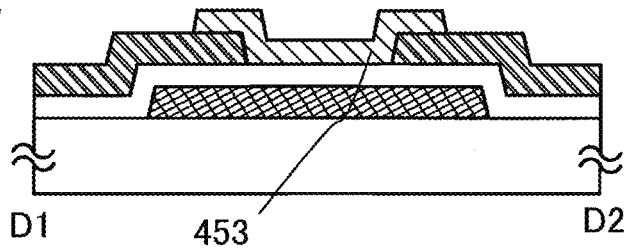

A conductive film is formed over the gate insulating layer 452 and processed into the island-shaped source or drain electrode layers 455a and 455b by a photolithography step (see FIG. 8A). The source or drain electrode layers 455a and 455b can be formed in a manner similar to that of the source electrode layer 405a and the drain electrode layer 405b described in Embodiment 1.

Then, an oxide semiconductor film is formed over the gate insulating layer 452 and the source or drain electrode layers 455a and 455b. In this embodiment, the oxide semiconductor film is formed by a sputtering method with the use of an In—Ga—Zn—O-based oxide semiconductor film formation target. The oxide semiconductor film is patterned into an island-shaped oxide semiconductor layer 483 by a photolithography step (see FIG. 8B).

In that case, the oxide semiconductor film is preferably formed removing moisture remaining in the treatment chamber. This is for preventing hydrogen, hydroxyl, or moisture from being contained in the oxide semiconductor film.

In order to remove remaining moisture in the treatment chamber, a sorption vacuum pump is preferably used. For example, a cryopump, an ion pump, or a titanium sublimation pump is preferably used. The evacuation unit can be a turbo pump provided with a cold trap. From a deposition chamber in which evacuation is performed with the use of the cryopump, hydrogen atoms, compounds containing hydrogen atoms, such as water ($H_2O$), or the like are evacuated; therefore, the concentration of impurities contained in the oxide semiconductor film which is formed in the deposition chamber can be reduced.

As a sputtering gas used for the formation of the oxide semiconductor film, a high-purity gas is preferably used, in which impurities such as hydrogen, water, hydroxyl, or hydride are reduced to such a degree that the impurity concentration level is represented by the unit "ppm" or "ppb".

Then, in order to reduce impurities such as hydrogen, moisture, hydroxyl, or hydride, heat treatment is performed on the oxide semiconductor layer 483 at 200° C. to 700° C., preferably at 350° C. to 700° C., still preferably at 450° C. to 700° C. in a nitrogen atmosphere or an inert gas atmosphere such as a rare gas (e.g., argon or helium) or under reduced pressure. Thus, moisture contained in the oxide semiconductor layer is reduced.

Next, the heated oxide semiconductor layer is cooled in an atmosphere of oxygen, an atmosphere of oxygen and nitrogen, or the air (having a dew point of preferably lower than or equal to −40° C., still preferably lower than or equal to −50° C.) atmosphere. Thus, a highly purified oxide semiconductor layer which is electrically i-type (intrinsic) is obtained. In this manner, the oxide semiconductor layer 453 is formed (see FIG. 8C).

In this embodiment, the substrate is introduced into an electric furnace which is one of heat treatment apparatuses, heat treatment is performed on the oxide semiconductor layer at 450° C. in a nitrogen atmosphere for one hour, and cooling is performed in an oxygen atmosphere.

A feature of the present invention is that an oxide semiconductor layer is subjected to heat treatment for dehydration or dehydrogenation treatment in a nitrogen atmosphere or an inert gas atmosphere such as a rare gas (e.g., argon or helium) or under reduced pressure and subjected to a cooling step for treatment for supplying oxygen in an atmosphere of oxygen, an atmosphere of oxygen and nitrogen, or the air (having a dew point of preferably lower than or equal to −40° C., still preferably lower than or equal to −50° C.) atmosphere.

The temperature states of an oxide semiconductor layer (and a substrate) in the dehydration or dehydrogenation treatment and the treatment for supplying oxygen are a rising state, a constant state, and a dropping state. The gas (atmosphere) may be switched from nitrogen or an inert gas such as a rare gas (e.g., argon or helium) to oxygen, both oxygen and nitrogen, or the air (having a dew point of preferably lower than or equal to −40° C., still preferably lower than or equal to −50° C.) at any of the following timings: at the time when the temperature of the oxide semiconductor layer is in a constant state, at the time when the temperature drop of the oxide semiconductor layer is started, and at the time when the temperature of the oxide semiconductor layer is in a dropping state.

Next, the insulating layer 457 serving as a protective insulating film is formed in contact with the oxide semiconductor layer 453.

The insulating layer 457 can be formed to a thickness of at least 1 nm using a method by which impurities such as water or hydrogen does not enter the insulating layer 457, such as a sputtering method as appropriate. When hydrogen is contained in the insulating layer 457, entry of the hydrogen to the oxide semiconductor layer or extraction of oxygen in the oxide semiconductor layer by the hydrogen is caused, thereby making the resistance of the backchannel of the oxide semiconductor layer low (to have an n-type conductivity), so that a parasitic channel might be formed. Therefore, it is important that a film formation method in which hydrogen be not used is employed in order to form the insulating layer 457 containing as little hydrogen as possible.

In this embodiment, a 200-nm-thick silicon oxide film is formed as the insulating layer 457 by a sputtering method. The substrate temperature in the film formation may be higher than or equal to room temperature and lower than or equal to 300° C. and in this embodiment, is 100° C. The formation of a silicon oxide film by a sputtering method can be performed in a rare gas (typically, argon) atmosphere, an oxygen atmosphere, or an atmosphere of a rare gas (typically, argon) and oxygen. As a target, a silicon oxide target or a silicon target may be used. For example, with the use of a silicon target, silicon oxide can be formed by a sputtering method in an atmosphere of oxygen and nitrogen. As the insulating layer 457, an inorganic insulating film which does not contain impurities such as moisture, a hydrogen ion, and $OH^-$ is used. Typically, a silicon oxide film, a silicon oxynitride film, an aluminum oxide film, an aluminum oxynitride film, or the like is used.

In that case, the insulating layer 457 is preferably formed removing moisture remaining in the treatment chamber. This is for preventing hydrogen, hydroxyl, or moisture from being contained in the oxide semiconductor layer 453 and the insulating layer 457.

In order to remove remaining moisture in the treatment chamber, a sorption vacuum pump is preferably used. For example, a cryopump, an ion pump, or a titanium sublimation pump is preferably used. The evacuation unit can be a turbo pump provided with a cold trap. From a deposition chamber in which evacuation is performed with the use of the cryopump, hydrogen atoms, compounds containing hydrogen atoms, such as water ($H_2O$), or the like are evacuated; therefore, the concentration of impurities contained in the insulating layer 457 which is formed in the deposition chamber can be reduced.

As a sputtering gas used for film formation of the insulating layer 457, a high-purity gas is preferably used, in which impurities such as hydrogen, water, hydroxyl, or hydride are reduced to such a level that the impurity concentration is represented by the unit "ppm" or "ppb".

Next, heat treatment (second heat treatment) may be performed in an inert gas atmosphere or an oxygen gas atmosphere (preferably at 200° C. to 400° C. inclusive, for example at 250° C. to 350° C. inclusive). For example, the heat treatment is performed at 250° C. in a nitrogen atmosphere for one hour. In the heat treatment, the oxide semiconductor layer is heated while being in contact with the insulating layer 457.

Figure 8D:
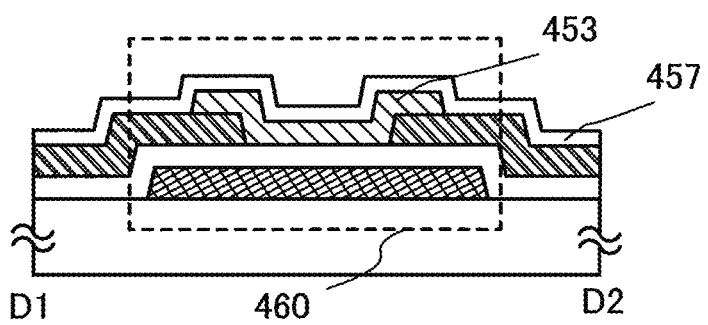

Through the aforementioned process, the thin film transistor 460 including the oxide semiconductor layer 453, which is subjected to heat treatment as dehydration or dehydrogenation treatment in a nitrogen atmosphere or an inert gas atmosphere, or under reduced pressure to reduce impurities such as hydrogen, moisture, hydroxyl, or hydride in a film and then subjected to cooling as treatment for supplying oxygen in an atmosphere of oxygen, an atmosphere of oxygen and nitrogen, or the air (having a dew point of preferably lower than or equal to −40° C., still preferably lower than or equal to −50° C.) atmosphere, is formed (see FIG. 8D).

A protective insulating layer may be formed over the insulating layer 457. For example, a silicon nitride film is formed by an RF sputtering method. Since an RF sputtering method allows high productivity, it is preferably used as a film formation method of the protective insulating layer. As the protective insulating layer, an inorganic insulating film which does not contain impurities such as moisture, a hydrogen ion, and OH⁻ and blocks the entry of these impurities from the outside is used; a silicon nitride film, an aluminum nitride film, a silicon nitride oxide film, an aluminum nitride oxide film, or the like is used.

After the formation of the insulating layer 457 (or after the formation of the protective insulating layer), heat treatment may be further performed at 100° C. to 200° C. inclusive for one hour to 30 hours inclusive in the air. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature. Further, this heat treatment may be performed before the formation of the insulating layer under reduced pressure. Under the reduced pressure, the heat treatment time can be shortened.

Heat treatment for dehydration or dehydrogenation is performed on an oxide semiconductor layer, and thus, an oxide semiconductor layer is changed to an oxygen-deficient type, whereby an n-type (n⁻-type, n⁺-type, or the like) oxide semiconductor layer is obtained. The obtained oxide semiconductor layer is then cooled in an atmosphere of oxygen, an atmosphere of oxygen and nitrogen, or the air (having a dew point of preferably lower than or equal to −40° C., still preferably lower than or equal to −50° C.) atmosphere, whereby oxygen is supplied to the oxide semiconductor layer. Thus, the oxide semiconductor layer is highly purified, whereby an i-type oxide semiconductor layer is obtained. With the use of the thus obtained i-type oxide semiconductor layer, a semiconductor device including a highly reliable thin film transistor having excellent electric characteristics can be provided.

This embodiment can be freely combined with Embodiment 1.

(Embodiment 3)

Figure 34A:
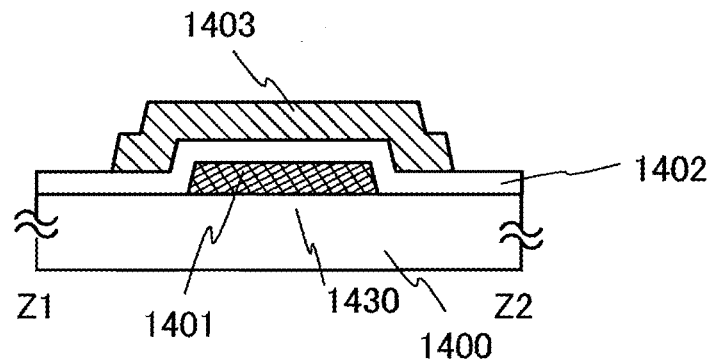
FIGS. 34A to 34C illustrate a semiconductor device of an embodiment of the present invention.
Figure 34B:
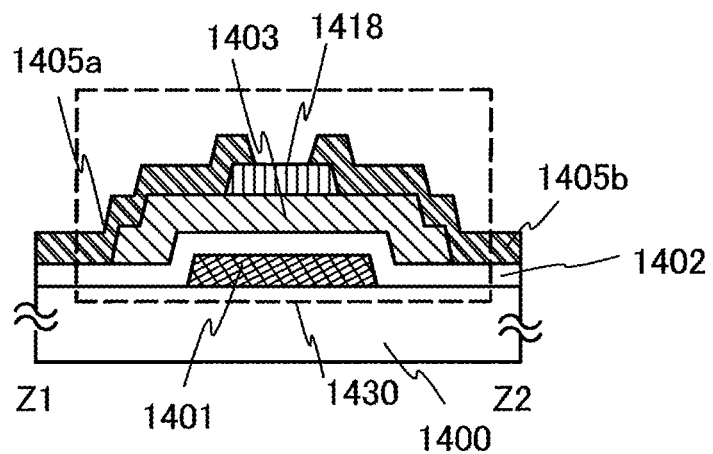
Figure 34C:
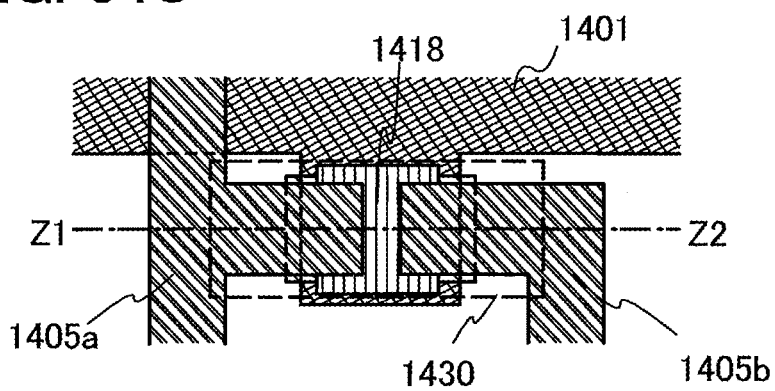

This embodiment describes an example of a channel-stop-type thin film transistor, using FIGS. 34A, 34B, and 34C.

FIG. 34C illustrates an example of a top view of the thin film transistor, cross-sectional view along dotted line Z1-Z2 of which corresponds to FIG. 34B. The same portion as or a portion having a function similar to that described in Embodiment 1 can be formed in a manner similar to that described in Embodiment 1, and also the steps similar to those of Embodiment 1 can be performed in a manner similar to those described in Embodiment 1; therefore, repetitive description is omitted.

As in FIG. 34A, a gate electrode layer 1401 is formed over a substrate 1400. Next, an oxide semiconductor layer is formed over a gate insulating layer 1402 covering the gate electrode layer 1401.

In this embodiment, a Sn—Zn—O-based oxide semiconductor layer formed by a sputtering method is used for an oxide semiconductor layer 1403.

Heat treatment for dehydration or dehydrogenation is performed immediately after formation of an oxide semiconductor film or after processing of the oxide semiconductor film into an island shape.

In order to reduce impurities such as hydrogen, moisture, hydroxyl, or hydride, heat treatment (heat treatment for dehydration or dehydrogenation) is performed at 200° C. to 700° C., preferably at 350° C. to 700° C., still preferably at 450° C. to 700° C. in a nitrogen atmosphere or an inert gas atmosphere such as a rare gas (e.g., argon or helium) or under reduced pressure, in a state where the oxide semiconductor layer is exposed. Thus, moisture contained in the oxide semiconductor film is reduced. Next, cooling is performed in an atmosphere of oxygen, an atmosphere of oxygen and nitrogen, or the air (ultra-dry air) (having a dew point of preferably lower than or equal to −40° C., still preferably lower than or equal to −50° C.) atmosphere. Thus, a highly purified oxide semiconductor film which is electrically i-type (intrinsic) is obtained. In this manner, the oxide semiconductor layer 1403 is formed (see FIG. 34A).

As the dehydration or dehydrogenation treatment, heat treatment is performed in a nitrogen atmosphere or an inert gas atmosphere, or under reduced pressure, whereby impurities such as hydrogen, moisture, hydroxyl, or hydride in a film are reduced. Then, as treatment for supplying oxygen, cooling is performed in an atmosphere of oxygen, an atmosphere of oxygen and nitrogen, or the air (ultra-dry air) atmosphere (having a dew point of preferably lower than or equal to −40° C., still preferably lower than or equal to −50° C.). With the use of the thus obtained oxide semiconductor layer, electric characteristics of a thin film transistor are improved. Further, a thin film transistor with high performance, which can be mass-produced, can be achieved.

Next, a channel protective layer 1418 is provided to be in contact with the oxide semiconductor layer 1403. The channel protective layer 1418 over the oxide semiconductor layer 1403 can prevent damage in a later step of forming source or drain regions (e.g., reduction in thickness due to plasma or an etchant in etching). Accordingly, reliability of the thin film transistor 1430 can be improved.

Further, after the dehydration or dehydrogenation, the channel protective layer 1418 can be formed successively without exposure to air. Successive film formation without exposure to air makes it possible to obtain an interface between stacked layers, which is not contaminated by atmospheric components or impurity elements floating in the air, such as water or hydrocarbon. Therefore, variation in characteristics of the thin film transistor can be reduced.

The channel protective layer 1418 can be formed using an oxide insulating material (such as silicon oxide, silicon oxynitride, or silicon nitride oxide). As a method for forming the channel protective layer 1418, a sputtering method can be used. The channel protective layer 1418 is processed by etching a deposited film. In this embodiment, a silicon oxide film is formed by a sputtering method and then etched using a mask formed by photolithography, whereby the channel protective layer 1418 is obtained.

Next, a source electrode layer 1405*a* and a drain electrode layer 1405*b* are formed over the channel protective layer 1418 and the oxide semiconductor layer 1403; thus, the thin film transistor 1430 is manufactured (see FIG. 34B). The source electrode layer 1405*a* and the drain electrode layer 1405*b* can be formed in a manner similar to that of the source electrode layer 405*a* and the drain electrode layer 405*b* described in Embodiment 1.

Furthermore, after the formation of the channel protective layer 1418 is formed, the thin film transistor 1430 is subjected to heat treatment in a nitrogen atmosphere or the air atmosphere (in the air) (preferably at a temperature higher than or equal to 150° C. and lower than 350° C.). For example, the heat treatment is performed at 250° C. in a nitrogen atmosphere for one hour. In such heat treatment, the oxide semiconductor layer 1403 in a condition of being in contact with the channel protective layer 1418 is heated; thus, variation in electric characteristics of the thin film transistor 1430 can be reduced. There is no particular limitation of the timing of the heat treatment (preferably at a temperature higher than or equal to 150° C. and lower than 350° C.) as long as it is performed after the formation of the channel protective layer 1418. When the heat treatment also serves as another step such as heat treatment in formation of an insulating layer functioning as a planarization film or heat treatment for reducing the resistance of a transparent conductive film, the number of the steps is not increased.

Heat treatment for dehydration or dehydrogenation is performed on an oxide semiconductor layer, and thus, an oxide semiconductor layer is changed to an oxygen-deficient type, whereby an n-type (n$^-$-type, n$^+$-type, or the like) oxide semiconductor layer is obtained. The obtained oxide semiconductor layer is then cooled in an atmosphere of oxygen, an atmosphere of oxygen and nitrogen, or the air (having a dew point of preferably lower than or equal to −40° C., still preferably lower than or equal to −50° C.) atmosphere, whereby oxygen is supplied to the oxide semiconductor layer. Thus, the oxide semiconductor layer is highly purified, whereby an i-type oxide semiconductor layer is obtained. With the use of the thus obtained i-type oxide semiconductor layer, a semiconductor device including a highly reliable thin film transistor having excellent electric characteristics can be manufactured and provided.

This embodiment can be implemented in appropriate combination with any of the structures described in the other embodiments.

(Embodiment 4)

A manufacturing process of a semiconductor device including a thin film transistor will be described with reference to FIGS. 10A to 10D, FIGS. 11A to 11C, FIG. 12, and FIGS. 13A1, 13A2, 13B1, and 13B2.

In FIG. 10A, as a substrate 100 having a light-transmitting property, a glass substrate of barium borosilicate glass, aluminoborosilicate glass, or the like can be used.

Next, a conductive layer is formed entirely over a surface of the substrate 100, and then a first photolithography step is performed to form a resist mask. Then, an unnecessary portion is removed by etching, so that wirings and electrodes (a gate wiring including a gate electrode layer 101, a capacitor wiring 108, and a first terminal 121) are formed. At this time, the etching is performed so that at least end portions of the gate electrode layer 101 have a tapered shape.

The gate wiring including the gate electrode layer 101, the capacitor wiring 108, and the first terminal 121 in a terminal portion can be formed using the same material as that used for the gate electrode layer 401 described in Embodiment 1 as appropriate. When the gate electrode layer 101 is formed using a heat resistant conductive material, any of the following materials may be used: an element selected from titanium (Ti), tantalum (Ta), tungsten (W), molybdenum (Mo), chromium (Cr), neodymium (Nd), and scandium (Sc); an alloy including any of these above elements as a component; an alloy including these elements in combination, and a nitride including any of these above elements as a component.

Next, a gate insulating layer 102 is formed over the entire surface of the gate electrode layer 101.

For example, as the gate insulating layer 102, a silicon oxide film is formed to a thickness of 100 nm by a sputtering method. Needless to say, the gate insulating layer 102 is not limited to such a silicon oxide film and may be formed to have a single-layer structure or a stacked-layer structure using another insulating film such as a silicon oxynitride film, a silicon nitride film, an aluminum oxide film, or a hafnium oxide film.

Then, an oxide semiconductor film is formed to a thickness of greater than or equal to 2 nm and less than or equal to 200 nm over the gate insulating layer 102. In this embodiment, the oxide semiconductor film is formed by a sputtering method with the use of an In—Ga—Zn—O-based oxide semiconductor film formation target.

In that case, the oxide semiconductor film is preferably formed removing moisture remaining in the treatment chamber. This is for preventing hydrogen, hydroxyl, or moisture from being contained in the oxide semiconductor film.

In order to remove remaining moisture in the treatment chamber, a sorption vacuum pump is preferably used. For example, a cryopump, an ion pump, or a titanium sublimation pump is preferably used. The evacuation unit can be a turbo pump provided with a cold trap. From a deposition chamber in which evacuation is performed with the use of the cryopump, hydrogen atoms, compounds containing hydrogen atoms, such as water ($H_2O$), or the like are evacuated; therefore, the concentration of impurities contained in the oxide semiconductor film formed in the deposition chamber can be reduced.

As a sputtering gas used for formation of the oxide semiconductor film, a high-purity gas is preferably used, in which impurities such as hydrogen, water, hydroxyl, or hydride are reduced to such a degree that the impurity concentration level is represented by the unit "ppm" or "ppb".

Then, the oxide semiconductor film is processed into an island-shaped oxide semiconductor layer 133 in a second photolithography step. For example, unnecessary portions are removed by wet etching using a mixed solution of phosphoric acid, acetic acid, and nitric acid, so that an oxide semiconductor layer 133 is formed (see FIG. 10A). Note that etching here is not limited to wet etching and dry etching may also be performed.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane (CHF$_3$)); hydrogen bromide (HBr); oxygen (O$_2$); any of these gases to which a rare gas such as helium (He) or argon (Ar) is added; or the like can be used as the etching gas used for dry etching.

As the dry etching method, a parallel plate RIE (reactive ion etching) method, an ICP (inductively coupled plasma) etching method, or the like can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, an ammonia peroxide mixture (hydrogen peroxide water at 31 wt %: ammonia water at 28 wt %: water=5:2:2), or the like can be used. In addition, ITO07N (produced by KANTO CHEMICAL CO., INC.) may also be used.

The etchant used in the wet etching is removed by cleaning together with the material which is etched off. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

Next, in order to reduce impurities such as hydrogen, moisture, hydroxyl, or hydride, heat treatment (heat treatment for dehydration or dehydrogenation) is performed on the oxide semiconductor layer 133 at 200° C. to 700° C., preferably at 350° C. to 700° C., still preferably at 450° C. to 700° C. in a nitrogen atmosphere or an inert gas atmosphere such as a rare gas (e.g., argon or helium) or under reduced pressure. Thus, moisture contained in the oxide semiconductor layer is reduced.

Next, the heated oxide semiconductor layer is cooled in an atmosphere of oxygen, an atmosphere of oxygen and nitrogen, or the air (having a dew point of preferably lower than or equal to −40° C., still preferably lower than or equal to −50° C.) atmosphere. Thus, a highly purified oxide semiconductor layer which is electrically i-type (intrinsic) is obtained. In this manner, the oxide semiconductor layer 103 is formed (see FIG. 10B).

In this embodiment, the substrate is introduced into an electric furnace which is one of heat treatment apparatuses, the oxide semiconductor layer is subjected to heat treatment is performed on at 450° C. in a nitrogen atmosphere for one hour and subjected to cooling in an oxygen atmosphere.

A feature of the present invention is that an oxide semiconductor layer is subjected to heat treatment for dehydration or dehydrogenation treatment in a nitrogen atmosphere or an inert gas atmosphere such as a rare gas (e.g., argon or helium) or under reduced pressure and is subjected to a cooling step for treatment for supplying oxygen in an atmosphere of oxygen, an atmosphere of oxygen and nitrogen, or the air (having a dew point of preferably lower than or equal to −40° C., still preferably lower than or equal to −50° C.) atmosphere.

The temperature states of an oxide semiconductor layer (and a substrate) in the dehydration or dehydrogenation treatment and the treatment for supplying oxygen are a rising state, a constant state, and a dropping state. The gas (atmosphere) may be switched from nitrogen or an inert gas such as a rare gas (e.g., argon or helium) to oxygen, both oxygen and nitrogen, or the air (having a dew point of preferably lower than or equal to −40° C., still preferably lower than or equal to −50° C.) at any of the following timings: at the time when the temperature of the oxide semiconductor layer is in a constant state, at the time when the temperature drop of the oxide semiconductor layer is started, and at the time when the temperature of the oxide semiconductor layer is in a dropping state.

Next, a conductive film 132 is formed using a metal material over the oxide semiconductor layer 103 using a sputtering method or a vacuum evaporation method (see FIG. 10C).

For a material of the conductive film 132, a material which is similar to that of the source electrode layer 405a and the drain electrode layer 405b described in Embodiment 1 can be used as appropriate.

In the case where heat treatment is performed after the formation of the conductive film 132, it is preferable that the conductive film have heat resistance high enough to withstand the heat treatment.

Next, a third photolithography step is performed. A resist mask is formed, and unnecessary portions are removed by etching, so that source or drain electrode layers 105a and 105b and a second terminal 122 are formed (see FIG. 10D). Wet etching or dry etching is employed as an etching method at this time. For example, when an aluminum film or an aluminum-alloy film is used as the conductive film 132, wet etching using a mixed solution of phosphoric acid, acetic acid, and nitric acid can be carried out. Alternatively, the conductive film 132 may be etched by wet etching using an ammonia peroxide mixture (hydrogen peroxide water at 31 wt %: ammonia water at 28 wt %: water=5:2:2) to form the source and drain electrode layers 105a and 105b. In this etching step, part of an exposed region of the oxide semiconductor layer 103 might also be etched, so that an oxide semiconductor layer with a depression might be formed.

In the third photolithography step, the second terminal 122 which is formed using the same material as that of the source or drain electrode layers 105a and 105b is left in a terminal portion. Note that the second terminal 122 is electrically connected to a source wiring (the source wiring including the source or drain electrode layers 105a and 105b).

Further, by use of a resist mask having regions with plural thicknesses (typically, two different thicknesses) which is formed using a multi-tone mask, the number of resist masks can be reduced, resulting in simplified process and lower costs.

Then, the resist mask is removed and a protective insulating layer 107 is formed to cover the gate insulating layer 102, the oxide semiconductor layer 103, and the source or drain electrode layers 105a and 105b.

The insulating layer 107 can be formed to a thickness of at least 1 nm using a method by which impurities such as water or hydrogen does not enter the insulating layer 107, such as a sputtering method as appropriate. When hydrogen is contained in the insulating layer 107, entry of the hydrogen to the oxide semiconductor layer or extraction of oxygen in the oxide semiconductor layer by the hydrogen is caused, thereby making the resistance of the backchannel of the oxide semiconductor layer low (to have an n-type conductivity), so that a parasitic channel might be formed. Therefore, it is important that a film formation method in which hydrogen be not used is employed in order to form the insulating layer 107 containing as little hydrogen as possible.

In this embodiment, a 200-nm-thick silicon oxide film is formed as the insulating layer 107 by a sputtering method. The substrate temperature in the film formation may be higher than or equal to room temperature and lower than or equal to 300° C. and in this embodiment, is 100° C. The formation of a silicon oxide film by a sputtering method can be performed in a rare gas (typically, argon) atmosphere, an oxygen atmosphere, or an atmosphere of a rare gas (typically, argon) and oxygen. As a target, a silicon oxide target or a silicon target may be used. For example, with the use of a silicon target, silicon oxide can be formed by a sputtering method in an atmosphere of oxygen and nitrogen. As the insulating layer 107, an inorganic insulating film which does not contain impurities such as moisture, a hydrogen ion, and OH⁻ is used. Typically, a silicon oxide film, a silicon oxynitride film, an aluminum oxide film, an aluminum oxynitride film, or the like is used.

In that case, the insulating layer 107 is preferably formed removing moisture remaining in the treatment chamber. This is for preventing hydrogen, hydroxyl, or moisture from being contained in the oxide semiconductor layer 103 and the insulating layer 107.

In order to remove remaining moisture in the treatment chamber, a sorption vacuum pump is preferably used. For example, a cryopump, an ion pump, or a titanium sublimation pump is preferably used. The evacuation unit can be a turbo pump provided with a cold trap. From a deposition chamber in which evacuation is performed with the use of the cryopump, hydrogen atoms, compounds containing hydrogen atoms, such as water ($H_2O$), or the like are evacuated; therefore, the concentration of impurities contained in the insulating layer 107 which is formed in the deposition chamber can be reduced.

As a sputtering gas used for film formation of the insulating layer 107, a high-purity gas is preferably used, in which impurities such as hydrogen, water, hydroxyl, or hydride are reduced to such a degree that the impurity concentration level is represented by the unit "ppm" or "ppb".

Then, heat treatment may be performed after the formation of the insulating layer 107. Heat treatment (second heat treatment) may be performed in an inert gas atmosphere or an oxygen gas atmosphere (preferably at 200° C. to 400° C. inclusive, for example 250° C. to 350° C. inclusive). For example, the heat treatment is performed at 250° C. in a nitrogen atmosphere for one hour. The heat treatment performs heating while the oxide semiconductor layer is in contact with the insulating layer 107.

Through the process, a thin film transistor 170 can be manufactured (see FIG. 11A).

Next, a fourth photolithography step is performed to form a resist mask. The insulating layer 107 is etched to form a contact hole 125 that reaches the drain electrode layer 105b. In addition, a contact hole 127 reaching the second terminal 122 and a contact hole 126 reaching the first terminal 121 are also formed in the etching step. A cross-sectional view at this stage is illustrated in FIG. 11B.

Next, a light-transmitting conductive film is formed after the resist mask is removed. As a material of the light-transmitting conductive film, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or any of the metal oxide materials containing silicon or silicon oxide can be used.

Next, a fifth photolithography step is performed to form a resist mask. Then, an unnecessary portion is etched away, so that a pixel electrode layer 110 is formed.

In this fifth photolithography step, a storage capacitor is formed with the capacitor wiring 108 and the pixel electrode layer 110, in which the gate insulating layer 102 and the insulating layer 107 in the capacitor portion are used as dielectrics.

In addition, in the fifth photolithography step, the first terminal 121 and the second terminal 122 are covered with the resist mask, and transparent conductive films 128 and 129 are left in the terminal portions. The transparent conductive films 128 and 129 function as electrodes or wirings connected to an FPC. The transparent conductive film 128 formed over the first terminal 121 is a connecting terminal electrode serving as an input terminal of a gate wiring. The transparent conductive film 129 formed over the second terminal 122 is a connection terminal electrode which functions as an input terminal of the source wiring.

Then, the resist mask is removed. A cross-sectional view at this stage is illustrated in FIG. 11C. Note that a plan view at this stage corresponds to FIG. 12.

FIGS. 13A1 and 13A2 are respectively a cross-sectional view and a plan view of a gate wiring terminal portion at this stage. FIG. 13A1 corresponds to a cross-sectional view taken along line E1-E2 of FIG. 13A2. In FIG. 13A1, a transparent conductive film 155 formed over a protective insulating film 154 is a connection terminal electrode which functions as an input terminal. Furthermore, in the terminal portion of FIG. 13A1, a first terminal 151 formed using the same material as the gate wiring and a connection electrode layer 153 formed using the same material as the source wiring overlap with each other with a gate insulating layer 152 interposed therebetween, and are electrically connected to each other through the transparent conductive film 155. Note that a part of FIG. 11C where the transparent conductive film 128 is in contact with the first terminal 121 corresponds to a part of FIG. 13A1 where the transparent conductive film 155 is in contact with the first terminal 151.

FIGS. 13B1 and 13B2 are respectively a cross-sectional view and a plan view of a source wiring terminal portion which is different from that illustrated in FIG. 11C. FIG. 13B1 corresponds to a cross-sectional view taken along line F1-F2 of FIG. 13B2. In FIG. 13B1, the transparent conductive film 155 formed over the protective insulating film 154 is a connection terminal electrode serving as an input terminal. Furthermore, in FIG. 13B1, in the terminal portion, an electrode layer 156 formed using the same material as the gate wiring is located below and overlaps with a second terminal 150, which is electrically connected to the source wiring, with the gate insulating layer 152 interposed therebetween. The electrode layer 156 is not electrically connected to the second terminal 150, and a capacitor to prevent noise or static electricity can be formed if the potential of the electrode layer 156 is set to a potential different from that of the second terminal 150, such as floating, GND, or 0 V. The second terminal 150 is electrically connected to the transparent conductive film 155 with the protective insulating film 154 therebetween.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. The number of each of the terminals may be any number, and the number of the terminals may be determined by a practitioner as appropriate.

Through these five photolithography steps, the storage capacitor and a pixel thin film transistor portion including the thin film transistor 170 of a bottom-gate staggered thin film transistor can be completed using the five photomasks. By disposing the thin film transistor and the storage capacitor in each pixel of a pixel portion in which pixels are arranged in a matrix form, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

Alternatively, a pixel electrode may overlap with a gate wiring of adjacent pixel with a protective insulating film and a gate insulating layer interposed therebetween to form a storage capacitor without a capacitor wiring.

The thin film transistor disclosed in this specification includes an oxide semiconductor film which is used for a channel formation region and has excellent dynamic characteristics; thus, it can be combined with these driving methods.

In manufacturing a light-emitting display device, one electrode (also referred to as a cathode) of an organic light-emitting element is set to a low power supply potential such as GND or 0 V; thus, a terminal portion is provided with a fourth terminal for setting the cathode to a low power supply potential such as GND or 0 V. Also in manufacturing a light-emitting display device, a power supply line is provided in addition to a source wiring and a gate wiring. Accordingly, the terminal portion is provided with a fifth terminal electrically connected to the power supply line.

Heat treatment for dehydration or dehydrogenation is performed on an oxide semiconductor layer, and thus, an oxide semiconductor layer is changed to an oxygen-deficient type, whereby an n-type (n$^-$-type, n$^+$-type, or the like) oxide semiconductor layer is obtained. The obtained oxide semiconductor layer is then cooled in an atmosphere of oxygen, an atmosphere of oxygen and nitrogen, or the air (having a dew point of preferably lower than or equal to −40° C., still preferably lower than or equal to −50° C.) atmosphere, whereby oxygen is supplied to the oxide semiconductor layer. Thus, the oxide semiconductor layer is highly purified, whereby an i-type oxide semiconductor layer is obtained. With the use of the thus obtained i-type oxide semiconductor layer, a semiconductor device including a highly reliable thin film transistor having excellent electric characteristics can be provided.

This embodiment can be implemented in appropriate combination with any of the structures described in the other embodiments.

(Embodiment 5)

This embodiment describes another example of a method for manufacturing a semiconductor device.

Figure 38:
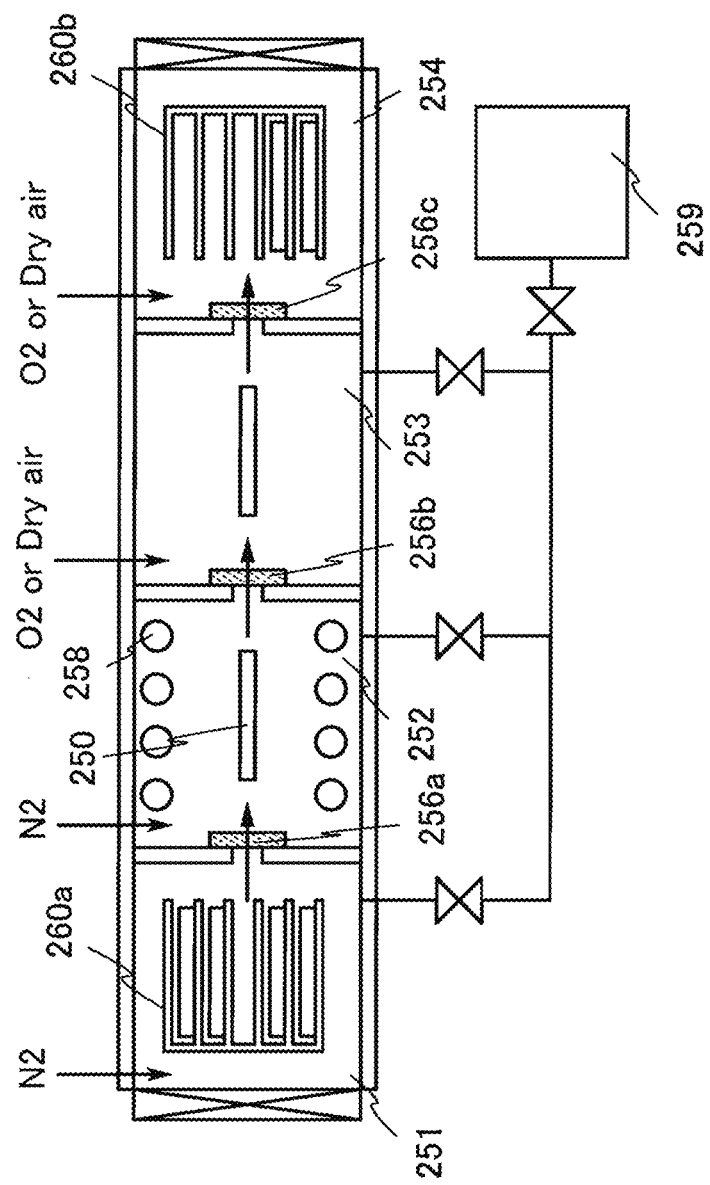
FIG. 38 illustrates a heat treatment apparatus used in an embodiment of the present invention.

FIG. 38 illustrates an example of a heat treatment apparatus for performing dehydration or dehydrogenation, and treatment for supplying oxygen on an oxide semiconductor.

The heat treatment apparatus includes a treatment chamber 252 for dehydration or dehydrogenation treatment and a treatment chamber 253 for treatment for supplying oxygen, between a loading chamber 251 to and from which a substrate cassette 260a holding a substrate 250 provided with an oxide semiconductor film is transferred and an unloading chamber 254 to and from which a substrate cassette 260b is transferred. Note that the treatment chamber 252 is provided with a lamp light source 258 as a heating unit.

A vacuum evacuation unit 259 is connected to the loading chamber 251, the treatment chamber 252, and the treatment chamber 253, and a gas in the loading chamber 251, the treatment chamber 252, and the treatment chamber 253 is evacuated through an evacuation tube. A choice among the loading chamber 251, the treatment chamber 252, and the treatment chamber 253 is made by switching the opening and closing of valves. A high-purity gas in which hydrogen and moisture are reduced to such a degree that the concentration level is represented by the unit "ppb" is supplied from a gas supply unit to the loading chamber 251, the treatment chamber 252, the treatment chamber 253, and the unloading chamber 254, through an air supply tube.

A shutter 256a is provided between the loading chamber 251 and the treatment chamber 252, a shutter 256b is provided between the treatment chamber 252 and the treatment chamber 253, and a shutter 256c is provided between the treatment chamber 253 and the unloading chamber 254. The shutters are opened and closed along with the transfer of the substrate 250 to and from the chambers.

The substrate cassette 260a holding the substrate is transferred to the loading chamber 251. The loading chamber 251 is evacuated with a vacuum evacuation unit 259, so that the pressure is reduced. Then, a nitrogen gas or an inert gas is supplied to the loading chamber 251. Similarly, the treatment chamber 252 is evacuated with the vacuum evacuation unit 259, so that the pressure is reduced. Then, a nitrogen gas or an inert gas is supplied to the treatment chamber 252.

The substrate 250 is taken out of the substrate cassette 260a and the substrate 250 is transferred to the treatment chamber 252 with a nitrogen atmosphere or an inert gas atmosphere by opening the shutter 256a. With the use of the lamp light source 258, heat treatment (heat treatment for dehydration or dehydrogenation) is performed at 200° C. to 700° C., preferably at 350° C. to 700° C., still preferably at 450° C. to 700° C. in a nitrogen atmosphere or an inert gas atmosphere. Thus, impurities such as moisture contained in the oxide semiconductor film are reduced. Note that the heat treatment for dehydration or dehydrogenation may be performed under reduced pressure.

Next, the treatment chamber 253 is evacuated with the vacuum evacuation unit 259, so that the pressure is reduced. Then, an oxygen gas, a gas containing oxygen and nitrogen (e.g., N$_2$O gas), or ultra-dry air (having a dew point of preferably lower than or equal to −40° C., still preferably lower than or equal to −50° C.) is supplied to the treatment chamber 253. Next, the substrate 250 subjected to heat treatment is transferred to the treatment chamber 253 with an atmosphere of oxygen, an atmosphere of oxygen and nitrogen, or the ultra-dry air atmosphere by opening the shutter 256a, and cooling is performed in an atmosphere of oxygen, an atmosphere of oxygen and nitrogen, or the ultra-dry air atmosphere. By performing cooling in an atmosphere of oxygen, an atmosphere of oxygen and nitrogen, or the ultra-dry air atmosphere, oxygen is supplied to the oxide semiconductor film. Thus, a high-purity oxide semiconductor film which is electrically i-type (intrinsic) can be obtained.

Next, the shutter 256c is opened, followed by transfer of the substrate 250 subjected to the treatment for supplying oxygen to the unloading chamber 254. The substrate 250 is held in the substrate cassette 260b. As with the treatment chamber 253, a gas including oxygen and nitrogen (e.g., $N_2O$ gas) or ultra-dry air is supplied to the unloading chamber 254 the atmosphere of which is oxygen, both oxygen and nitrogen, or the ultra-dry air (having a dew point of preferably lower than or equal to −40° C., still preferably lower than or equal to −50° C.).

In this manner, heat treatment for dehydration or dehydrogenation and treatment for supplying oxygen can be performed on an oxide semiconductor layer with the use of the heat treatment apparatus illustrated in FIG. 38.

With the use of an oxide semiconductor film which is thus highly purified, a highly reliable semiconductor device having stable electric characteristics can be provided.

This embodiment can be implemented in appropriate combination with any of the structures described in the other embodiments.

(Embodiment 6)

This embodiment describes another example of a method for manufacturing a semiconductor device.

Figure 39:
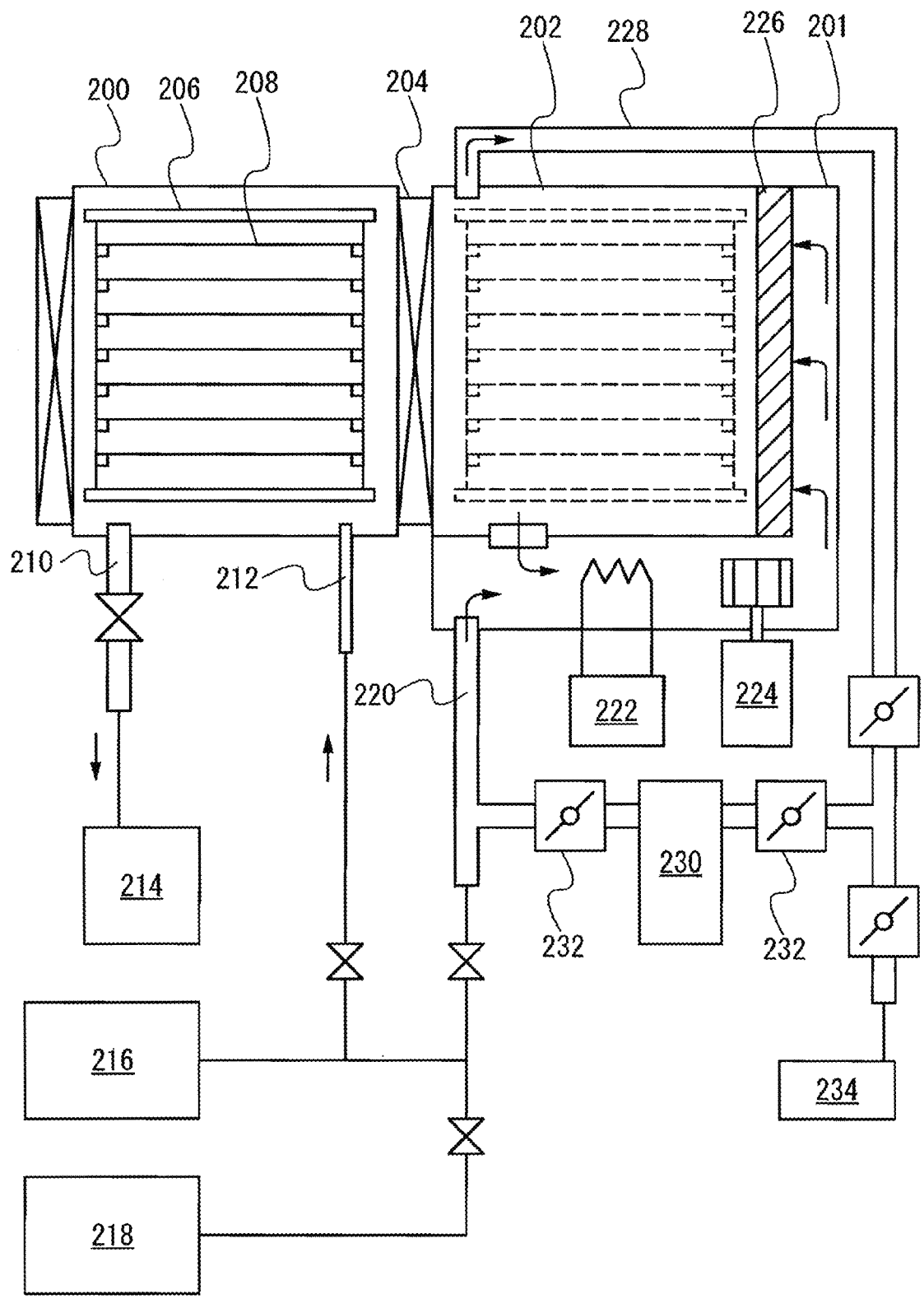
FIG. 39 illustrates a heat treatment apparatus used in an embodiment of the present invention.

FIG. 39 illustrates an example of a heat treatment apparatus for performing dehydration or dehydrogenation and treatment for supplying oxygen on an oxide semiconductor. The heat treatment apparatus includes a substrate cassette transfer chamber 200 and a heat treatment chamber 201. In the substrate cassette transfer chamber 200, a substrate cassette 206 holding a substrate 208 provided with an oxide semiconductor film is transferred to and from the chamber. In the heat treatment chamber 201, a cleaned gas is introduced thereto in a state where a plurality of substrates 208 is stored in the substrate cassette 206 held, and heat treatment is performed.

A vacuum evacuation unit 214 is connected to the substrate cassette transfer chamber 200, and a gas in the substrate cassette transfer chamber 200 is evacuated through an evacuation tube 210. A nitrogen gas or an inert gas is supplied from a gas supply unit (1) 216 to the substrate cassette transfer chamber 200 through an air supply tube 212.

A gate valve 204 is provided between the substrate cassette transfer chamber 200 and the heat treatment chamber 201. The sluice valve is opened and closed along with the transfer of the substrate cassette 206 to and from the chamber. The substrate cassette 206 transferred to the heat treatment chamber 201 is held in a cleaning tank 202.

An air supply tube 220 is connected to the heat treatment chamber 201, so that a nitrogen gas or an inert gas is supplied from the gas supply unit (1) 216 and an oxygen gas is supplied from a gas supply unit (2) 218. A high-purity gas in which hydrogen and moisture are reduced to such a degree that the concentration level is represented by the unit "ppb" is supplied from the gas supply unit (1) 216 and the gas supply unit (2) 218.

The gas supplied to the heat treatment chamber 201 is heated with a heater 222 and blown into the cleaning tank 202 with a fan 224. Microparticles in the gas blown into the cleaning tank 202 are removed by a filter 226.

Although the treatment chamber 201 is designed such that a gas is circulated therein, part of the gas is evacuated from the heat treatment chamber 201 through an evacuation tube 228. The amount of gas to be evacuated is controlled in accordance with the degree of opening of a duct 232 attached to the evacuation tube 228. Impurities such as moisture in the evacuated gas are removed again with a gas refining apparatus 230 and returned to the air supply tube 220. Note that part of the gas is discharged by an evacuation unit 234.

Heat treatment for dehydration or dehydrogenation and treatment for supplying oxygen can be performed on an oxide semiconductor layer with the use of the heat treatment apparatus illustrated in FIG. 39.

With the use of an oxide semiconductor film which is thus highly purified, a highly reliable semiconductor device having stable electric characteristics can be provided.

This embodiment can be implemented in appropriate combination with any of the structures described in the other embodiments.

(Embodiment 7)

This embodiment gives an example of a manufacturing method whose process is partly different from that of Embodiment 1. In this embodiment, an example in which heat treatment for dehydration or dehydrogenation is performed after formation of the source electrode layer 405a and the drain electrode layer 405b is illustrated in FIGS. 31A to 31D. Note that portions similar to those in FIGS. 1A to 1D are denoted by the same reference numerals.

Figure 31A:
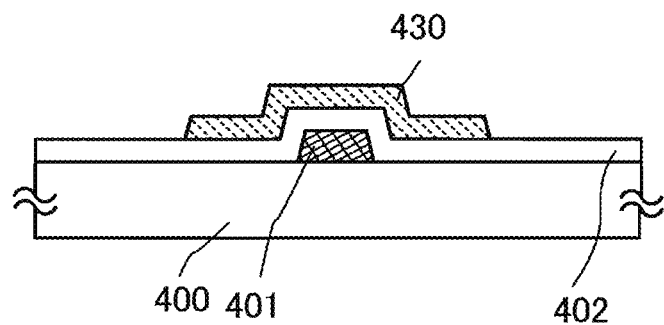
FIGS. 31A to 31D are cross-sectional views illustrating a manufacturing process of an embodiment of the present invention.

In a manner similar to Embodiment 1, over the substrate 400 having an insulating surface, the gate electrode layer 401, the gate insulating layer 402, and the oxide semiconductor layer 430 are formed (see FIG. 31A).

Figure 31B:
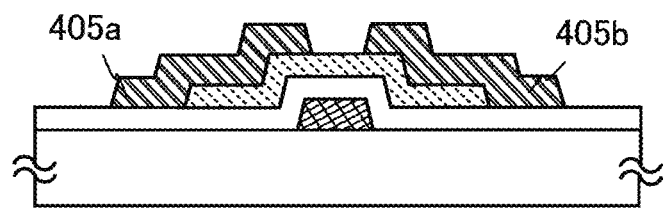
Figure 31C:
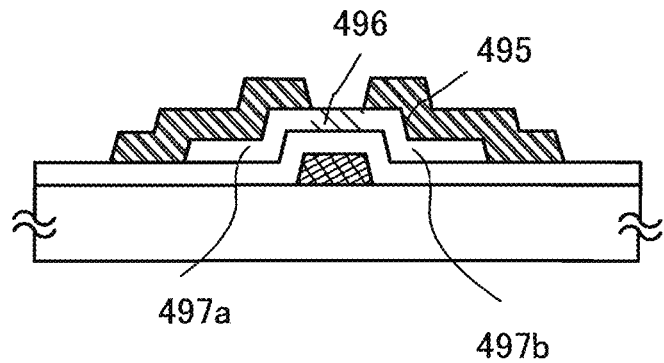

The source electrode layer 405a and the drain electrode layer 405b are formed over the oxide semiconductor layer 430 (see FIG. 31B).

Next, as dehydration or dehydrogenation treatment, heat treatment is performed on the oxide semiconductor layer 430, the source electrode layer 405a, and the drain electrode layer 405b in an atmosphere of an inert gas (such as nitrogen, helium, neon, or argon) or under reduced pressure. This heat treatment reduces resistance of the oxide semiconductor layer 430, so that a low-resistance oxide semiconductor layer is obtained. Then, as treatment for supplying oxygen, the heated oxide semiconductor layer is slowly cooled in an atmosphere of oxygen, an atmosphere of oxygen and nitrogen, or the air (having a dew point of preferably lower than or equal to −40° C., still preferably lower than or equal to −50° C.) atmosphere. The treatment for supplying oxygen is performed on an exposed portion of the oxide semiconductor layer; therefore, part of a semiconductor layer 495 is brought into an oxygen-excess state. Accordingly, a channel formation region 496 overlapping with the gate electrode layer 401 becomes i-type, and a high-resistant source region 497a overlapping with the source electrode layer 405a and a high-resistant drain region 497b overlapping with the drain electrode layer 405b are formed in a self-aligning manner (see FIG. 31C).

Note that as the source electrode layer 405a and the drain electrode layer 405b, a material which has heat resistance enough to withstand the heat treatment, such as tungsten or molybdenum, is preferably used.

Next, by a sputtering method or a PCVD method, the insulating layer 407 is formed to be in contact with the semiconductor layer 495. The protective insulating layer 499 is stacked over the insulating layer 407. In this embodiment, a silicon oxide layer is formed by a sputtering method as the insulating layer 407, and a silicon nitride layer is formed by a sputtering method as the protective insulating layer 499.

Figure 31D:
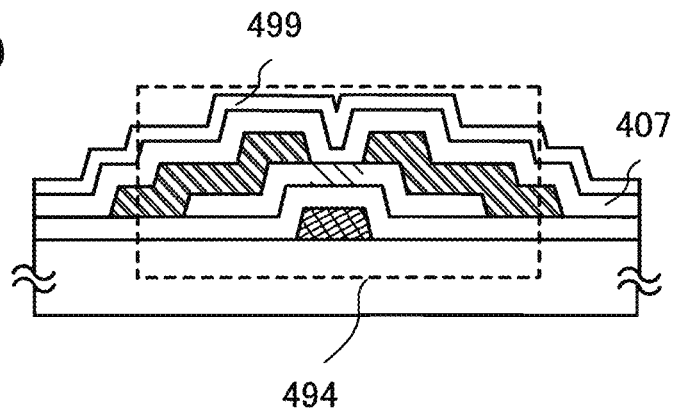

Through the process, a thin film transistor 494 is formed (see FIG. 31D).

By the formation of the high-resistant drain region 497b (or the high-resistant source region 497a) in the oxide semiconductor layer, which overlaps with the drain electrode layer 405b (and the source electrode layer 405a), reliability of the thin film transistor can be improved. Specifically, with the formation of the high-resistant drain region 497b, the conductivity can be gradually varied from the drain electrode layer 405b to the high-resistant drain region 497b and the channel formation region 496. Therefore, in the case where operation is performed with the drain electrode layer 405b connected to a wiring for supplying a high power supply potential $V_{DD}$, the high-resistant drain region serves as a buffer and a high electric field is not applied locally even if the high electric field is applied between the gate electrode layer 401 and the drain electrode layer 405b, so that the withstand voltage of the transistor can be improved.

With the use of an oxide semiconductor layer which is thus highly purified, a highly reliable semiconductor device having stable electric characteristics can be provided.

This embodiment can be implemented in combination with any of the other embodiments as appropriate.
(Embodiment 8)

A semiconductor device and a method of manufacturing the semiconductor device will be described with reference to FIG. 32. The same portion as or a portion having a function similar to that described in Embodiment 1 can be formed in a manner similar to that described in Embodiment 1, and also the steps similar to those of Embodiment 1 can be performed in a manner similar to those described in Embodiment 1; therefore, repetitive description is omitted.

Figure 32:
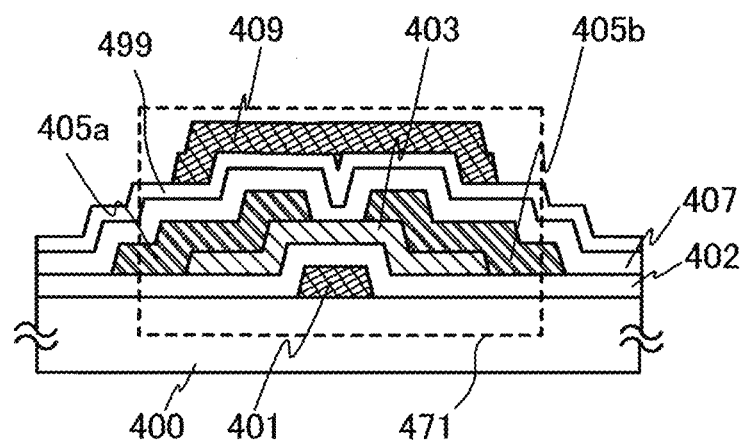
FIG. 32 illustrates a semiconductor device of an embodiment of the present invention.

A thin film transistor 471 illustrated in FIG. 32 is an example, in which a conductive layer 409 is provided to overlap with the gate electrode layer 401 and a channel region of the oxide semiconductor layer 403 with an insulating film interposed therebetween.

FIG. 32 is a cross-sectional view of the thin film transistor 471 included in a semiconductor device. The thin film transistor 471 is a bottom-gate thin film transistor and includes, over the substrate 400 which is a substrate having an insulating surface, the gate electrode layer 401, the gate insulating layer 402, the oxide semiconductor layer 403, the source electrode layer 405a, the drain electrode layer 405b, the insulating layer 407, the protective insulating layer 499, and the conductive layer 409. The conductive layer 409 is provided over the protective insulating layer 499 so as to overlap with the gate electrode layer 401.

The conductive layer 409 can be formed using a material similar to that of the gate electrode layer 401, the source electrode layer 405a, or the drain electrode layer 405b by a method similar thereto. In the case of providing a pixel electrode layer, the conductive layer 409 may be formed using a material similar to that of the pixel electrode layer by a method similar thereto. In this embodiment, the conductive layer 409 is formed using a stacked layer of a titanium film, an aluminum film, and a titanium film.

The conductive layer 409 may have the same potential as the gate electrode layer 401 or have a potential different from that of the gate electrode layer 401 and can function as a second gate electrode layer. Further, the conductive layer 409 may be in a floating state.

By providing the conductive layer 409 in a position overlapping with the oxide semiconductor layer 403, in a bias-temperature stress test (BT test) for examining reliability of a thin film transistor, the amount of shift in threshold voltage of the thin film transistor 471 between before and after the BT test can be made smaller. In particular, in a minus BT test where −20 V of voltage is applied to a gate after the substrate temperature is increased to 150° C., shift in threshold voltage can be suppressed.

This embodiment can be implemented in appropriate combination with the other embodiments as appropriate.
(Embodiment 9)

A semiconductor device and a method for manufacturing the semiconductor device will be described with reference to FIG. 33. The same portion as or a portion having a function similar to that described in Embodiment 1 can be formed in a manner similar to that described in Embodiment 1, and also the steps similar to those of Embodiment 1 can be performed in a manner similar to those described in Embodiment 1; therefore, repetitive description is omitted.

Figure 33:
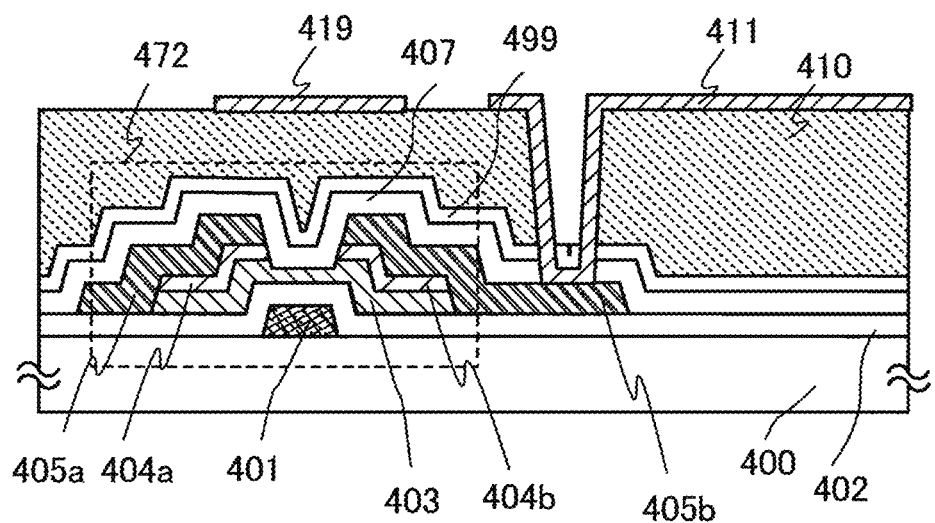
FIG. 33 illustrates a semiconductor device of an embodiment of the present invention.

A thin film transistor 472 illustrated in FIG. 33 is an example, in which a conductive layer 419 is provided to overlap with the gate electrode layer 401 and a channel region of the oxide semiconductor layer 403 with the insulating layer 407, the protective insulating layer 499, and an insulating layer 410 interposed therebetween.

FIG. 33 is a cross-sectional view of the thin film transistor 472 included in a semiconductor device. The thin film transistor 472 is a bottom-gate thin film transistor and includes, over the substrate 400 which is a substrate having an insulating surface, the gate electrode layer 401, the gate insulating layer 402, the oxide semiconductor layer 403, the source electrode layer 405a, the drain electrode layer 405b, the insulating layer 407, the insulating layer 410, and the conductive layer 419. The conductive layer 419 is provided over the insulating layer 410 to overlap with the gate electrode layer 401.

In the thin film transistor of this embodiment, the insulating layer 410 serving as a planarization film is stacked over the protective insulating layer 499, a conductive film is formed in an opening that is formed in the insulating layer 407, the protective insulating layer 499, and the insulating layer 410 and reaches the drain electrode layer 405b, and the conductive film is etched to have a desired shape, so that the conductive layer 419 and a pixel electrode layer 411 are formed. In this manner, the conductive layer 419 can be formed in the process of forming the pixel electrode layer 411. In this embodiment, an indium oxide-tin oxide alloy containing silicon oxide (an In—Sn—O-based oxide containing silicon oxide) is used for the pixel electrode layer 411 and the conductive layer 419.

Alternatively, the conductive layer 419 may be formed using a material and a manufacturing method which are similar to that of the gate electrode layer 401, the source electrode layer 405a, and the drain electrode layer 405b.

The conductive layer 419 may have the same potential as the gate electrode layer 401 or have potential different from that of the gate electrode layer 401. Alternatively, the conductive layer 419 and 401 may have different potentials. The conductive layer 419 can function as a second gate electrode layer. Further, the conductive layer 419 may be in a floating state.

In addition, by providing the conductive layer 419 in a portion overlapping with the oxide semiconductor layer 403, in a bias-temperature stress test for examining reliability of a thin film transistor, the amount of shift in threshold voltage of the thin film transistor 472 between before and after the BT test can be reduced.

This embodiment can be implemented in appropriate combination with any of the other embodiments.

(Embodiment 10)

A semiconductor device and a method for manufacturing the semiconductor device will be described with reference to FIGS. 35A and 35B. The same portion as or a portion having a function similar to that described in Embodiment 3 can be formed in a manner similar to that described in Embodiment 3, and also the steps similar to those of Embodiment 3 can be performed in a manner similar to those described in Embodiment 3; therefore, repetitive description is omitted.

Figure 35A:
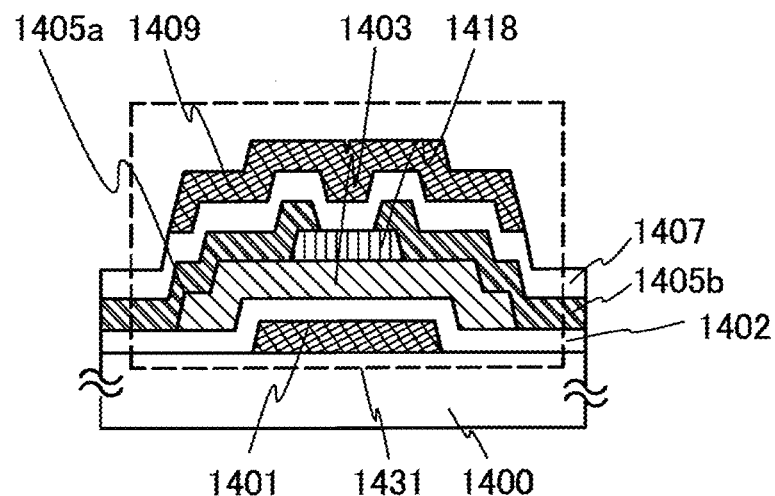
FIGS. 35A and 35B illustrate semiconductor devices of an embodiment of the present invention.

A thin film transistor 1431 illustrated in FIG. 35A is an example having a structure in which a conductive layer 1409 is provided to overlap with the gate electrode layer 1401 and a channel region of the oxide semiconductor layer 1403 with the channel protective layer 1418 and an insulating layer 1407 interposed therebetween.

FIG. 35A is a cross-sectional view of the thin film transistor 1431 included in a semiconductor device. The thin film transistor 1431 is a bottom gate thin film transistor and includes, over the substrate 1400 having an insulating surface, the gate electrode layer 1401, the gate insulating layer 1402, the oxide semiconductor layer 1403, the source electrode layer 1405a, the drain electrode layer 1405b, the insulating layer 1407, and the conductive layer 1409. The conductive layer 1409 is provided to overlap with the gate electrode layer 1401 with the insulating layer 1407 interposed therebetween.

The conductive layer 1409 can be formed using a material similar to that of the gate electrode layer 1401, the source electrode layer 1405a, or the drain electrode layer 1405b by a method similar thereto. In the case of providing a pixel electrode layer, the conductive layer 1409 may be formed using a material similar to that of the pixel electrode layer by a method similar thereto. In this embodiment, a stack of a titanium film, an aluminum film, and a titanium film is used as the conductive layer 1409.

The conductive layer 1409 may have the same potential as the gate electrode layer 1401 or have potential different from that of the gate electrode layer 1401 and can function as a second gate electrode layer. Further, the conductive layer 1409 may be in a floating state.

In addition, by providing the conductive layer 1409 in a portion overlapping with the oxide semiconductor layer 1403, in a bias-temperature stress test (hereinafter, referred to as a BT test) for examining reliability of a thin film transistor, the amount of shift in threshold voltage of the thin film transistor 1431 between before and after the BT test can be made smaller.

Figure 35B:
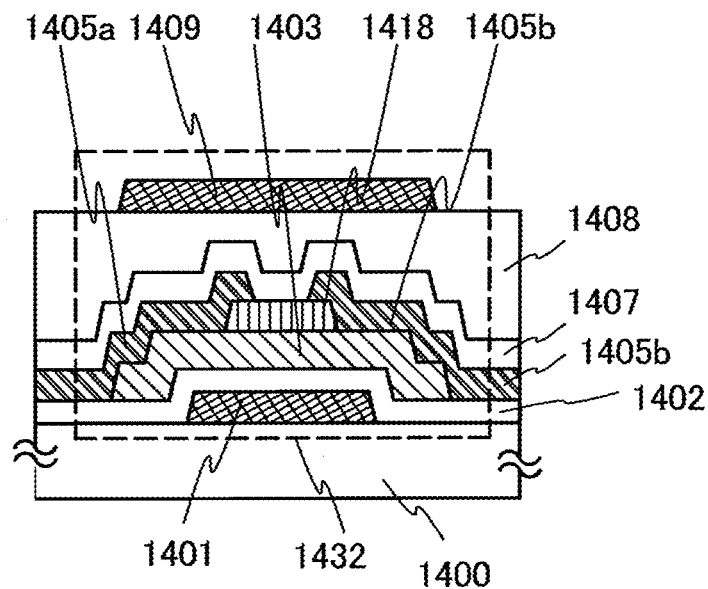

FIG. 35B illustrates an example partly different from FIG. 35A. The same portion and a step as, or a portion having function similar to those illustrated in FIG. 35A can be made in a manner similar to that illustrated in FIG. 35A; therefore, repetitive description is omitted.

A thin film transistor 1432 illustrated in FIG. 35B is an example having a structure in which the conductive layer 1409 is provided to overlap with the gate electrode layer 1401 and a channel region of the oxide semiconductor layer 1403 with the channel protective layer 1418, the insulating layer 1407, and an insulating layer 1408 interposed between the conductive layer 1409 and the gate electrode layer 1401.

In FIG. 35B, the insulating layer 1408 functioning as a planarization film is stacked over the insulating layer 1407.

The conductive layer 1409 is provided in a portion overlapping with the oxide semiconductor layer 1403 in the structure of FIG. 35B similar to FIG. 35A, whereby in a bias-temperature stress test for examining reliability of a thin film transistor, the amount of shift in threshold voltage of the thin film transistor 1432 between before and after the BT test can be reduced.

This embodiment can be implemented in appropriate combination with any of the structures described in the other embodiments.

(Embodiment 11)

In this embodiment, an example of a structure which is partly different from that of Embodiment 1 will be described with reference to FIG. 36. The same portion as or a portion having a function similar to that described in Embodiment 1 can be formed in a manner similar to that described in Embodiment 1, and also the steps similar to those of Embodiment 1 can be performed in a manner similar to those described in Embodiment 1; therefore, repetitive description is omitted.

Figure 36:
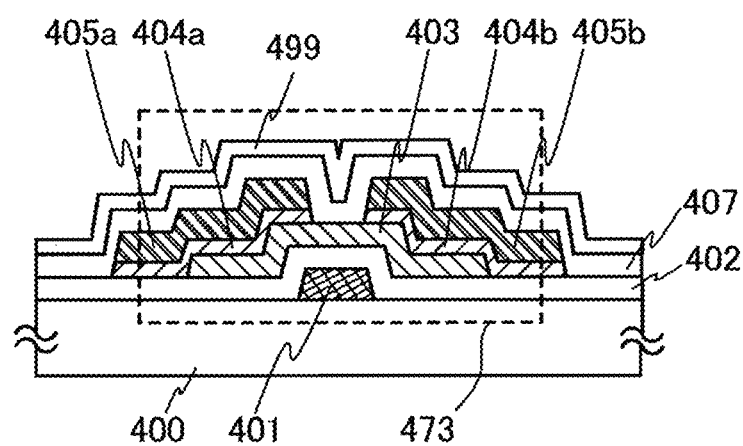
FIG. 36 illustrates a semiconductor device of an embodiment of the present invention.
Figure 37:
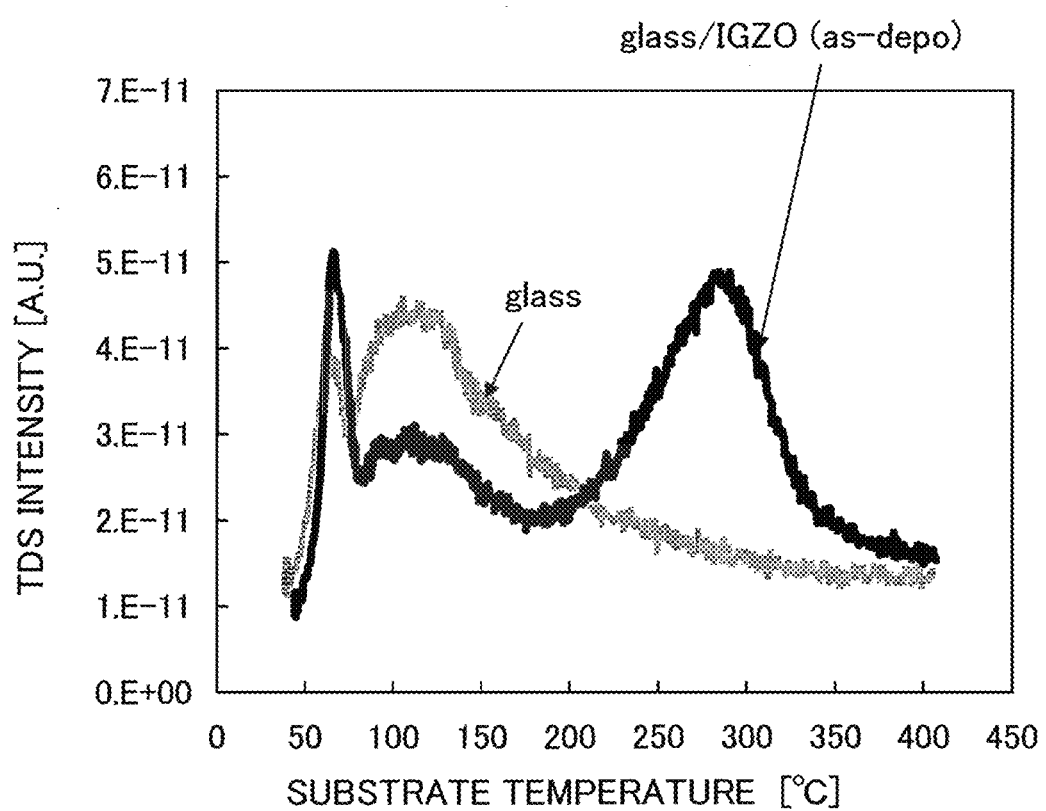
FIG. 37 is a graph illustrating TDS measurement results.

An example is described in which a source region (also referred to as an $N^+$ layer or a buffer layer) is provided between the oxide semiconductor layer 403 and the source electrode layer, and the drain region (also referred to as an $N^+$ layer or a buffer layer) is provided between the oxide semiconductor layer and the drain electrode layer, in the structure illustrated in FIG. 36. For example, an oxide semiconductor layer having an n-type conductivity is used for the source region and the drain region. In this embodiment, the source or drain regions 404a and 404b are formed using an In—Ga—Zn—O-based film.

In addition, in the case where an oxide semiconductor layer is used for the source or drain regions 404a and 404b of a thin film transistor 473, the oxide semiconductor layer is preferably thinner than the oxide semiconductor layer 403 used for a channel formation region and preferably has higher conductivity (electrical conductivity) than the oxide semiconductor layer 403.

Further, an oxide conductive layer may be formed as source or drain regions between the oxide semiconductor layer and the source and drain electrode layers. The oxide conductive layer and a metal layer for forming the source and drain electrodes can be formed in succession.

When the oxide conductive layer is provided as the source region and the drain region between the oxide semiconductor layer and the source and drain electrode layers, the source region and the drain region can have lower resistance and the transistor can operate at high speed. It is effective to use the oxide conductive layers for a source region and a drain region in order to improve frequency characteristics of a peripheral circuit (a driver circuit). This is because the contact between a metal electrode (e.g., Ti) and an oxide conductive layer can reduce the contact resistance as compared with the contact between a metal electrode (e.g., Ti) and an oxide semiconductor layer.

In this embodiment, after an oxide semiconductor film is processed into an island-shaped oxide semiconductor layer, heat treatment is performed on the oxide semiconductor layer at 200° C. to 700° C., preferably at 350° C. to 700° C., still preferably at 450° C. to 700° C. in a nitrogen atmosphere or an inert gas atmosphere such as a rare gas (e.g., argon or helium) or under reduced pressure. After that, cooling is performed in an atmosphere of oxygen, an atmosphere of oxygen and nitrogen, or the air (having a dew point of preferably lower than or equal to −40° C., still preferably lower than or equal to −50° C.) atmosphere. An oxide semiconductor layer is subjected to heat treatment in the atmosphere and cooling in the atmosphere, whereby the oxide semiconductor layer can be subjected to dehydration or dehydrogenation treatment and treatment for supplying oxygen. Thus, a high-purity oxide semiconductor layer which is electrically i-type (intrinsic) can be obtained. In this manner, the oxide semiconductor layer 403 can be formed.

Further, after the insulating layer 407 is formed, the thin film transistor 473 may be subjected to heat treatment (preferably at a temperature higher than or equal to 150° C. and lower than 350° C.) in a nitrogen atmosphere or an air atmosphere (in the air). For example, the heat treatment is performed at 250° C. in a nitrogen atmosphere for one hour. By the heat treatment, the oxide semiconductor layer 403 is heated while being in contact with the insulating layer 407. Thus, variation in electric characteristics of the thin film transistor 470 can be reduced.

This embodiment can be implemented in appropriate combination with any of the structures described in the other embodiments.

(Embodiment 12)

Figure 23:
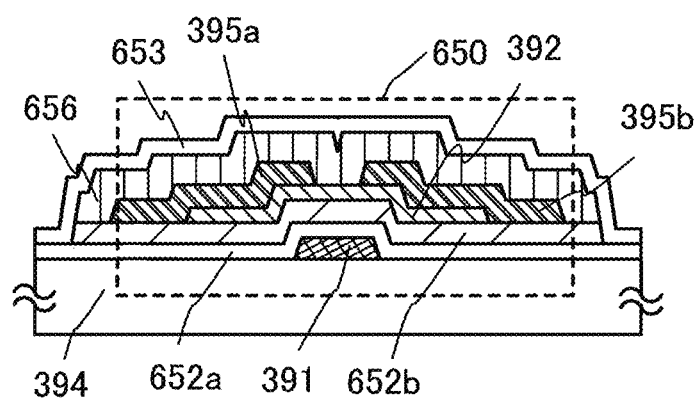
FIG. 23 illustrates a semiconductor device.

This embodiment describes an example in which an oxide semiconductor layer is surrounded by nitride insulating layers when seen in cross section with reference to FIG. 23. A thin film transistor illustrated in FIG. 23 is the same as the thin film transistor described in Embodiment 1 except for the shape of a top surface and a position of an end portion of the oxide insulating layer, and the structure of the gate insulating layer. Therefore, the same portion as or a portion having a function similar to that described in Embodiment 1 can be formed in a manner similar to that described in Embodiment 1, and also the steps similar to those of Embodiment 1 can be performed in a manner similar to those described in Embodiment 1; therefore, repetitive description is omitted.

A thin film transistor 650 illustrated in FIG. 23 is a bottom-gate thin film transistor and includes, over a substrate 394 having an insulating surface, a gate electrode layer 391, a gate insulating layer 652a formed using a nitride insulating layer, a gate insulating layer 652b formed using an oxide insulating layer, an oxide semiconductor layer 392, a source electrode layer 395a, and a drain electrode layer 395b. In addition, the thin film transistor 650 is covered with an oxide insulating layer 656 in contact with the oxide semiconductor layer 392. A protective insulating layer 653 formed using a nitride insulating layer is further provided over the oxide insulating layer 656. The protective insulating layer 653 is in contact with the gate insulating layer 652a formed using a nitride insulating layer.

In the thin film transistor 650 in this embodiment, the gate insulating layer has a stacked-layer structure in which the nitride insulating layer and the oxide insulating layer are stacked over the gate electrode layer. Further, before the protective insulating layer 653 which is formed using a nitride insulating layer is formed, the oxide insulating layer 656 and the gate insulating layer 652b are selectively removed to expose the gate insulating layer 652a which is formed using a nitride insulating layer.

At least the area of the top surface of the oxide insulating layer 656 and that of the top surface of the gate insulating layer 652b are larger than that of the top surface of the oxide semiconductor layer 392, and the top surface of the oxide insulating layer 656 and the top surface of the gate insulating layer 652b preferably cover the thin film transistor 650.

Further, the protective insulating layer 653 which is a nitride insulating layer covers the top surface of the oxide insulating layer 656 and the side surfaces of the oxide insulating layer 656 and the gate insulating layer 652b, and is in contact with the gate insulating layer 652a formed using a nitride insulating layer.

For the protective insulating layer 653 and the gate insulating layer 652a which are each formed using a nitride insulating layer, an inorganic insulating film which does not contain impurities such as moisture, a hydrogen ion, and OH⁻ and blocks entry of impurities from the outside is used: for example, a silicon nitride film, a silicon oxynitride film, an aluminum nitride film, or an aluminum oxynitride film obtained by a sputtering method or a plasma CVD method is used.

In this embodiment, as the protective insulating layer 653 formed using a nitride insulating layer, a silicon nitride layer having a thickness of 100 nm is formed by an RF sputtering method so as to cover the bottom surface, the top surface, and the side surfaces of the oxide semiconductor layer 392.

With the structure illustrated in FIG. 23, impurities such as hydrogen, moisture, hydroxyl, or hydride in the oxide semiconductor layer are reduced by the gate insulating layer 652b and the oxide insulating layer 656 which are provided to surround and be in contact with the oxide semiconductor layer, and entry of moisture from the outside in a manufacturing process after formation of the protective insulating layer 653 can be prevented because the oxide semiconductor layer is surrounded by the gate insulating layer 652a and the protective insulating layer 653 which are each formed using a nitride insulating layer. Moreover, the entry of moisture from the outside can be prevented in the long term even after the device is completed as a touch panel, for example, as a display device; thus, the long-term reliability of the device can be improved.

In this embodiment, the structure in which one thin film transistor is surrounded by nitride insulating layers is described; however, one embodiment of the present invention is not limited this structure. A plurality of thin film transistors may be surrounded by nitride insulating layers, or a plurality of thin film transistors in a pixel portion may be collectively surrounded by nitride insulating layers. A region where the protective insulating layer 653 and the gate insulating layer 652a are in contact with each other may be formed so that at least the periphery of the pixel portion of the active matrix substrate is surrounded.

This embodiment can be implemented in appropriate combination with any of the other embodiments.

(Embodiment 13)

In this embodiment, an example will be described below in which at least a part of a driver circuit and a thin film transistor to be disposed in a pixel portion are formed over one substrate.

The thin film transistor to be disposed in the pixel portion can be formed according to any of Embodiments 1 to 4. Further, the thin film transistor described in any of Embodiments 1 to 10 is an n-channel TFT. Thus, a part of a driver circuit that can be formed using n-channel TFTs among driver circuits is formed over the same substrate as that for the thin film transistor of the pixel portion.

Figure 19A:
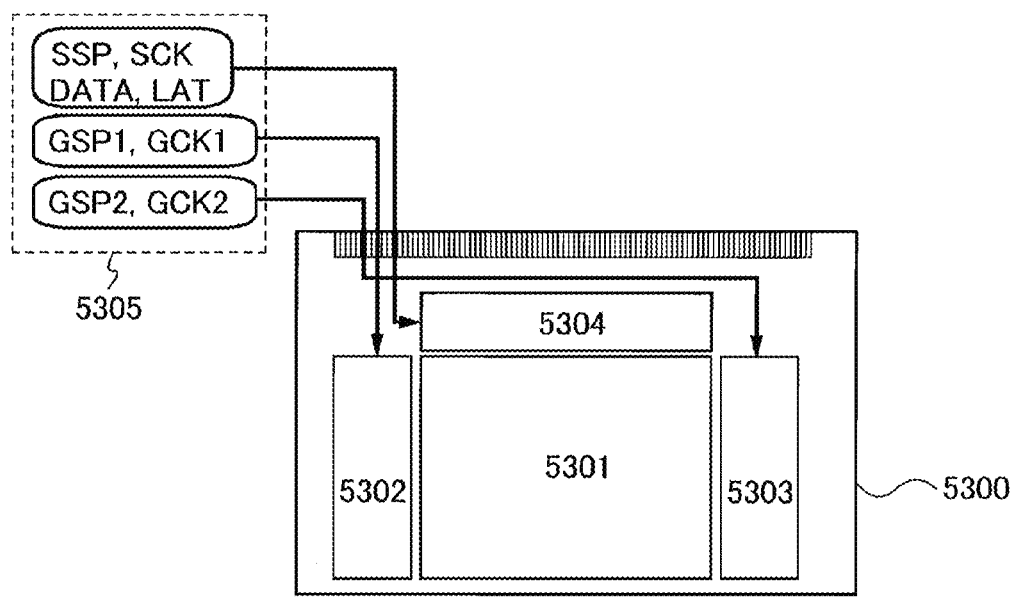
FIGS. 19A and 19B are block diagrams illustrating a semiconductor device.

FIG. 19A is an example of a block diagram of an active matrix display device. A pixel portion 5301, a first scan line driver circuit 5302, a second scan line driver circuit 5303, and a signal line driver circuit 5304 are formed over a substrate 5300 of the display device. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that pixels which include display elements are provided in a matrix in respective regions where the scan lines and the signal lines intersect with each other. Further, the substrate 5300 in the display device is connected to a timing control circuit 5305 (also referred to as a controller or a controller IC) through a connection portion such as a Flexible Printed Circuit (FPC).

In FIG. 19A, the first scan line driver circuit 5302, the second scan line driver circuit 5303, and the signal line driver circuit 5304 are formed over the same substrate 5300 as the pixel portion 5301. Accordingly, the number of components of a driver circuit or the like which is provided outside and the like are reduced, so that reduction in cost can be achieved. Further, if the driver circuit is provided outside the substrate 5300, wiring would need to be extended and the number of wiring connections would be increased, but if the driver circuit is provided over the substrate 5300, the number of wiring connections can be reduced. Consequently, improvement in reliability and yield can be achieved.

Note that as an example, the timing control circuit 5305 supplies a first scan line driver circuit start signal (GSP1) and a scan line driver circuit clock signal (GCK1) to the first scan line driver circuit 5302. The timing control circuit 5305 supplies, for example, a second scan line driver circuit start signal (GSP2) (also referred to as a start pulse) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Note that each clock signal may be a plurality of clock signals whose periods are different or may be supplied together with an inverted clock signal (CKB). Note that one of the first scan line driver circuit 5302 and the second scan line driver circuit 5303 can be omitted.

Figure 19B:
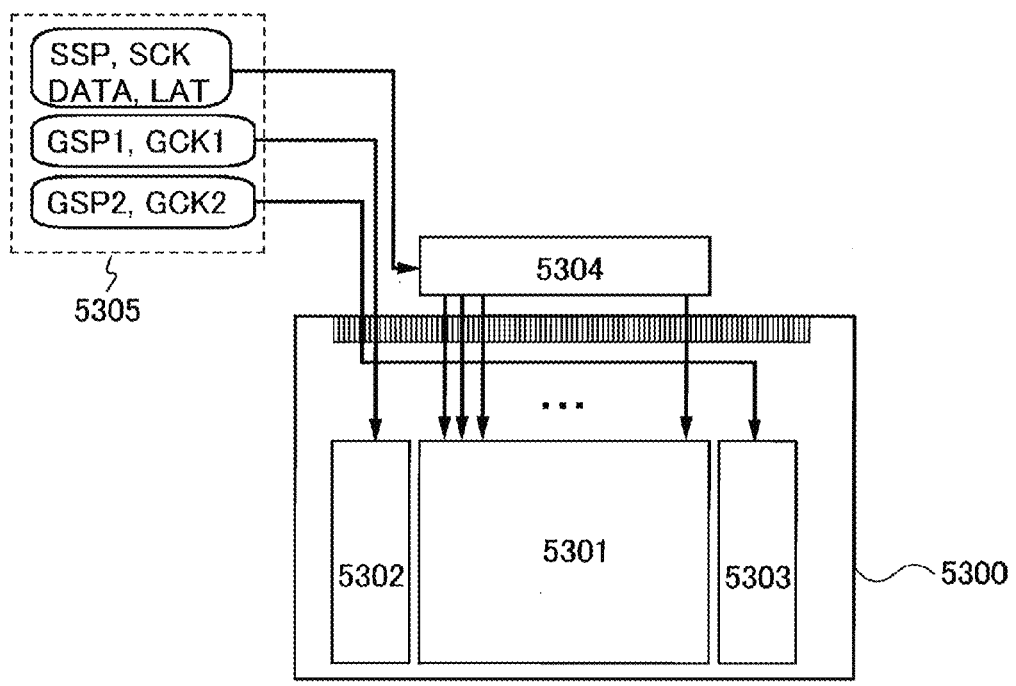

FIG. 19B illustrates a structure in which circuits each with a low drive frequency (e.g., the first scan line driver circuit 5302 and the second scan line driver circuit 5303) are formed over the substrate 5300 provided with the pixel portion 5301, and the signal line driver circuit 5304 is formed over another substrate which is different from the substrate provided with the pixel portion 5301. With this structure, a driver circuit formed over the substrate 5300 can be constituted by using thin film transistors with lower field-effect mobility as compared to that of a transistor formed using a single crystal semiconductor. Accordingly, increase in the size of the display device, reduction in the number of steps, reduction in cost, improvement in yield, or the like can be achieved.

Figure 20A:
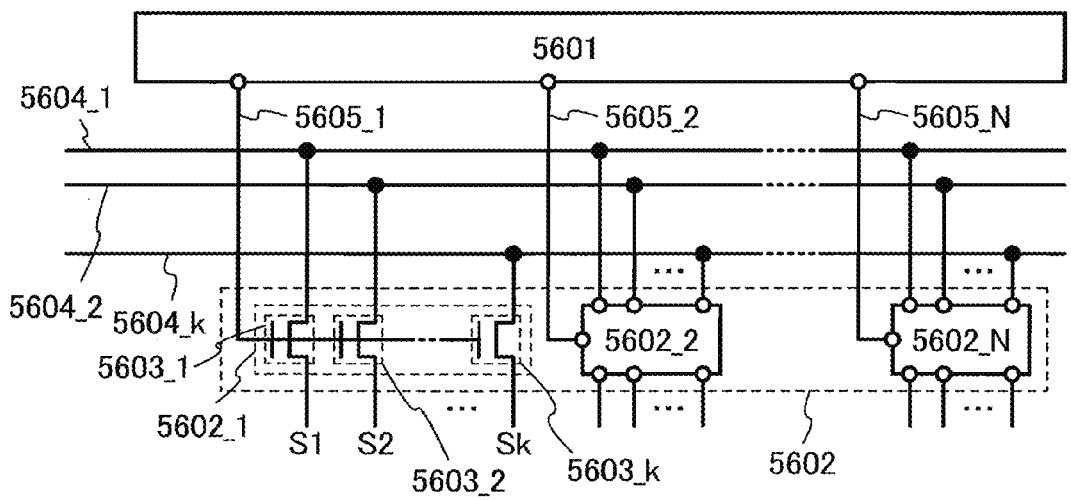
FIGS. 20A and 20B illustrate a structure of a signal line driver circuit.
Figure 20B:
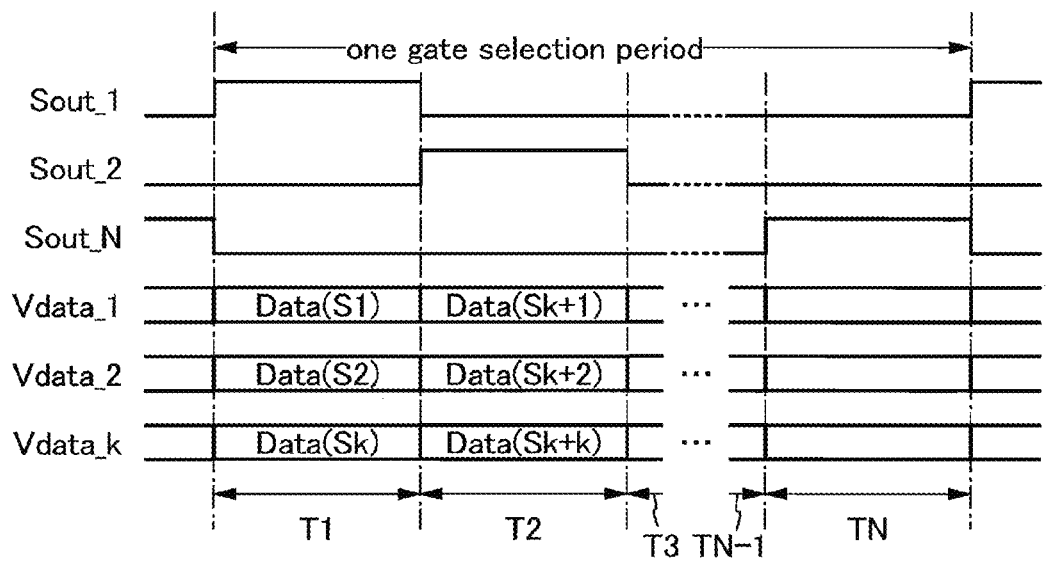

The thin film transistors described in Embodiments 1 to 10 are n-channel TFTs. In FIGS. 20A and 20B, an example of a structure and operation of a signal line driver circuit formed using an n-channel TFT is described.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_k (k is a natural number). A case in which the thin film transistors 5603_1 to 5603_k are n-channel TFTs will be exemplified.

A connection relation of the signal line driver circuit will be described by using the switching circuit 5602_1 as an example. First terminals of the thin film transistors 5603_1 to 5603_k are connected to wirings 5604_1 to 5604_k, respectively. Second terminals of the thin film transistors 5603_1 to 5603_k are connected to signal lines S1 to Sk, respectively. Gates of the thin film transistors 5603_1 to 5603_k are connected to a wiring 5604_1.

The shift register 5601 has a function of outputting an H level signal (also referred to as an H signal or a high power supply potential level) to the wirings 5605_1 to 5605_N in order and selecting the switching circuits 5602_1 to 5602_N in order.

The switching circuit 5602_1 has a function of controlling electrical continuity between the wirings 5604_1 to 5604_k and the signal lines S1 to Sk (electrical continuity between the first terminal and the second terminal), namely a function of controlling whether or not to supply potentials of the wirings 5604_1 to 5604_k to the signal lines S1 to Sk. As thus described, the switching circuit 5602_1 functions as a selector. Further, the thin film transistors 5603_1 to 5603_k each have a function of controlling electrical continuity between the wirings 5604_1 to 5604_k and their respective signal lines S1 to Sk, that is, a function of supplying potentials of the wirings 5604_1 to 5604_k to their respective signal lines S1 to Sk. In this manner, each of the thin film transistors 5603_1 to 5603_k functions as a switch.

Note that video signal data (DATA) is inputted to each of the wirings 5604_1 to 5604_k. The video signal data (DATA) is an analog signal corresponding to image data or image signals in many cases.

Next, the operation of the signal line driver circuit in FIG. 20A is described with reference to a timing chart in FIG. 20B. FIG. 20B illustrates examples of signals Sout_1 to Sout_N and signals Vdata_1 to Vdata_k. The signals Sout_1 to Sout_N are examples of output signals of the shift register 5601, and the signals Vdata_1 to Vdata_k are examples of signals which are input to the wirings 5604_1 to 5604_k. Note that one operation period of the signal line driver circuit corresponds to one gate selection period in a display device. For example, one gate selection period is divided into periods T1 to TN. The periods T1 to TN are periods for writing video signal data (DATA) to the pixels which belong to a selected row.

In the periods T1 to TN, the shift register 5601 sequentially outputs H level signals to the wirings 5605_1 to 5605_N. For example, in the period T1, the shift register 5601 outputs an H level signal to the wiring 5605_1. Then, the thin film transistors 5603_1 to 5603_k are turned on, so that the wirings 5604_1 to 5604_k and the signal lines S1 to Sk have electrical continuity. In this case, Data (S1) to Data (Sk) are input to the wirings 5604_1 to 5604_k, respectively. The Data (S1) to Data (Sk) are input to pixels in a selected row in a first to k-th columns through the thin film transistors 5603_1 to 5603_k, respectively. Thus, in the periods T1 to TN, video signal data (DATA) is sequentially written to the pixels in the selected row of every k columns.

By writing video signal data (DATA) to pixels of every plurality of columns, the number of video signal data (DATA) or the number of wirings can be reduced. Thus, connections to an external circuit can be reduced. By writing video signals to pixels of every plurality of columns, writing time can be extended and insufficient of writing of video signals can be prevented.

Note that a circuit including the thin film transistor described in any of Embodiments 1 to 10 can be used as the shift register 5601 and the switching circuit 5602. In this case, all transistors included in the shift register 5601 can be formed to have only either N-channel or P-channel.

Described next is constitution of a scan line driver circuit. The scan line driver circuit includes a shift register. The scan line driver circuit may also include a level shifter, a buffer, or the like in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can supply a large current is used.

An embodiment of a shift register which is used for part of a scan line driver circuit and/or a signal line driver circuit will be described with reference to FIGS. 21A to 21D and FIGS. 22A and 22B.

The shift register in the scan line driver circuit and/or the signal line driver circuit is described with reference to FIGS. 21A to 21D and FIGS. 22A and 22B. The shift register includes first to N-th pulse output circuits 10_1 to 10_N (N is a natural number of 3 or more) (see FIG. 21A). A first clock signal CK1 from a first wiring 11, a second clock signal CK2 from a second wiring 12, a third clock signal CK3 from a third wiring 13, and a fourth clock signal CK4 from a fourth wiring 14 are supplied to the first to N-th pulse output circuits 10_1 to 10_N of the shift register illustrated in FIG. 21A. A start pulse SP1 (a first start pulse) from a fifth wiring 15 is input to the first pulse output circuit 10_1. To the n-th pulse output circuit 10_n of the second or subsequent stage (n is a natural number greater than or equal to 2 and less than or equal to N), a signal from the pulse output circuit of the preceding stage (such a signal is referred to as a preceding-stage signal OUT(n−1)) (n is a natural number greater than or equal to 2) is input. A signal from the third pulse output circuit 10_3 which is two stages after the first pulse output circuit 10_1 is input to the first pulse output circuit 10_1. In a similar manner, to the n-th pulse output circuit 10_n of the second or subsequent stage, a signal from the (n+2)-th pulse output circuit 10_(n+2) of the stage following the next stage (such a signal is referred to as a subsequent-stage signal OUT(n+2)) is input. Therefore, the pulse output circuits of the respective stages output first output signals (OUT(1)(SR) to OUT(N)(SR)) to be input to the pulse output circuit of the respective subsequent stage and/or the pulse output circuit of the stage before the previous stage and second output signals (OUT(1) to OUT(N)) to be electrically connected to another wiring or the like. Note that as illustrated in FIG. 21A, the subsequent-stage signal OUT(n+2) is not input to last two stages of the shift register; as an example, a second start pulse SP2 and a third start pulse SP3 may be additionally input to the last two stages of the shift register from a sixth wiring 16 and a seventh wiring 17, respectively. Alternatively, a signal that is additionally generated inside the shift register may be used. For example, an (n+1)-th pulse output circuit 10_(n+1) and an (n+2)-th pulse output circuit 10_(n+2) which do not contribute to pulse output to the pixel portion (such circuits are also referred to as dummy stages) may be provided so that signals corresponding to the second start pulse (SP2) and the third start pulse (SP3) are generated in the dummy stages.

Note that a clock signal (CK) is a signal which alternates between an H level and an L level (also referred to as an L signal or a signal at a low power supply potential level) at regular intervals. The first to the fourth clock signals (CK1) to (CK4) are delayed by ¼ period sequentially (i.e., they are 90° out of phase with each other). In this embodiment, by using the first to fourth clock signals (CK1) to (CK4), control of driving of a pulse output circuit or the like is performed. Note that the clock signal is also called GCLK or SCLK in accordance with a driver circuit to which the clock signal is input; however, description is made using CK as the clock signal. In this embodiment mode, by using the first to fourth clock signals (CK1) to (CK4), control or the like of driving of a pulse output circuit is performed.

Although the clock signal is used as a GCK or an SCK in accordance with a driver circuit to which the clock signal is input, the clock signal is described as a CK here.

A first input terminal 21, a second input terminal 22, and a third input terminal 23 are electrically connected to any of the first to fourth wirings 11 to 14. For example, in FIG. 21A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. The first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Each of the first to N-th pulse output circuits 10_1 to 10_N includes the first input terminal 21, the second input terminal 22, the third input terminal 23, the fourth input terminal 24, a fifth input terminal 25, a first output terminal 26, and a second output terminal 27 (see FIG. 21B). In the first pulse output circuit 10_1, the first clock signal CK1 is input to the first input terminal 21, the second clock signal CK2 is input to the second input terminal 22, the third clock signal CK3 is input to the third input terminal 23, the start pulse is input to the fourth input terminal 24, the subsequent-stage signal OUT(3) is input to the fifth input terminal 25, the first output signal OUT(1)(SR) is output from the first output terminal 26, and the second output signal OUT(1) is output from the second output terminal 27.

Next, an example of a specific circuit configuration of the pulse output circuit is described with reference to FIG. 21D.

The first pulse output circuit 10_1 includes first to eleventh transistors 31 to 41 (see FIG. 21D). Signals or power supply potentials are supplied to the first to eleventh transistors 31 to 41 from a power supply line 51 to which a first high power supply potential VDD is supplied, a power supply line 52 to which a second high power supply potential VCC is supplied, and a power supply line 53 to which a low power supply potential VSS is supplied, in addition to the above first to fifth input terminals 21 to 25 and the first and second output terminals 26 and 27. The relation of the power supply potentials of the power supply lines in FIG. 21D is as follows: first high power supply potential VDD>second high power supply potential VCC>low power supply potential VSS. Note that the first to fourth clock signals (CK1) to (CK4) are each a signal which alternates between an H level and an L level at regular intervals; the clock signal at the H level is VDD, and the clock signal at the L level is VSS. Note that when the potential VCC of the power supply line 52 is set to be lower than the potential VDD of the power supply line 51, a potential applied to the gate electrode of the transistor can be reduced without affecting the operation; thus, the shift of the threshold value of the transistor can be reduced and deterioration can be suppressed.

In FIG. 21D, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34.

In FIG. 21D, a portion where the gate electrode of the third transistor 33, the gate electrode of the tenth transistor 40, and the second terminal of the ninth transistor 39 are connected is referred to as a node A. In addition, a portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node B (see FIG. 22A).

Figure 22A:
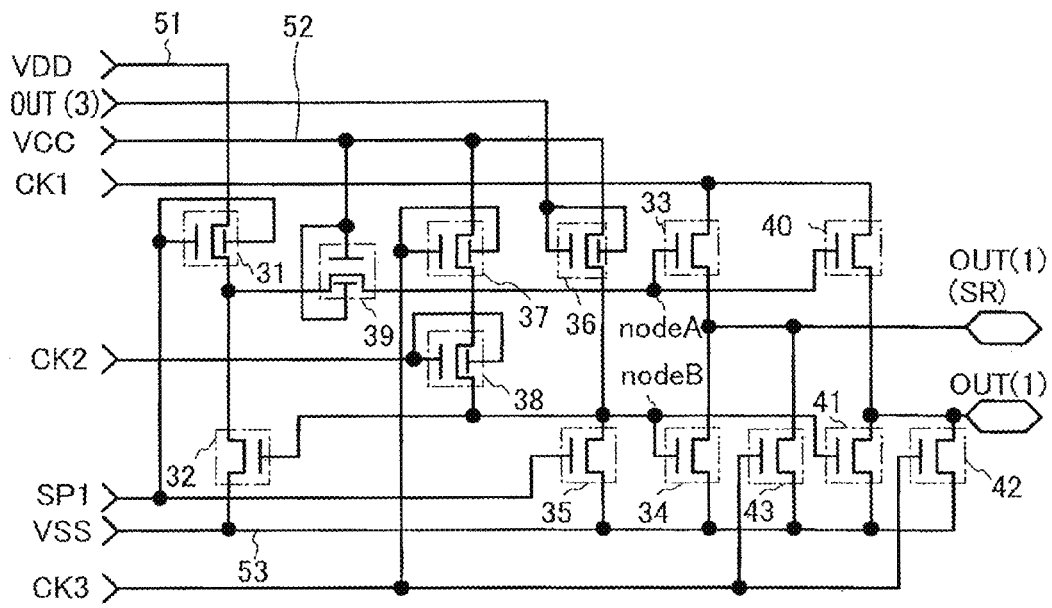
FIGS. 22A and 22B are a circuit diagram and a timing chart illustrating operation of a shift register.

In FIG. 22A, signals which are input to or output from the first to the fifth input terminals 21 to 25, the first output terminal 26, and the second output terminal 27 when the pulse output circuit illustrated in FIG. 21D is applied to the first pulse output circuit 10_1 are illustrated.

Specifically, the first clock signal CK1 is input to the first input terminal 21, the second clock signal CK2 is input to the second input terminal 22, the third clock signal CK3 is input to the third input terminal 23, the start pulse is input to the fourth input terminal 24, the subsequent-stage signal OUT (3) is input to the fifth input terminal 25, the first output signal OUT(1)(SR) is output from the first output terminal 26, and the second output signal OUT(1) is output from the second output terminal 27.

Note that a thin film transistor is an element having at least three terminals of a gate, a drain, and a source. The thin film transistor has a semiconductor in which a channel region is formed in a region overlapping with the gate, and current which flows between the drain and the source through the channel region can be controlled by controlling the potential of the gate. Here, since the source and the drain of the thin film transistor may interchange depending on the structure, the operating conditions, or the like of the thin film transistor, it is difficult to determine which is the source and which is the drain. Therefore, a region functioning as a source or a drain is not called the source or the drain in some cases. In that case, for example, such regions may be referred to as a first terminal and a second terminal.

Figure 22B:
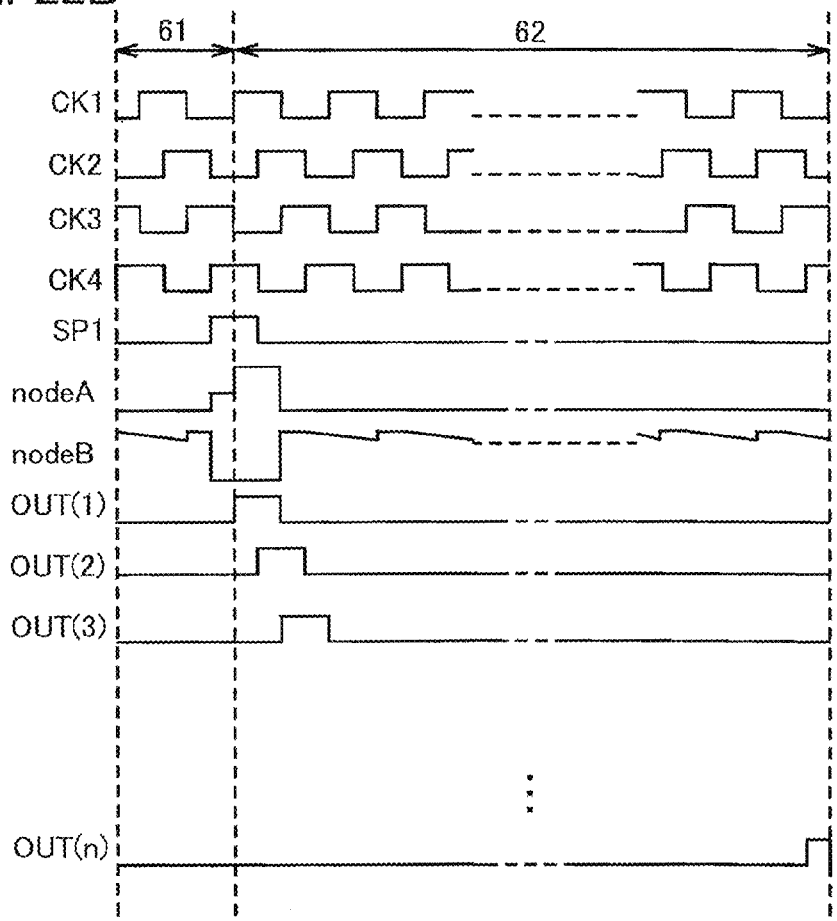

Here, FIG. 22B is a timing chart of the shift register including the plurality of pulse output circuits illustrated in FIG. 22A. Note that when the shift register is included in a scan line driver circuit, a period 61 and a period 62 in FIG. 22B correspond to a vertical retrace period and a gate selection period, respectively.

Note that as illustrated in FIG. 22A, by providing the ninth transistor 39 whose gate is supplied with the second power supply potential VCC, advantages described below are obtained before and after a bootstrap operation.

Without the ninth transistor 39 whose gate is supplied with the second power supply potential VCC, if the potential of the node A is raised by the bootstrap operation, the potential of a source which is the second terminal of the first transistor 31 increases to a value higher than the first power supply potential VDD. Then, the source of the first transistor 31 is switched to the first terminal, that is, the terminal on the power supply line 51 side. Therefore, in the first transistor 31, large bias voltage is applied and thus significant stress is applied between the gate and the source and between the gate and the drain, which can cause deterioration of the transistor. By providing the ninth transistor 39 whose gate is supplied the second power supply potential VCC, the potential of the node A is raised by the bootstrap operation, but increase in the potential of the second terminal of the first transistor 31 can be prevented. In other words, by providing the ninth transistor 39, negative bias voltage applied between the gate and the source of the first transistor 31 can be reduced. Accordingly, with the circuit configuration of this embodiment, negative bias voltage applied between the gate and the source of the first transistor 31 can be reduced, so that deterioration in the first transistor 31 due to stress can further be suppressed.

Note that the ninth transistor 39 is provided so as to be connected between the second terminal of the first transistor 31 and the gate of the third transistor 33 through the first terminal and the second terminal thereof. When the shift register including a plurality of the pulse output circuits described in this embodiment is used, in a signal line driver circuit having more stages than a scan line driver circuit, the ninth transistor 39 may be omitted, which is advantageous in that the number of transistors is reduced.

When an oxide semiconductor is used for semiconductor layers of the first to eleventh transistor 31 to 41, off current of the thin film transistor can be reduced, on current and field effect mobility can be increased, and the degree of deterioration can be decreased; thus a malfunction in a circuit can be reduced. The degree of deterioration of the transistor formed using an oxide semiconductor, which is caused by application of a high potential to the gate electrode, is small as compared to that of a transistor formed using amorphous silicon. Therefore, even when the first power supply potential VDD is supplied to a power supply line to which the second power supply potential VCC is supplied, similar operation can be performed, and the number of power supply lines which are provided in a circuit can be reduced, so that the circuit can be miniaturized.

Note that even if a wiring connection is changed so that the clock signal which is supplied to the gate electrode of the seventh transistor 37 from the third input terminal 23 and the clock signal which is supplied to the gate electrode of the eighth transistor 38 from the second input terminal 22 are a clock signal which is supplied to the gate electrode of the seventh transistor 37 from the second input terminal 22 and a clock signal which is supplied to the gate electrode of the eighth transistor 38 from the third input terminal 23, respectively, a similar effect can be obtained. Note that, in the shift register illustrated in FIG. 22A, after the seventh transistor 37 and the eighth transistor 38 are both turned on, the seventh transistor 37 is turned off and the eighth transistor 38 is still on, and then the seventh transistor 37 is still off and the eighth transistor 38 is turned off. Thus, fall in the potential of the node B, which is caused by fall in the potentials of the second input terminal 22 and the third input terminal 23, occurs twice because of fall in the potential of the gate electrode of the seventh transistor 37 and fall in the potential of the gate electrode of the eighth transistor 38. On the other hand, when states of the seventh transistor 37 and the eighth transistor 38 in the shift register illustrated in FIG. 22A is changed so that both the seventh transistor 37 and the eighth transistor 38 are on, then the seventh transistor 37 is on and the eighth transistor 38 is off, and then the seventh transistor 37 and the eighth transistor 38 are off, the number of falls in the potential of the node B, which is caused by fall in the potentials of the second input terminal 22 and the third input terminal 23, can be reduced to one time, which is caused by fall in the potential of the gate electrode of the eighth transistor 38. Therefore, the connection relation in which the clock signal CK3 is supplied from the third input terminal 23 to the gate electrode of the seventh transistor 37 and the clock signal CK2 is supplied from the second input terminal 22 to the gate electrode of the eighth transistor 38 is preferable. That is because the number of times of the change in the potential of the node B can be reduced, whereby the noise can be reduced.

In this manner, in a period during which the potentials of the first output terminal 26 and the second output terminal 27 are held at the L level, the H level signal is regularly supplied to the node B; accordingly, a malfunction of the pulse output circuit can be suppressed.

Through the process, a highly reliable display device as a semiconductor device can be manufactured.

This embodiment can be implemented in appropriate combination with any of the structures described in the other embodiments.

(Embodiment 14)

A thin film transistor is manufactured, and a semiconductor device having a display function (also referred to as a display device) can be manufactured using the thin film transistor in a pixel portion and further in a driver circuit. Further, part or whole of a driver circuit can be formed over the same substrate as the pixel portion, using a thin film transistor, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. An element substrate, which corresponds to an embodiment in which the display element has not been completed in a process for manufacturing the display device, is provided with a means for supplying current to the display element in each of a plurality of pixels. Specifically, the element substrate may be in a state provided only with a pixel electrode of the display element, a state after a conductive film to be a pixel electrode is formed and before the conductive film is etched to form the pixel electrode, or any of other states.

Note that a display device in this specification means an image display device, a display device, or a light source (including a lighting device). Further, the display device includes any of the following modules in its category: a module to which a connector such as a flexible printed circuit (FPC), tape automated bonding (TAB) tape, or a tape carrier package (TCP) is attached; a module having TAB tape or a TCP which is provided with a printed wiring board at the end thereof; and a module having an integrated circuit (IC) which is directly mounted on a display element by a chip on glass (COG) method.

The appearance and a cross section of a liquid crystal display panel, which is one embodiment of a semiconductor device, will be described with reference to FIGS. 15A to 15C. FIGS. 15A and 15C are plan views of panels in each of which thin film transistors 4010 and 4011 and a liquid crystal element 4013 are sealed between a first substrate 4001 and a second substrate 4006 with a sealant 4005. FIG. 15B is a cross-sectional view taken along line M-N in FIG. 15A or FIG. 15C.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 formed using a single crystal semiconductor film or a polycrystalline semiconductor film over a substrate separately prepared is mounted in a region different from the region surrounded by the sealant 4005 over the first substrate 4001.

Note that a connection method of the driver circuit which is separately formed is not particularly limited, and a COG method, a wire bonding method, a TAB method, or the like can be used. FIG. 15A illustrates an example of mounting the signal line driver circuit 4003 by a COG method, and FIG. 15C illustrates an example of mounting the signal line driver circuit 4003 by a TAB method.

The pixel portion 4002 and the scan line driver circuit 4004 provided over the first substrate 4001 each include a plurality of thin film transistors, and the thin film transistor 4010 included in the pixel portion 4002 and the thin film transistor 4011 included in the scan line driver circuit 4004 are illustrated as an example in FIG. 15B. Insulating layers 4041, 4042, and 4021 are provided over the thin film transistors 4010 and 4011.

Any of the thin film transistors of Embodiments 1 to 10 can be used as appropriate as the thin film transistors 4010 and 4011, and they can be formed using steps and materials similar to those for the thin film transistors of Embodiments 1 to 10. As dehydration or dehydrogenation treatment, heat treatment is performed in a nitrogen atmosphere or an inert gas atmosphere, or under reduced pressure, whereby moisture contained in a film is reduced. Then, as treatment for supplying oxygen, cooling is performed in an atmosphere of oxygen, an atmosphere of oxygen and nitrogen, or the air (having a dew point of preferably lower than or equal to −40° C., still preferably lower than or equal to −50° C.) atmosphere. The thus obtained oxide semiconductor film is used for the thin film transistors 4010 and 4011. Therefore, the thin film transistors 4010 and 4011 are highly reliable thin film transistors having stable electric characteristics.

A conductive layer 4040 is provided over the insulating layer 4021, so as to overlap with channel formation region of an oxide semiconductor layer in the thin film transistor 4011 in the driver circuit. The conductive layer 4040 is provided so as to overlap with the channel formation region of the oxide semiconductor layer, whereby the amount of change in the threshold voltage of the thin film transistor 4011 between before and after a BT test can be reduced. Further, the potential of the conductive layer 4040 may be the same as or different from that of a gate electrode layer of the thin film transistor 4011. The conductive layer 4040 can function also as a second gate electrode layer. Alternatively, the potential of the conductive layer 4040 may be GND or 0 V, or the conductive layer 4040 may be in a floating state.

In addition, a pixel electrode layer 4030 of the liquid crystal element 4013 is electrically connected to a source electrode layer or a drain electrode layer of the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 which function as alignment films, and the liquid crystal layer 4008 is sandwiched between the pixel electrode layer 4030 and the counter electrode layer 4031 with the insulating layers 4032 and 4033 therebetween.

Note that a light-transmitting substrate can be used as the first substrate 4001 and the second substrate 4006; glass, ceramics, or plastics can be used. As plastics, a fiberglass-reinforced plastics (FRP) plate, a polyvinyl fluoride (PVF) film, a polyester film, or an acrylic resin film can be used.

Reference numeral 4035 denotes a columnar spacer which is obtained by selective etching of an insulating film and is provided to control the distance between the pixel electrode layer 4030 and the counter electrode layer 4031 (a cell gap). Alternatively, a spherical spacer may also be used. In addition, the counter electrode layer 4031 is electrically connected to a common potential line formed over the same substrate as the thin film transistor 4010. With use of a common connection portion, the counter electrode layer 4031 and the common potential line can be electrically connected to each other through conductive particles arranged between a pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within a narrow range of temperature, liquid crystal composition containing a chiral agent at 5 wt % or more is used for the liquid crystal layer 4008 so as to improve the temperature range. The liquid crystal composition which includes a liquid crystal exibiting a blue phase and a chiral agent has a short response time of 1 msec or less and has optical isotropy. Thus, an alignment process is unneeded and viewing angle dependence is small. In addition, since an alignment film is not necessary provided, (and) rubbing treatment becomes unnecessary. Thus, electrostatic discharge damage caused by the rubbing treatment can be prevented and defects and damage of a liquid crystal display device can be reduced in a manufacturing process. Thus, productivity of the liquid crystal display device can be increased. A thin film transistor that uses an oxide semiconductor layer particularly has a possibility that electric characteristics of the thin film transistor may fluctuate significantly by the influence of static electricity and deviate from the designed range. Therefore, it is more effective to use a liquid crystal material exhibiting a blue phase for the liquid crystal display device including a thin film transistor that uses an oxide semiconductor layer.

Note that this embodiment can also be applied to a transflective liquid crystal display device in addition to a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of the manufacturing process. Further, a light-blocking film serving as a black matrix may be provided in a portion other than the display portion.

Over the thin film transistors 4011 and 4010, the insulating layer 4041 is formed in contact with the oxide semiconductor layer. The insulating layer 4041 may be formed using a material and a method similar to those of the insulating layer 407 described in Embodiment 1. In this embodiment, a silicon oxide layer is formed as the insulating layer 4041 by a sputtering method with reference to Embodiment 1. The protective insulating layer 4042 is formed on and in contact with the insulating layer 4041. The protective insulating layer 4042 can be formed in a manner similar to the protective insulating layer 499 described in Embodiment 1; for example, a silicon nitride layer can be used. In addition, in order to reduce the surface roughness due to the thin film transistors, the protective insulating layer 4042 is covered with the insulating layer 4021 functioning as a planarization insulating film.

The insulating layer 4021 is formed as the planarizing insulating film. As the insulating layer 4021, an organic material having heat resistance such as polyimide, acrylic, benzocyclobutene, polyamide, or epoxy can be used. In addition to such organic materials, it is also possible to use a low-dielectric constant material (low-k material), a siloxane-based resin, phosphosilicate glass (PSG), borophosphosilicate glass (BPSG), or the like. Note that the insulating layer 4021 may be formed by stacking a plurality of insulating films formed using these materials.

There is no particular limitation on the method for forming the insulating layer 4021, and the insulating layer 4021 can be formed, depending on a material thereof, by a method such as a sputtering method, a SOG method, spin coating, dipping, spray coating, or a droplet discharging method (e.g., an ink jet method, screen printing, or offset printing), or with a tool such as doctor knife, roll coater, curtain coater, or knife coater. The baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive high molecule can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

A connection terminal electrode 4015 is formed using the same conductive film as the pixel electrode layer 4030 included in the liquid crystal element 4013, and a terminal electrode 4016 is formed using the same conductive film as the source and drain electrode layers included in the thin film transistors 4010 and 4011.

The connection terminal electrode 4015 is electrically connected to a terminal included in the FPC 4018 through an anisotropic conductive film 4019.

Note that FIGS. 15A to 15C illustrate an example in which the signal line driver circuit 4003 is formed separately and mounted over the first substrate 4001; however, the structure is not limited thereto. The scan line driver circuit may be separately formed and then mounted, or only part of the signal line driver circuit or part of the scan line driver circuit may be separately formed and then mounted.

A black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem in that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Moreover, a driving technique so-called double-frame rate driving may be employed in which the vertical synchronizing frequency is 1.5 times or more, or twice or more as high as a conventional vertical synchronizing frequency, whereby the response speed is increased.

Further alternatively, in order to improve moving-image characteristics of a liquid crystal display device, a driving method may be employed, in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may also be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

Since a thin film transistor is easily broken due to static electricity or the like, a protective circuit is preferably provided additionally over the same substrate as the pixel portion or the driver circuit. The protective circuit is preferably formed using a non-linear element including an oxide semiconductor layer. For example, a protective circuit is provided between the pixel portion and a scan line input terminal and between the pixel portion and a signal line input terminal. In this embodiment, a plurality of protective circuits are provided so as to prevent breakage of a pixel transistor and the like when surge voltage due to static electricity or the like is applied to a scan line, a signal line, and a capacitor bus line. Therefore, the protective circuit is formed so as to release charge to a common wiring when surge voltage is applied to the protective circuit. Further, the protective circuit includes non-linear elements arranged in parallel to each other with the scan line therebetween. The non-linear element includes a two-terminal element such as a diode or a three-terminal element such as a transistor. For example, the non-linear element can be formed through the same steps as the thin film transistor provided in the pixel portion, and can be made to have the same properties as a diode by connecting a gate terminal to a drain terminal of the non-linear element.

Figure 25:
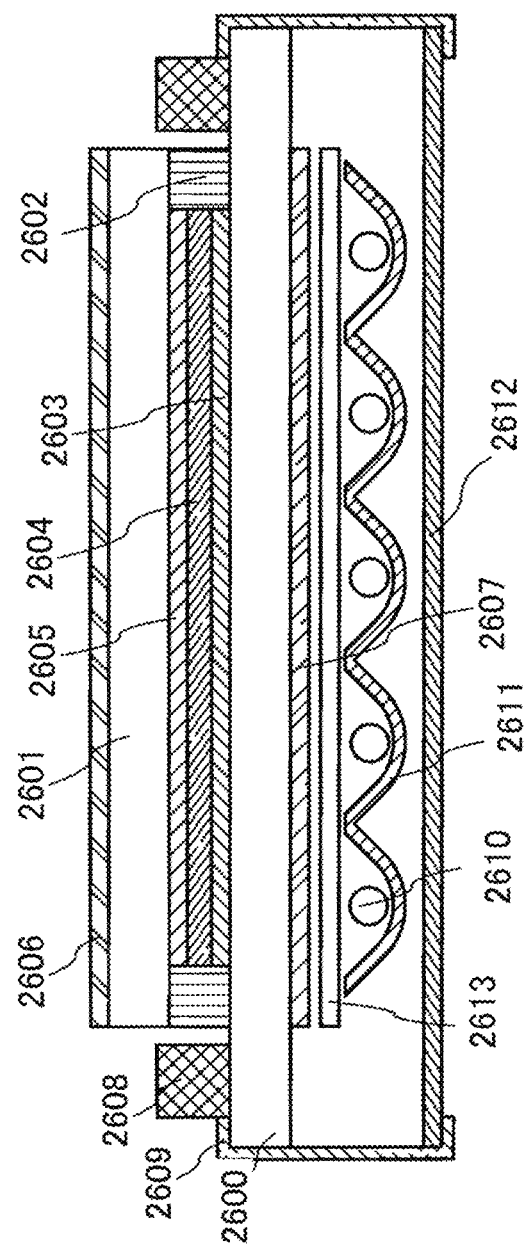
FIG. 25 illustrates a semiconductor device.

FIG. 25 illustrates an example in which a liquid crystal display module is formed as a semiconductor device using a TFT substrate 2600 which is manufactured according to the manufacturing method disclosed in this specification.

FIG. 25 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. In addition, the TFT substrate 2600 and the counter substrate 2601 are provided with a polarizing plate 2607 and a polarizing plate 2606, respectively. The coloring layer 2605 is necessary to perform color display. In the RGB system, coloring layers corresponding to colors of red, green, and blue are provided for pixels. The polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

Thus, there is no particular limitation on the semiconductor device disclosed in this specification, and a liquid crystal including a TN liquid crystal, an OCB liquid crystal, a STN liquid crystal, a VA liquid crystal, an ECB liquid crystal, a GH liquid crystal, a polymer dispersed liquid crystal, a discotic liquid crystal, or the like can be used. Above all, a normally black liquid crystal panel such as a transmissive liquid crystal display device utilizing a vertical alignment (VA) mode is preferable. Some examples are given as the vertical alignment mode. For example, a multi-domain vertical alignment (MVA) mode, a patterned vertical alignment (PVA) mode, an Advanced Super View (ASV) mode, and the like can be used.

The present invention can be applied to the VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Further, a method called multi-domain or multi-domain design, by which a pixel is divided into some regions (subpixels), and liquid crystal molecules are aligned in different directions in their respective regions, can be used.

With the above-mentioned structures, a highly reliable liquid crystal display panel as a semiconductor device can be manufactured.

This embodiment can be implemented in appropriate combination with any of the structures described in the other embodiments.

(Embodiment 15)

An example of electronic paper will be described as a semiconductor device.

The semiconductor device can be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region. The electrophoretic display does not require a polarizing plate and a counter substrate, which are necessary for a liquid crystal display device.

A solution in which the above microcapsules are dispersed in a solvent is referred to as electronic ink. This electronic ink can be printed on a surface of glass, plastic, cloth, paper, or the like. Color display is also possible with the use of a color filter or particles including a coloring matter.

In addition, if a plurality of the microcapsules are arranged as appropriate over an active matrix substrate so as to be interposed between two electrodes, an active matrix display device can be completed, and display can be performed by application of an electric field to the microcapsules. For example, the active matrix substrate obtained by the thin film transistors described in any of Embodiments 1 to 4 can be used.

Note that the first particles and the second particles in the microcapsules may be formed using a single material selected from a conductive material, an insulating material, a semiconductor material, a magnetic material, a liquid crystal material, a ferroelectric material, an electroluminescent material, an electrochromic material, and a magnetophoretic material, or formed using a composite material of any of these materials.

Figure 14:
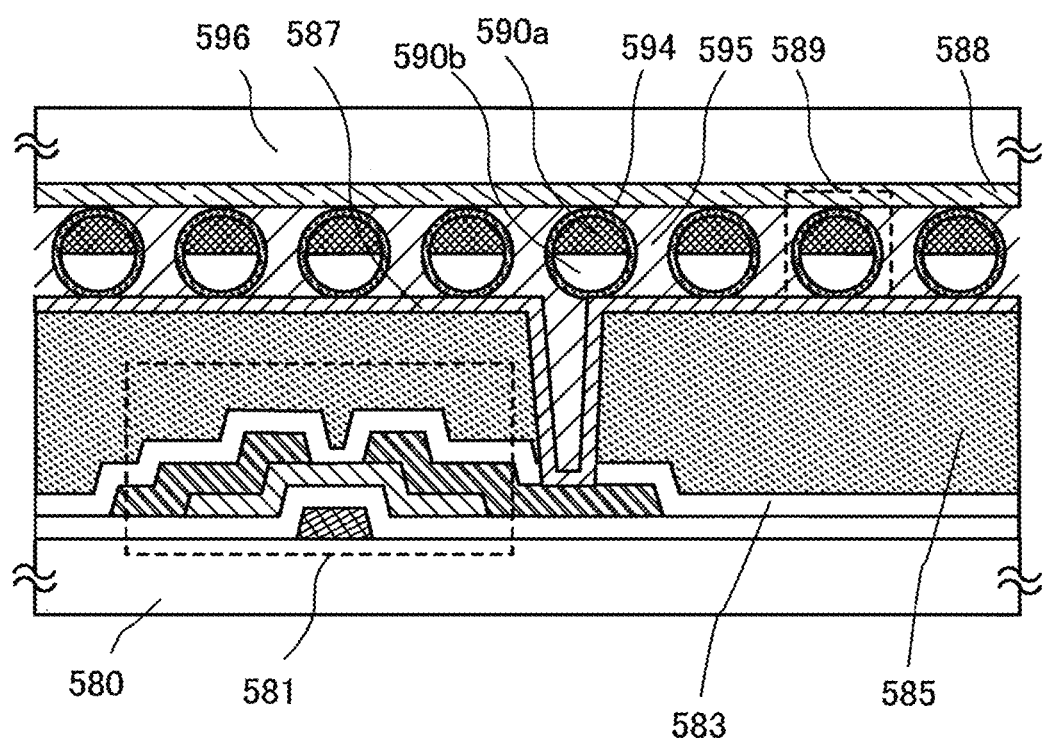
FIG. 14 illustrates a semiconductor device.

FIG. 14 illustrates active matrix electronic paper as an example of a semiconductor device. A thin film transistor 581 used in the semiconductor device can be manufactured in a manner similar to that of the thin film transistor described in Embodiment 1. The thin film transistor described in any of Embodiments 2 to 4 can also be used as the thin film transistor 581 of this embodiment.

As dehydration or dehydrogenation treatment, heat treatment is performed in a nitrogen atmosphere or an inert gas atmosphere, or under reduced pressure, whereby moisture contained in a film is reduced. Then, as treatment for supplying oxygen, cooling is performed in an atmosphere of oxygen, an atmosphere of oxygen and nitrogen, or the air (having a dew point of preferably lower than or equal to −40° C., still preferably lower than or equal to −50° C.) atmosphere. The thus obtained oxide semiconductor layer is used for the thin film transistor 581. Therefore, the thin film transistor 581 is a highly reliable thin film transistor having stable electric characteristics.

The electronic paper in FIG. 14 is an example of a display device using a twisting ball display system. The twisting ball display system employs a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 provided over a substrate 580 is a bottom-gate thin film transistor and is covered with an insulating film 583 which is in contact with the oxide semiconductor layer. A source or drain electrode layer of the thin film transistor 581 is in contact with a first electrode layer 587 through an opening formed in an insulating layer 585, whereby the thin film transistor 581 is electrically connected to the first electrode layer 587. Between the first electrode layer 587 and a second electrode layer 588, spherical particles 589 are provided. Each spherical particle 589 includes a black region 590*a*, a white region 590*b*, and a cavity 594, which is filled with liquid and provided around the black region 590*a* and the white region 590*b*. The circumference of the spherical particles 589 is filled with a filler 595 such as a resin (see FIG. 14). The first electrode layer 587 corresponds to a pixel electrode and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between a pair of substrates.

Further, instead of the twisting ball, an electrophoretic element can also be used. A microcapsule having a diameter of about 10 µm to 200 µm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized even in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above process, highly reliable electronic paper as a semiconductor device can be manufactured.

This embodiment can be implemented in appropriate combination with any of the structures described in the other embodiments.

(Embodiment 16)

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 17:
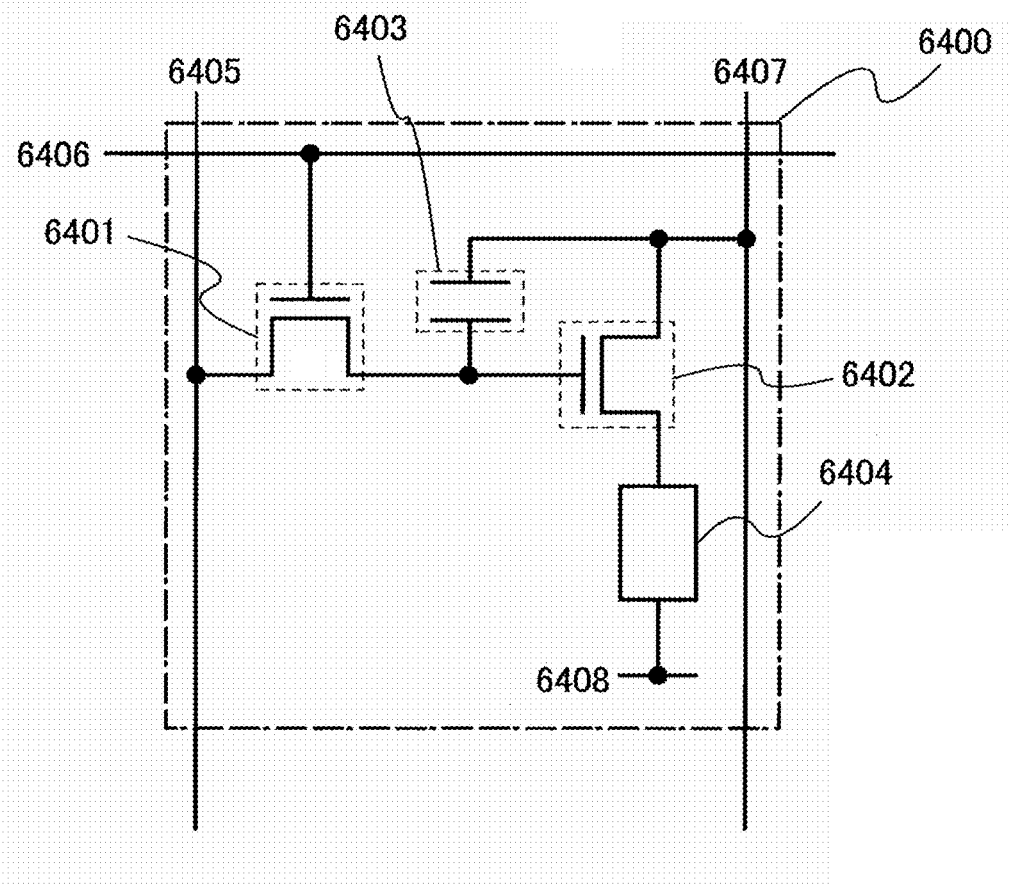
FIG. 17 is an equivalent circuit diagram of a pixel of a semiconductor device.

FIG. 17 illustrates an example of a pixel structure to which digital time grayscale driving can be applied as an example of a semiconductor device.

A structure and operation of a pixel to which digital time grayscale driving can be applied are described. An example is described here in which one pixel includes two n-channel transistors using an oxide semiconductor layer in a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate as the common electrode 6408.

The second electrode (common electrode 6408) of the light-emitting element 6404 is set to a low power supply potential. Note that the low power supply potential is a potential satisfying the low power supply potential<a high power supply potential with reference to the high power supply potential set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is higher than or equal to a forward threshold voltage of the light-emitting element 6404.

Note that gate capacitance of the driver transistor 6402 may be used as a substitute for the capacitor 6403, so that the capacitor 6403 can be omitted. The gate capacitance of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, a voltage higher than that of the power supply line 6407 is applied to the gate of the driver transistor 6402. Note that a voltage higher than or equal to the following is applied to the signal line 6405: power supply line voltage +$V_{th}$ of the driver transistor 6402.

In a case of performing analog grayscale driving instead of digital time grayscale driving, the same pixel structure as that in FIG. 17 can be used by changing signal input.

In the case of performing analog grayscale driving, a voltage higher than or equal to the following is applied to the gate of the driver transistor 6402: forward voltage of the light-emitting element 6404+$V_{th}$ of the driver transistor 6402. The forward voltage of the light-emitting element 6404 indicates a voltage at which a desired luminance is obtained, and includes at least forward threshold voltage. By inputting a video signal to enable the driver transistor 6402 to operate in a saturation region, current can be supplied to the light-emitting element 6404. In order to operate the driver transistor 6402 in the saturation region, the potential of the power supply line 6407 is set higher than the gate potential of the driver transistor 6402. When an analog video signal is used, it is possible to supply current to the light-emitting element 6404 in accordance with the video signal and perform analog grayscale driving.

Note that the pixel structure illustrated in FIG. 17 is not limited thereto. For example, a switch, a resistor, a capacitor, a transistor, a logic circuit, or the like may be added to the pixel illustrated in FIG. 17.

Next, structures of the light-emitting element will be described with reference to FIGS. 18A to 18C. Here, a cross-sectional structure of a pixel is described by taking an n-channel driver TFT as an example. Driver TFTs 7001, 7011, and 7021 used for semiconductor devices illustrated in FIGS. 18A to 18C can be manufactured in a manner similar to those of the thin film transistors described in Embodiment 1. Alternatively, any of the thin film transistors described in Embodiments 2 to 4 can be employed as the TFTs 7001, 7011, and 7021.

As dehydration or dehydrogenation treatment, heat treatment is performed in a nitrogen atmosphere or an inert gas atmosphere, or under reduced pressure, whereby moisture contained in a film is reduced. Then, as treatment for supplying oxygen, cooling is performed in an atmosphere of oxygen, an atmosphere of oxygen and nitrogen, or the air (having a dew point of preferably lower than or equal to −40° C., still preferably lower than or equal to −50° C.) atmosphere. The thus obtained oxide semiconductor layer is used for the TFTs 7001, 7011, and 7021. Therefore, the TFTs 7001, 7011, and 7021 are highly reliable thin film transistors having stable electric characteristics.

In order to extract light emission of the light-emitting element, at least one of an anode and a cathode is required to be transparent. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure can be applied to a light-emitting element having any of these emission structures.

A light-emitting element having a top emission structure will be described with reference to FIG. 18A.

Figure 18A:
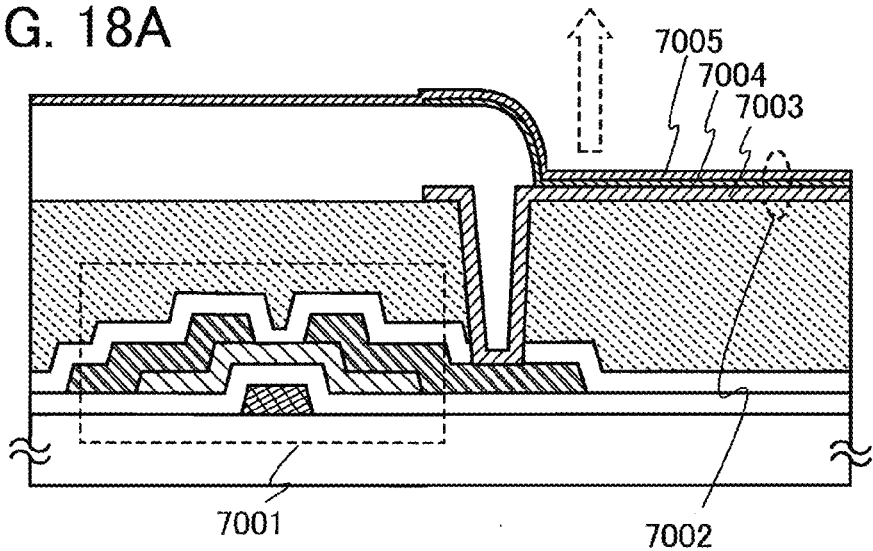
FIGS. 18A to 18C illustrate semiconductor devices.

FIG. 18A is a cross-sectional view of a pixel in the case where the driver TFT 7001 is an n-channel TFT and light is emitted from a light-emitting element 7002 to an anode 7005 side. In FIG. 18A, a cathode 7003 of the light-emitting element 7002 is electrically connected to the driver TFT 7001, and a light-emitting layer 7004 and the anode 7005 are stacked in this order over the cathode 7003. The cathode 7003 can be formed using a variety of conductive materials as long as the cathode 7003 is a conductive film having a low work function and reflecting light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injection layer, an electron-transport layer, a light-emitting layer, a hole-transport layer, and a hole-injection layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 18A, light is emitted from the light-emitting element 7002 to the anode 7005 side as indicated by an arrow.

Next, a light-emitting element having a bottom emission structure will be described with reference to FIG. 18B. FIG. 18B is a cross-sectional view of a pixel in the case where the driver TFT 7011 is an n-channel TFT and light is emitted from a light-emitting element 7012 to a cathode 7013 side. In FIG. 18B, the cathode 7013 of the light-emitting element 7012 is formed over a light-transmitting conductive film 7017 that is electrically connected to the driver TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. As in the case of FIG. 18A, various materials can be used for the cathode 7013, as long as the cathode 7013 is formed using a conductive material having a low work function. The cathode 7013 is formed to have a thickness that can transmit light (preferably, approximately 5 nm to 30 nm). For example, an aluminum film with a thickness of 20 nm can be used as the cathode 7013. As in the case of FIG. 18A, the light-emitting layer 7014 may be formed using a single layer or a plurality of layers stacked. The anode 7015 is not required to transmit light, but can be formed using a light-transmitting conductive material as in the case of FIG. 18A. As the light-blocking film 7016, a metal or the like that reflects light can be used for example;

however, it is not limited to a metal film. For example, a resin to which black pigments are added, or the like can also be used.

The light-emitting element 7012 corresponds to a region where the light-emitting layer 7014 is sandwiched between the cathode 7013 and the anode 7015. In the case of the pixel illustrated in FIG. 18B, light is emitted from the light-emitting element 7012 to the cathode 7013 side as indicated by an arrow.

Next, a light-emitting element having a dual emission structure will be described with reference to FIG. 18C. In FIG. 18C, a cathode 7023 of a light-emitting element 7022 is formed over a light-transmitting conductive film 7027 that is electrically connected to the driver TFT 7021, and a light-emitting layer 7024 and an anode 7025 are stacked in this order over the cathode 7023. As in the case of FIG. 18A, various materials can be used for the cathode 7023 as long as the cathode 7023 is formed using a conductive material having a low work function. The cathode 7023 is formed to have a thickness that can transmit light. For example, an aluminum film with a thickness of 20 nm can be used as the cathode 7023. Further, as in the case of FIG. 18A, the light-emitting layer 7024 may be formed using a single layer or a plurality of layers stacked. The anode 7025 can be formed using a light-transmitting conductive material as in the case of FIG. 18A.

The light-emitting element 7022 corresponds to a region where the cathode 7023, the light-emitting layer 7024, and the anode 7025 overlap with one another. In the case of the pixel illustrated in FIG. 18C, light is emitted from the light-emitting element 7022 to both the anode 7025 side and the cathode 7023 side as indicated by arrows.

Note that, although the organic EL elements are described here as the light-emitting elements, an inorganic EL element can also be provided as a light-emitting element.

Note that the example is described in which a thin film transistor (a driver TFT) which controls the driving of a light-emitting element is connected to the light-emitting element; however, a structure may be employed in which a TFT for current control is connected between the driver TFT and the light-emitting element.

Figure 18B:
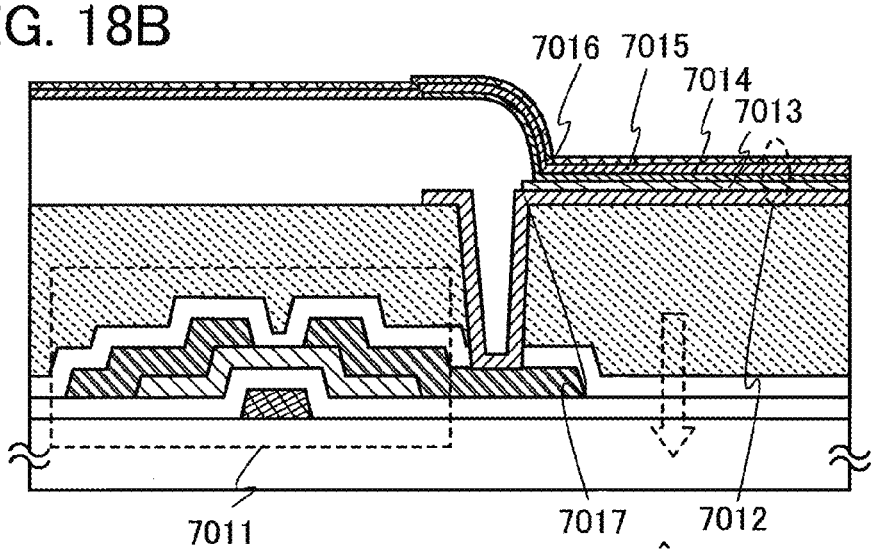
Figure 18C:
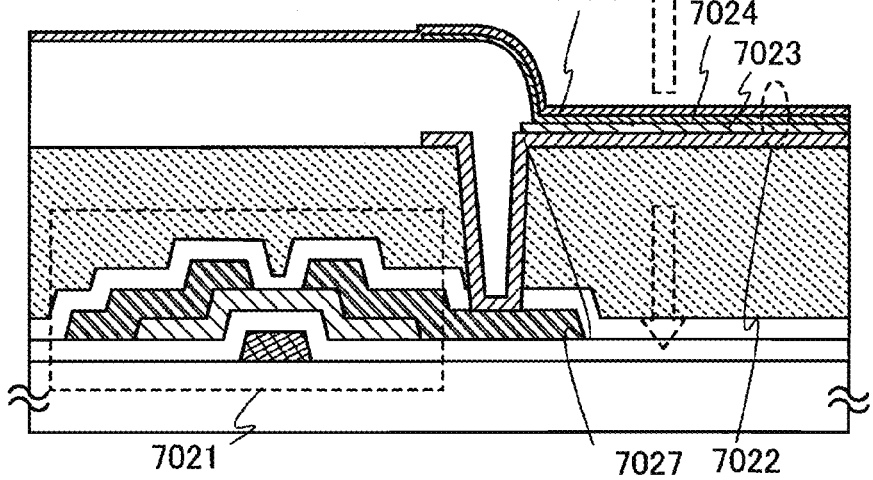

Note that the structure of the semiconductor device is not limited to those illustrated in FIGS. 18A to 18C and can be modified in various ways based on techniques disclosed in this specification.

Figure 16A:
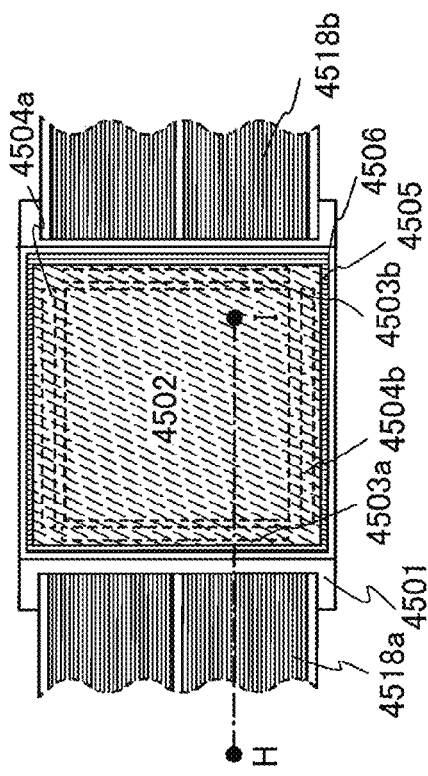
FIGS. 16A and 16B illustrate a semiconductor device.
Figure 16B:
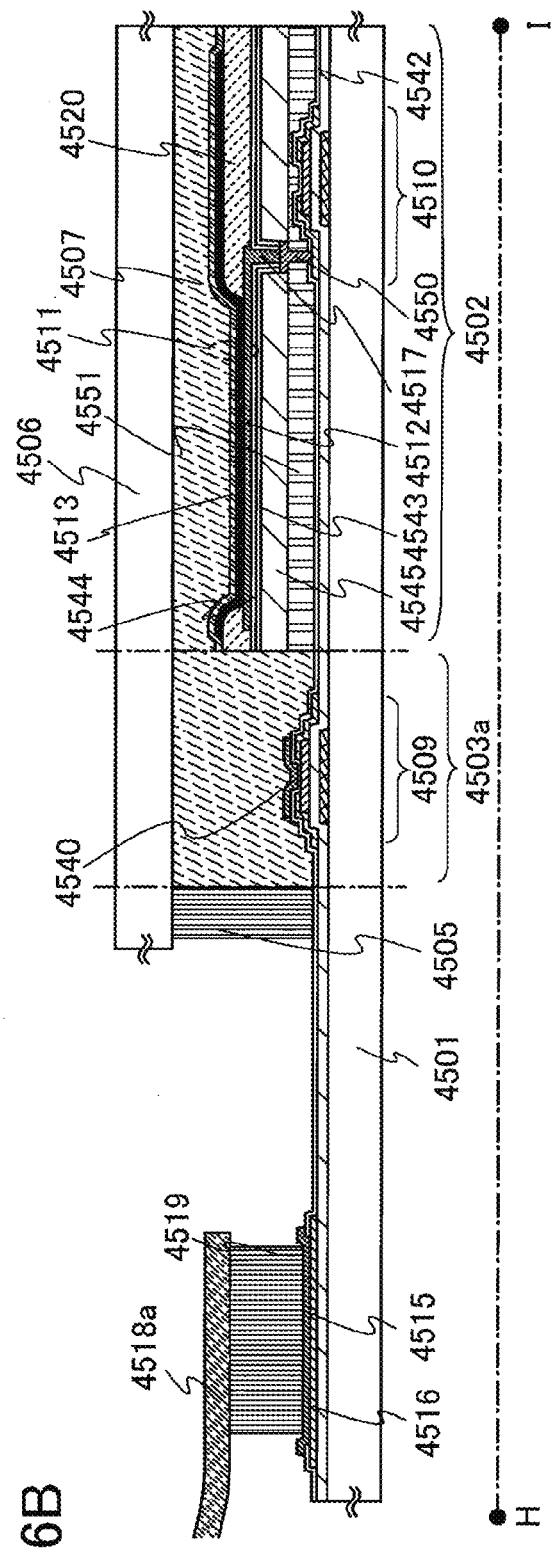

Next, the appearance and a cross section of a light-emitting display panel (also referred to as a light-emitting panel) are described with reference to FIGS. 16A and 16B. FIG. 16A is a plan view of a panel in which a thin film transistor and a light-emitting element formed over a first substrate are sealed between the first substrate and a second substrate with a sealant. FIG. 16B is a cross-sectional view taken along line H-I of FIG. 16A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. In this manner, it is preferable that a panel be packaged (sealed) with a protective film (such as a laminate film or an ultraviolet curable resin film) or a cover material with high air-tightness and little degasification so that the panel is not exposed to the outside air.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 16B.

Any of the thin film transistors of Embodiments 1 to 10 can be used as appropriate as the thin film transistors 4509 and 4510, and they can be formed using steps and materials similar to those for the thin film transistors of Embodiments 1 to 10. As dehydration or dehydrogenation treatment, heat treatment is performed in a nitrogen atmosphere or an inert gas atmosphere, or under reduced pressure, whereby moisture contained in a film is reduced. Then, as treatment for supplying oxygen, cooling is performed in an atmosphere of oxygen, an atmosphere of oxygen and nitrogen, or the air (having a dew point of preferably lower than or equal to −40° C., still preferably lower than or equal to −50° C.) atmosphere. The thus obtained oxide semiconductor film is used for the thin film transistors 4509 and 4510. Therefore, the thin film transistors 4509 and 4510 are highly reliable thin film transistors having stable electric characteristics.

Note that the thin film transistor 4509 for a driver circuit has the structure in which a conductive layer is provided so as to overlap with a channel formation region of an oxide semiconductor layer in the thin film transistor. In this embodiment, the thin film transistors 4509 and 4510 are n-channel thin film transistors.

A conductive layer 4540 is provided over an insulating layer 4542, so as to overlap with a channel formation region of an oxide semiconductor layer in the thin film transistor 4509 for the driver circuit. The conductive layer 4540 is provided so as to overlap the channel formation region of the oxide semiconductor layer, whereby the amount of change in the threshold voltage of the thin film transistor 4509 between before and after a BT test can be reduced. Further, a potential of the conductive layer 4540 may be the same as or different from that of a gate electrode layer of the thin film transistor 4509. The conductive layer 4540 can function also as a second gate electrode layer. Alternatively, the potential of the conductive layer 4540 may be GND or 0 V, or the conductive layer 4540 may be in a floating state.

In addition, the conductive layer 4540 functions to block external electric field (particularly, block static electricity) so that external electric field does not affect the inside (a circuit portion including the thin film transistor). A blocking function of the conductive layer 4540 can prevent variation in electric characteristics of the thin film transistor due to the effect of external electric field such as static electricity.

Further, an insulating layer 4542 is formed to cover the oxide semiconductor layer of the thin film transistor 4510. The source electrode layer or the drain electrode layer of the thin film transistor 4510 is electrically connected to a wiring layer 4550 in an opening formed in the insulating layer 4542 and an insulating layer 4551 which are provided over the thin film transistor. The wiring layer 4550 is formed in contact with a first electrode 4517, and the thin film transistor 4510 is electrically connected to the first electrode 4517 through the wiring layer 4550.

The insulating layer 4542 may be formed using a material and a method similar to those of the insulating layer 407 described in Embodiment 1.

A color filter layer 4545 is formed over the insulating layer 4551 so as to overlap with a light-emitting region of a light-emitting element 4511.

Further, in order to reduce the surface roughness of the color filter layer 4545, the color filter layer 4545 is covered with an overcoat layer 4543 functioning as a planarization insulating film.

Further, an insulating layer 4544 is formed over the overcoat layer 4543. The insulating layer 4544 may be formed in a manner similar to that of the protective insulating layer 499 described in Embodiment 1, and a silicon nitride film may be formed by a sputtering method, for example.

Reference numeral 4511 denotes a light-emitting element, and the first electrode 4517 which is a pixel electrode included in the light-emitting element 4511 is electrically connected to the source electrode layer or the drain electrode layer of the thin film transistor 4510 through the wiring layer 4550. Note that the light-emitting element 4511 is not limited to a stacked structure of the first electrode 4517, an electroluminescent layer 4512, and a second electrode 4513. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is particularly preferable that the partition wall 4520 be formed using a photosensitive material to have an opening portion over the first electrode 4517 so that a sidewall of the opening portion is formed as a tilted surface with continuous curvature.

The electroluminescent layer 4512 may be formed using a single layer or a plurality of layers stacked.

In order to prevent entry of oxygen, hydrogen, moisture, carbon dioxide, or the like into the light-emitting element 4511, a protective film may be formed over the second electrode 4513 and the partition wall 4520. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed using the same conductive film as the first electrode 4517 included in the light-emitting element 4511, and a terminal electrode 4516 is formed using the same conductive film as the source and drain electrode layers included in the thin film transistor 4509.

The connection terminal electrode 4515 is electrically connected to a terminal included in the FPC 4518a through an anisotropic conductive film 4519.

The first substrate 4501 and the second substrate 4506 need to have a light-transmitting property in the case where they are located in the direction in which light is extracted from the light-emitting element 4511. In that case, a light-transmitting material such as a glass plate, a plastic plate, a polyester film, or an acrylic film is used for the first substrate 4501 and the second substrate 4506.

As the filler 4507, an ultraviolet curable resin or a thermosetting resin can be used, in addition to nitrogen or an inert gas such as argon. For example, polyvinyl chloride (PVC), acrylic, polyimide, an epoxy resin, a silicone resin, polyvinyl butyral (PVB), or ethylene vinyl acetate (EVA) can be used. For example, nitrogen may be used for the filler.

In addition, if needed, an optical film such as a polarizing plate, a circularly polarizing plate (including an elliptically polarizing plate), or a retardation plate (a quarter-wave plate or a half-wave plate) may be provided as appropriate on a light-emitting surface of the light-emitting element. Further, the polarizing plate or the circularly polarizing plate may be provided with an anti-reflection film. For example, anti-glare treatment by which reflected light can be diffused by surface roughness so as to reduce the glare can be performed.

The sealant can be deposited using a screen printing method, an ink jet apparatus, or a dispensing apparatus. As the sealant, typically, a material containing a visible light curable resin, an ultraviolet curable resin, or a thermosetting resin can be used. Further, a filler may be contained.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 16A and 16B.

Through the above process, a highly reliable light-emitting display device (display panel) as a semiconductor device can be manufactured.

This embodiment can be implemented in appropriate combination with any of the structures described in the other embodiments.

(Embodiment 17)

A semiconductor device disclosed in this specification can be applied to electronic paper. Electronic paper can be used for electronic devices of a variety of fields as long as they display data. For example, electronic paper can be applied to an e-book reader (electronic book), a poster, an advertisement in a vehicle such as a train, or displays of various cards such as a credit card. Examples of such electronic devices are illustrated in FIGS. 26 and 27.

Figure 26:
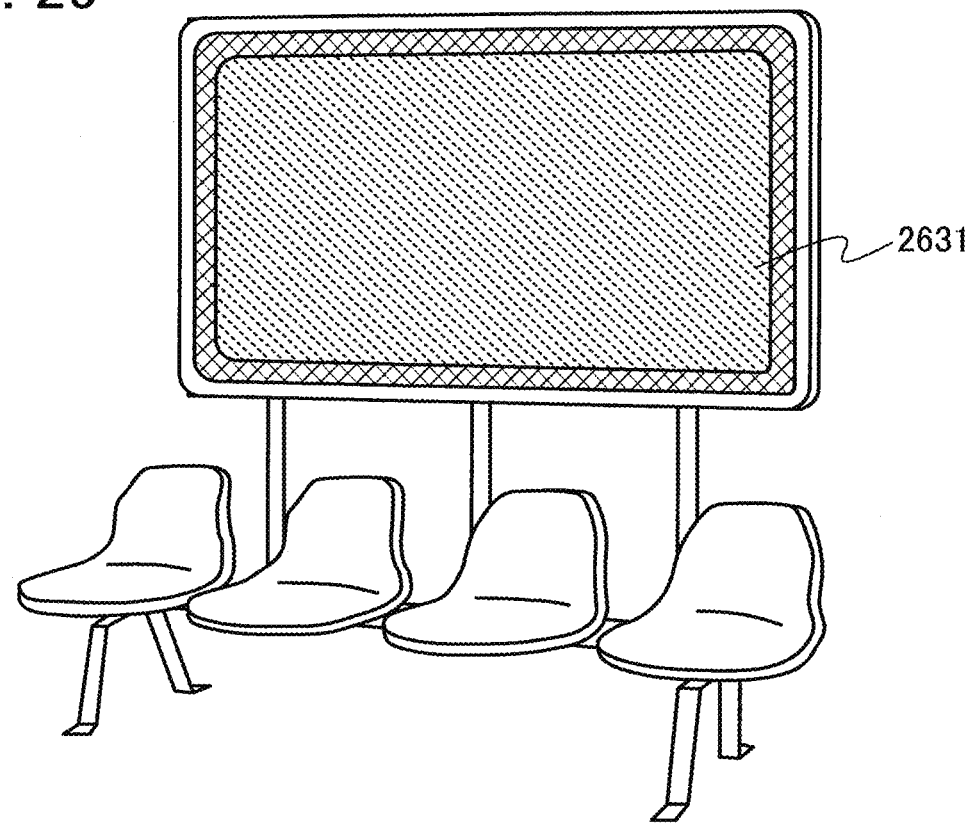
FIG. 26 illustrates an electronic device.

FIG. 26 illustrates a poster 2631 formed using electronic paper. In the case where an advertising medium is printed paper, the advertisement is replaced by manpower; however, when electronic paper disclosed in this specification is used, the advertising display can be changed in a short time. Furthermore, stable images can be obtained without display defects. Note that the poster may transmit and receive data wirelessly.

Figure 27:
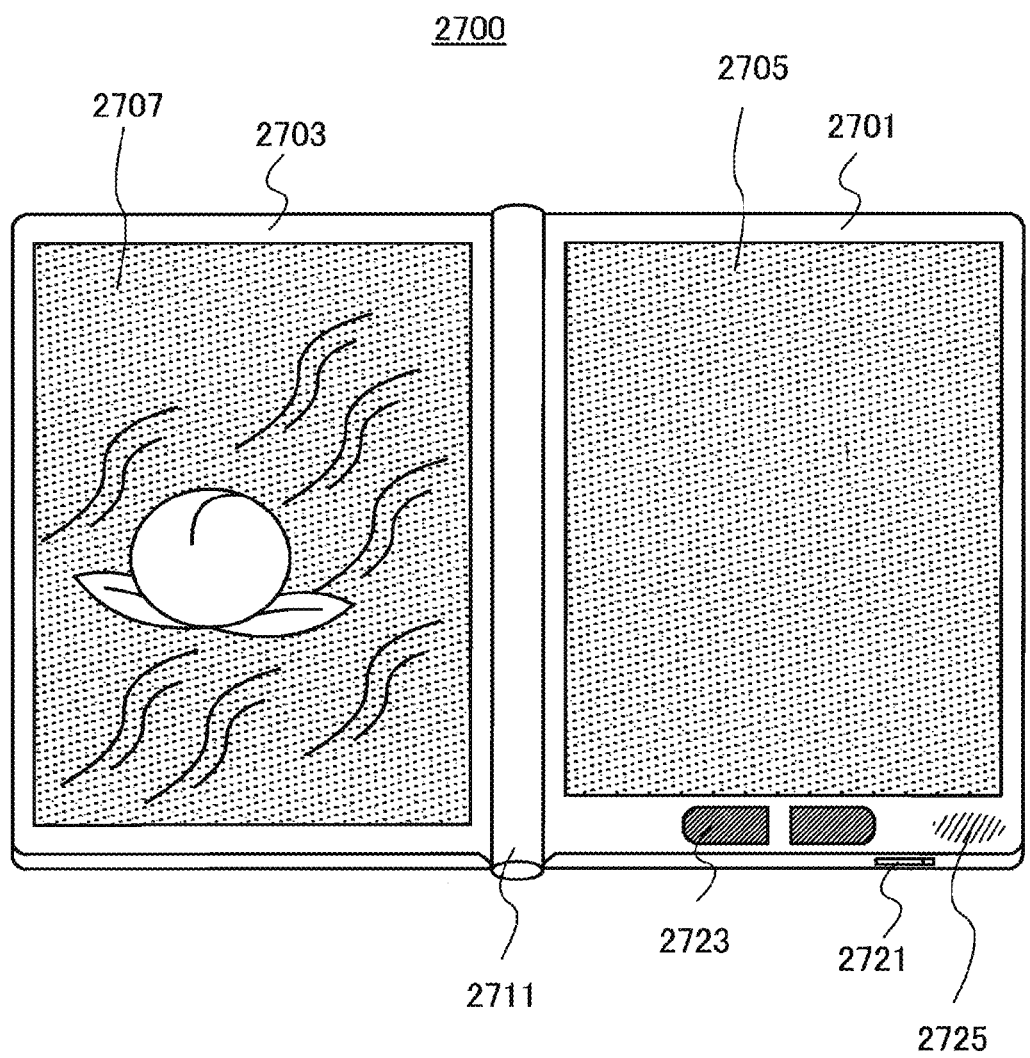
FIG. 27 illustrates an electronic device.

FIG. 27 illustrates an e-book reader 2700 which is an example of an e-book reader. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 27) can display text and a display portion on the left side (the display portion 2707 in FIG. 27) can display graphics.

FIG. 27 illustrates an example in which the housing 2701 is provided with an operation portion and the like. For example, the housing 2701 is provided with a power switch 2721, an operation key 2723, a speaker 2725, and the like.

With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may transmit and receive data wirelessly. Through wireless communication, desired book data or the like can be purchased and downloaded from an electronic book server.

(Embodiment 18)

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 28A:
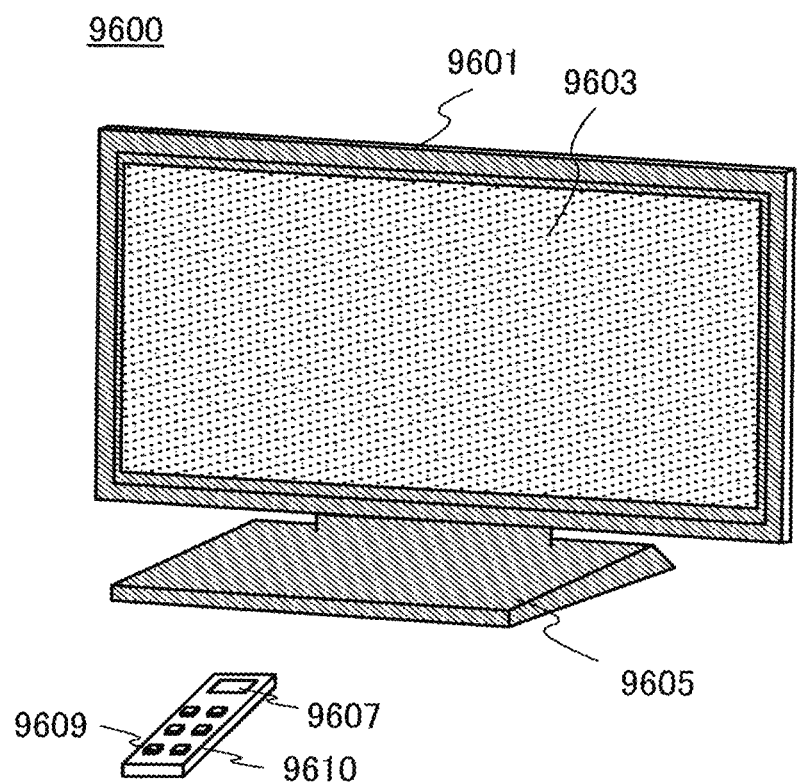
FIGS. 28A and 28B illustrate electronic devices.

FIG. 28A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the the television set 9600 is connected to a communication network with or without wires through the modem, one-way (from a sender to a receiver) or two-way (between a sender and a receiver or between receivers) information communication can be performed.

Figure 28B:
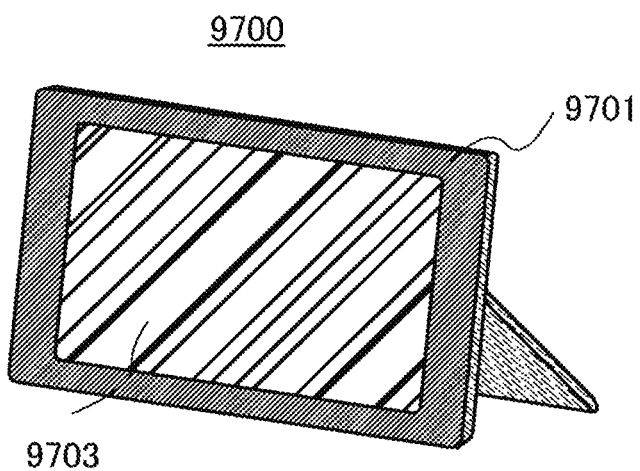

FIG. 28B illustrates an example of a digital photo frame. For example, in a digital photo frame 9700, a display portion 9703 is incorporated in a housing 9701. The display portion 9703 can display a variety of images. For example, the display portion 9703 can display an image data taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 29A:
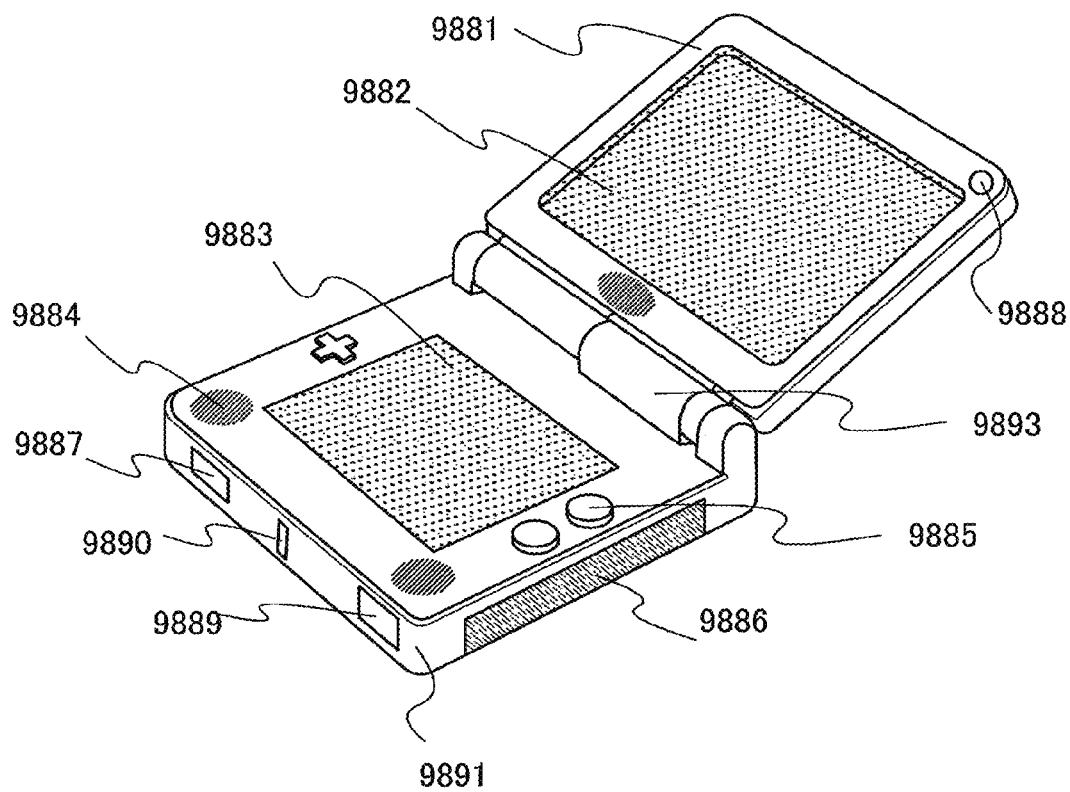
FIGS. 29A and 29B illustrate electronic devices.

FIG. 29A illustrates a portable game machine and includes two housings, a housing 9881 and a housing 9891, which are connected with a joint portion 9893 so that the portable game machine can be opened or folded. A display portion 9882 and a display portion 9883 are incorporated in the housing 9881 and the housing 9891, respectively. Moreover, the portable game machine illustrated in FIG. 29A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable game machine is not limited to those described above and other structures provided with at least a semiconductor device disclosed in this specification can be employed. The portable game machine may include other accessory equipment as appropriate. The portable game machine illustrated in FIG. 29A has a function of reading a program or data stored in a recording medium to display it on the display portion, and a function of sharing information with another portable game machine by wireless communication. Note that a function of the portable game machine illustrated in FIG. 29A is not limited to those described above, and the portable game machine can have a variety of functions.

Figure 29B:
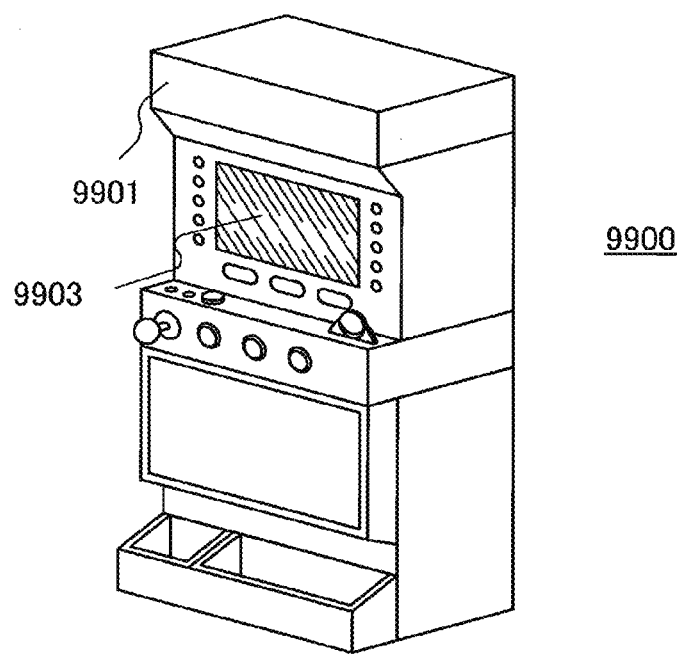

FIG. 29B illustrates an example of a slot machine which is a large-sized game machine. In a slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to those described above and other structures provided with at least a semiconductor device disclosed in this specification can be employed. The slot machine 9900 may include other accessory equipment as appropriate.

Figure 30A:
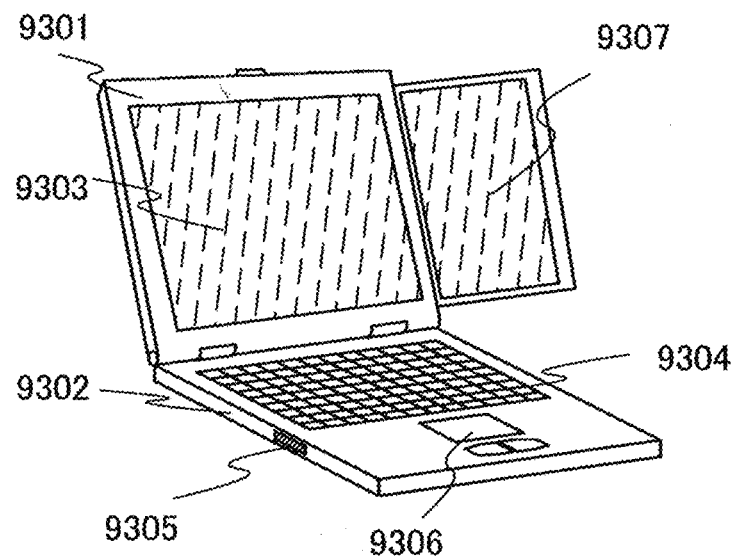
FIGS. 30A and 30B illustrate electronic devices.

FIG. 30A is a perspective view illustrating an example of a portable computer.

In the portable computer of FIG. 30A, a top housing 9301 having a display portion 9303 and a bottom housing 9302 having a keyboard 9304 can overlap with each other by closing a hinge unit which connects the top housing 9301 and the bottom housing 9302. Thus, the portable computer illustrated in FIG. 30A is conveniently carried. Moreover, in the case of using the keyboard for input of data, the hinge unit is opened so that a user can input data looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes an external connection port 9305 into which another device such as a communication cable conformable to communication standards of a USB is inserted.

The top housing 9301 further includes a display portion 9307 which can be stored in the top housing 9301 by being slid therein. Thus, a large display screen can be realized. In addition, the user can adjust the orientation of a screen of the storable display portion 9307. When the storable display portion 9307 is a touch input panel, input can be performed by touching part of the storable display portion.

The display portion 9303 or the storable display portion 9307 are formed using an image display device of a liquid crystal display panel, a light-emitting display panel using an organic light-emitting element or an inorganic light-emitting element, or the like.

In addition, the portable computer in FIG. 30A may be provided with a receiver and the like, and thus can receive a television broadcast to display an image on the display portion. The user can watch television broadcast with the whole screen of the display portion 9307 by sliding and exposing the display portion 9307 and adjusting the angle thereof, with the hinge unit which connects the top housing 9301 and the bottom housing 9302 closed. In this case, the hinge unit is not opened and display is not performed on the display portion 9303. In addition, start up of only a circuit for displaying television broadcast is performed. Therefore, power can be consumed to the minimum, which is useful for the portable computer whose battery capacity is limited.

Figure 30B:
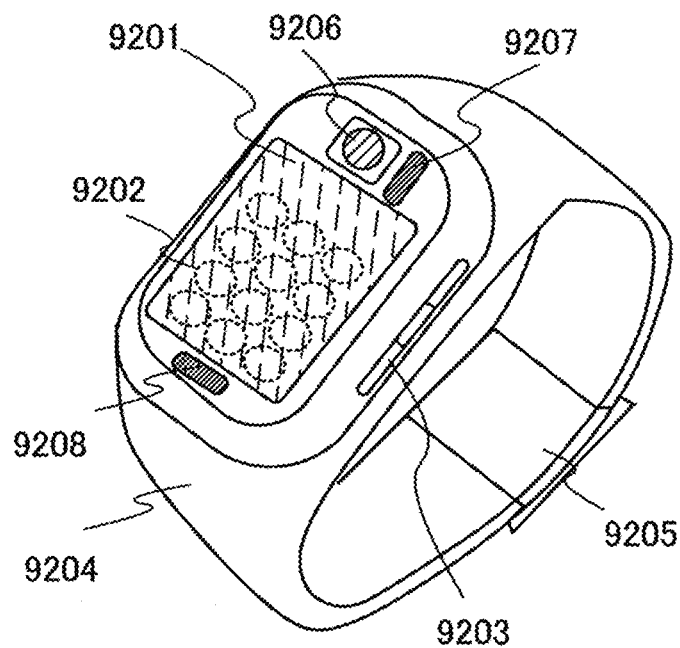

FIG. 30B is a perspective view illustrating an example of a mobile phone that the user can wear on the wrist like a wristwatch.

This mobile phone is formed with a main body which includes a communication device including at least a telephone function, and battery; a band portion which enables the main body to be worn on the wrist; an adjusting portion 9205 for adjusting the band portion to fit the wrist; a display portion 9201; a speaker 9207; and a microphone 9208.

In addition, the main body includes operating switches 9203. The operating switches 9203 serve, for example, as a button for starting a program for the Internet when the switch is pushed, as well as a switch for turning on a power source, a switch for shifting a display, a switch for instructing to start taking images, or the like, and can be used so as to correspond to each function.

The user can input data to this mobile phone by touching the display portion 9201 with a finger, an input pen, or the like, by operating the operating switches 9203, or by inputting voice into the microphone 9208. Note that displayed buttons 9202 which are displayed on the display portion 9201 are illustrated in FIG. 30B. Input can be performed by touching the displayed buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The mobile phone illustrated in FIG. 30B is provided with a receiver of a television broadcast and the like, and can display an image on the display portion 9201 by receiving a television broadcast. In addition, the mobile phone illustrated in FIG. 30B is provided with a memory device and the like such as a memory, and can record a television broadcast in the memory. The mobile phone illustrated in FIG. 30B may have a function of collecting location information, such as GPS.

An image display device of a liquid crystal display panel, a light-emitting display panel using an organic light-emitting element or an inorganic light-emitting element, or the like is used as the display portion 9201. The mobile phone illustrated in FIG. 30B is compact and lightweight and thus has limited battery capacity. Therefore, a panel which can be driven with low power consumption is preferably used as a display device for the display portion 9201.

Note that FIG. 30B illustrates the electronic device which is worn on the wrist; however, this embodiment is not limited thereto as long as a portable shape is employed.

EXAMPLE 1

In this example, a thin film transistor of one embodiment of the present invention is manufactured and the results of the electric characteristic evaluation are shown.

A method for manufacturing the thin film transistor of this example will be described. As a base film, a silicon oxynitride film having a thickness of 150 nm was formed by a CVD method over a glass substrate. As a gate electrode layer, a tungsten film having a thickness of 150 nm was formed by a sputtering method over the silicon oxynitride film. As a gate insulating layer, a silicon oxynitride film having a thickness of 100 nm was formed by a CVD method over the gate electrode layer.

A semiconductor film having a thickness of 50 nm was formed over the gate insulating layer using an In—Ga—Zn—O-based oxide semiconductor film formation target ($In_2O_3$:$Ga_2O_3$:$ZnO$=1:1:1 [molar ratio], In:Ga:Zn=1:1:0.5 [atomic ratio]) in an atmosphere of argon and oxygen (argon:oxygen=30 sccm:15 sccm) under the following conditions: the distance between the substrate and the target was 60 mm, the pressure was 0.4 Pa, and the RF power supply was 0.5 kW. Etching was performed, whereby an island-shape semiconductor layer was formed.

The temperature of the semiconductor layer was raised in a nitrogen atmosphere for one and a half hours, and heating was performed at 450° C. for one hour. Then, cooling was performed in the air atmosphere.

As a source electrode layer and a drain electrode layer, a titanium film (thickness of 50 nm), an aluminum film (thickness of 200 nm), and a titanium film (thickness of 50 nm) are stacked over the semiconductor layer by a sputtering method.

As an insulating layer, a silicon oxide film having a thickness of 300 nm was formed over the semiconductor layer, the source electrode layer, and the drain electrode layer in an atmosphere of argon and oxygen (argon:oxygen=40 sccm:10 sccm) under the following conditions: the distance between the substrate and the target was 60 mm, the pressure was 0.4 Pa, and the RF power supply was 1.5 kW.

Next, heating was performed at 250° C. in a nitrogen atmosphere for one hour.

Through the process, the thin film transistor of this example was formed. Note that the semiconductor layer included in the thin film transistor has a channel length (L) of 3 μm and a channel width (W) of 50 μm.

As a method for examining the reliability of a thin film transistor, there is a bias-temperature stress test (hereinafter, referred to as a BT test). The BT test is a kind of an acceleration test, and a change in characteristics of the thin film transistor which is caused by long-term use can be evaluated in a short time by this method. In particular, the amount of shift in threshold voltage of the thin film transistor between before and after the BT test is an important indicator for examining reliability. As a difference in the threshold voltage between before and after the BT test is small, the thin film transistor has higher reliability.

Specifically, the temperature of the substrate (substrate temperature) over which the thin film transistor is formed is maintained as a constant value, and while the source and the drain of the thin film transistor are set to the same potential, a potential different from that of the source and the drain are applied to a gate of the thin film transistor for a certain period. The substrate temperature may be determined as appropriate in accordance with the test purpose. A BT test in which a potential applied to a gate is higher than the potential of a source and a drain is referred to as +BT test and a BT test in which a potential applied to a gate is lower than the potential of a source and a drain is referred to as −BT test.

The test intensity of a BT test can be determined in accordance with a substrate temperature, the intensity of electric field intensity applied to a gate insulating film, and a time of applying the electric field. The intensity of the electric field applied to the gate insulating film is determined in accordance with a value obtained by dividing a potential difference between a gate and a source and a drain by the thickness of the gate insulating film. For example, when the intensity of the electric field applied to the gate insulating film with a thickness of 100 nm is adjusted to 2 MV/cm, the potential difference is set to be 20 V.

Results of a BT test of the thin film transistor of Example 1 will be described.

Note that a voltage refers to the difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

In BT tests, a −BT test was performed under such conditions that a substrate temperature was 150° C., an electric field intensity applied to the gate insulating film was 2 MV/cm, and a time period for application was one hour.

First, the −BT test is described. In order to measure initial characteristics of a thin film transistor subjected to the BT test, a change in characteristics of the source-drain current (hereinafter, referred to as the drain current ($I_d$)) was measured, under the conditions where the substrate temperature was set to 40° C., the voltage between source and drain (hereinafter, the drain voltage ($V_d$)) was set to 1 V and 10 V, and the voltage between source and gate (hereinafter, the gate voltage) was changed in the range of −20 V to +20 V. That is, $V_g$-$I_d$ characteristics were measured. However, the measurement may be performed at room temperature (25° C.) or lower if there is no particular problem.

Next, after the substrate temperature was increased to 150° C., a potential of the source and drain of the thin film transistor was set to 0V. Then, voltage was applied so that the intensity of the electric field applied to the gate insulating film was 2 MV/cm. Since the thickness of the gate insulating layer in the thin film transistor was 100 nm here, a voltage of −20 V was kept being applied to the gate for one hour. The time of voltage application was one hour here; however, the time may be determined as appropriate in accordance with the purpose.

Next, the substrate temperature was decreased to 40° C. while a voltage is applied between the gate and the source and the drain. At this time, if the application of the voltage is stopped before the substrate temperature is completely decreased, damage which is given to the thin film transistor in the BT test is repaired due to remaining heat; therefore, the substrate temperature must be decreased while the voltage is applied. After the substrate temperature was decreased to 40° C., the application of the voltage was stopped. Strictly, the time of decreasing temperature must be added to the time of the voltage application; however, since the temperature was able to be decreased to 40° C. in several minutes actually, this was considered to be an error range and the time of decreasing temperature was not added to the time of application.

Then, $V_g$-$I_d$ characteristics were measured under the same conditions as those of the measurement of the initial characteristics, and $V_g$-$I_d$ characteristics after the −BT test were obtained.

Note that in a BT test, it is important to perform a BT test on a thin film transistor on which a BT test has not been performed. For example, when a −BT test is performed on a thin film transistor on which a +BT test has been performed, results of the −BT test cannot be evaluated correctly due to the +BT test which has been performed first. Further, the same applies to the case where a +BT test is performed on a thin film transistor on which a +BT test has been performed. Note that the same does not apply to the case where a BT test is intentionally repeated in consideration of these influences.

Figure 24:
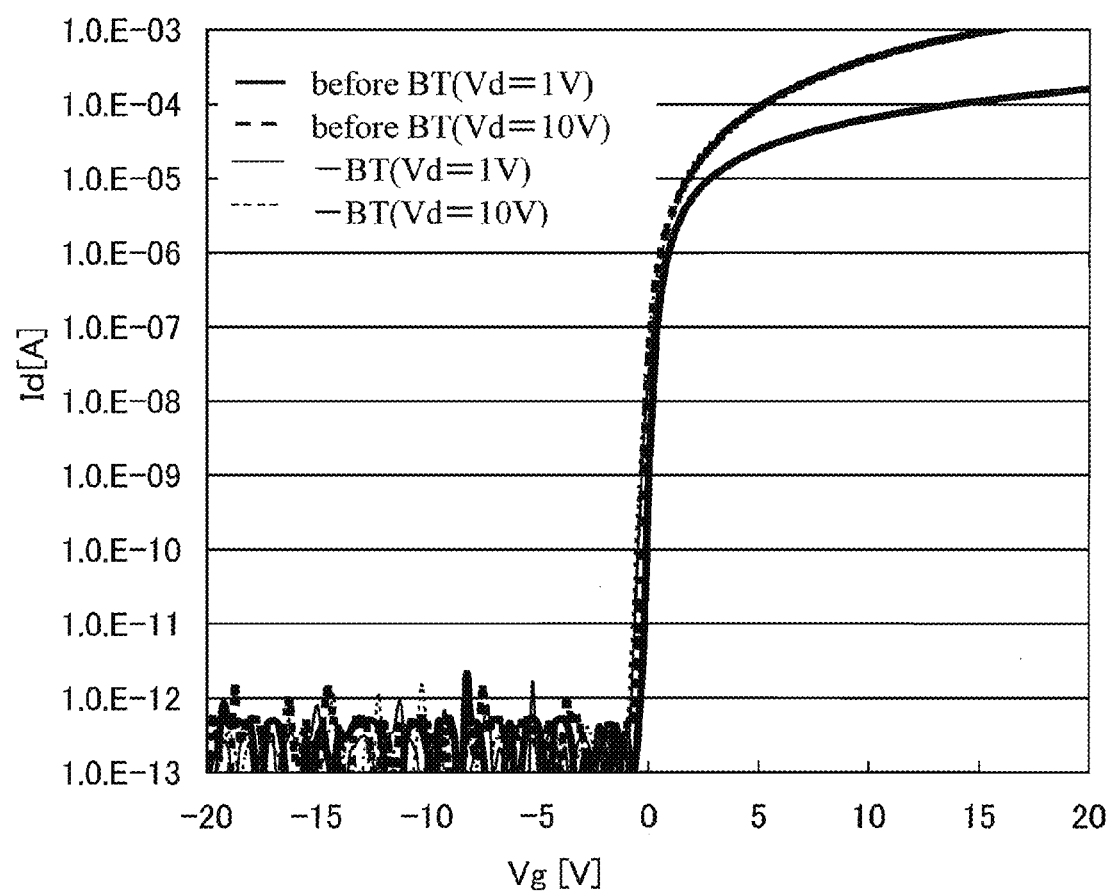
FIG. 24 is a graph illustrating evaluation results of electric characteristics of thin film transistors.

FIG. 24 shows $V_g$-$I_d$ characteristics of the thin film transistor before and after the BT test. In FIG. 24, the horizontal axis represents the gate voltage ($V_g$) which is shown with a logarithmic scale, and the vertical axis represents the drain current ($I_d$) which is shown with a logarithmic scale.

FIG. 24 shows the $V_g$-$I_d$ characteristics of the thin film transistor before and after the −BT test. Initial characteristics ($V_d$=1 V, 10 V) represent the $V_g$-$I_d$ characteristics of the thin film transistor before the −BT test, and −BT ($V_d$=1 V, 10 V) represents the $V_g$-$I_d$ characteristics of the thin film transistor after the −BT test.

FIG. 24 shows that shift in threshold voltage in the −BT ($V_d$=1 V, 10 V) is hardly observed as compared to that in threshold voltage in the initial characteristics ($V_d$=1 V, 10 V). Accordingly, since shift in the threshold voltage is hardly observed in the BT tests, the thin film transistor of this example was confirmed to be a thin film transistor with high reliability in the BT tests.

This application is based on Japanese Patent Application serial no. 2009-264768 filed with Japan Patent Office on Nov. 20, 2009, the entire contents of which are hereby incorporated by reference.

The invention claimed is:

1. A method for manufacturing a semiconductor device, comprising the steps of:
   forming an oxide semiconductor layer over a substrate in a chamber;
   reducing hydrogen concentration in the oxide semiconductor layer by performing a heat treatment on the oxide semiconductor layer; and
   performing a treatment for supplying oxygen on the oxide semiconductor layer after the heat treatment,
   wherein moisture in the chamber is removed by a vacuum pump, and
   wherein an oxygen deficiency in the oxide semiconductor layer is generated by the heat treatment and then filled by the treatment for supplying oxygen.

2. The method for manufacturing a semiconductor device according to claim 1, wherein the substrate is heated at a temperature higher than or equal to 200 °C. and lower than or equal to 400 °C. in the step of forming the oxide semiconductor layer.

3. The method for manufacturing a semiconductor device according to claim 1,
wherein the oxide semiconductor layer comprises an intrinsic oxide semiconductor after the treatment for supplying oxygen.

4. The method for manufacturing a semiconductor device according to claim 1, further comprising the steps of:
forming an insulating layer; and
forming a conductive layer,
wherein the conductive layer and the oxide semiconductor layer overlap with each other with the insulating layer interposed therebetween.

5. The method for manufacturing a semiconductor device according to claim 1,
wherein the vacuum pump is a cryopump.

6. The method for manufacturing a semiconductor device according to claim 1,
wherein a carrier concentration of the oxide semiconductor layer is less than $1\times10^{14}/cm^3$ after the treatment for supplying oxygen.

7. A method for manufacturing a semiconductor device, comprising the steps of:
forming an oxide semiconductor layer over a substrate in a first chamber;
performing a dehydration or dehydrogenation treatment on the oxide semiconductor layer in a second chamber; and
performing a treatment for supplying oxygen on the oxide semiconductor layer in the second chamber after the dehydration or dehydrogenation treatment,
wherein moisture in the first chamber is removed by a vacuum pump, and
wherein an inert gas whose impurity concentration is 1 ppm or lower is introduced into the second chamber in the step of performing the dehydration or dehydrogenation treatment.

8. The method for manufacturing a semiconductor device according to claim 7,
wherein oxygen whose impurity concentration is 1 ppm or lower or air which has a dew point of lower than or equal to −40° C. is introduced into the second chamber in the step of performing the treatment for supplying oxygen.

9. The method for manufacturing a semiconductor device according to claim 7,
wherein the substrate is heated at a temperature higher than or equal to 200 °C. and lower than or equal to 400 °C. in the step of forming the oxide semiconductor layer.

10. The method for manufacturing a semiconductor device according to claim 7,
wherein the oxide semiconductor layer comprises an intrinsic oxide semiconductor after the treatment for supplying oxygen.

11. The method for manufacturing a semiconductor device according to claim 7, further comprising the steps of:
forming an insulating layer; and
forming a conductive layer,
wherein the conductive layer and the oxide semiconductor layer overlap with each other with the insulating layer interposed therebetween.

12. The method for manufacturing a semiconductor device according to claim 7,
wherein the vacuum pump is a cryopump.

13. The method for manufacturing a semiconductor device according to claim 7,
wherein a carrier concentration of the oxide semiconductor layer is less than $1\times10^{14}/cm^3$ after the treatment for supplying oxygen.

14. A method for manufacturing a semiconductor device, comprising the steps of:
forming an oxide semiconductor layer over a substrate by a sputtering method in a chamber;
performing a dehydration or dehydrogenation treatment on the oxide semiconductor layer; and
performing a treatment for supplying oxygen on the oxide semiconductor layer after the dehydration or dehydrogenation treatment,
wherein moisture in the chamber is removed by a vacuum pump, and
wherein a fill rate of a sputtering target used for forming the oxide semiconductor layer is 95% to 99.9%.

15. The method for manufacturing a semiconductor device according to claim 14,
wherein a sputtering gas from which hydrogen and moisture are removed is introduced into the chamber in the step of forming the oxide semiconductor layer.

16. The method for manufacturing a semiconductor device according to claim 14,
wherein the substrate is heated at a temperature higher than or equal to 200° C. and lower than or equal to 400° C. in the step of forming the oxide semiconductor layer.

17. The method for manufacturing a semiconductor device according to claim 14,
wherein the oxide semiconductor layer comprises an intrinsic oxide semiconductor after the treatment for supplying oxygen.

18. The method for manufacturing a semiconductor device according to claim 14, further comprising the steps of:
forming an insulating layer; and
forming a conductive layer,
wherein the conductive layer and the oxide semiconductor layer overlap with each other with the insulating layer interposed therebetween.

19. The method for manufacturing a semiconductor device according to claim 14,
wherein the vacuum pump is a cryopump.

20. The method for manufacturing a semiconductor device according to claim 14,
wherein a carrier concentration of the oxide semiconductor layer is less than $1\times10^{14}/cm^3$ after the treatment for supplying oxygen.

* * * * *